(12) United States Patent
McDonald

(10) Patent No.: US 7,642,173 B2
(45) Date of Patent: Jan. 5, 2010

(54) THREE-DIMENSIONAL FACE-TO-FACE INTEGRATION ASSEMBLY

(75) Inventor: John McDonald, Clifton Park, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 12/254,577

(22) Filed: Oct. 20, 2008

(65) Prior Publication Data

US 2009/0042365 A1    Feb. 12, 2009

Related U.S. Application Data

(62) Division of application No. 10/901,939, filed on Jul. 29, 2004, now Pat. No. 7,453,150.

(60) Provisional application No. 60/558,948, filed on Apr. 1, 2004.

(51) Int. Cl.
*H01L 21/46*    (2006.01)
*H01L 21/4763*    (2006.01)
*H01L 21/44*    (2006.01)

(52) U.S. Cl. .............. 438/455; 438/637; 438/667; 438/672; 438/675

(58) Field of Classification Search ............... 438/455, 438/637, 667, 672, 675
See application file for complete search history.

(56) References Cited

U.S. PATENT DOCUMENTS 5,851,894 A * 12/1998 Ramm .................. 438/311

* cited by examiner

*Primary Examiner*—Luan C Thai
(74) *Attorney, Agent, or Firm*—Wolf, Greenfield & Sacks, P.C.

(57) ABSTRACT

A via for connecting metallization layers of chips bonded in a face-to-face configuration is provided, as well as methods of fabricating the via. The via may function as an interconnection of metallization layers in three-dimensional, stacked, integrated circuits, and may enable high density, low-resistance interconnection formation.

14 Claims, 55 Drawing Sheets

US 7,642,173 B2

THREE-DIMENSIONAL FACE-TO-FACE INTEGRATION ASSEMBLY

RELATED APPLICATIONS

This application is a divisional of, and claims priority to, U.S. patent application Ser. No. 10/901,939, filed Jul. 29, 2004 and entitled "THREE-DIMENSIONAL FACE-TO-FACE INTEGRATION ASSEMBLY," and through it to U.S. Provisional Pat. Application 60/558,948. U.S. patent application Ser. No. 10/901,939 claims priority under 35 U.S.C. § 119(e) to U.S. Provisional Application Ser. No. 60/558,948 entitled "THREE-DIMENSIONAL FACE-TO-FACE INTEGRATION ASSEMBLY," filed on Apr. 1, 2004. U.S. Provisional Pat. Application 60/558,948 and U.S. patent application Ser. No. 10/901,939 are both incorporated herein by reference in their entireties.

BACKGROUND OF INVENTION

1. Field of Invention

The invention relates to three-dimensional (3D) integrated assemblies, and more particularly to three-dimensional (3D) integrated circuit assemblies including metallization interconnections.

2. Discussion of Related Art

Today's integrated circuits often include many (up to millions, or greater) integrated components and devices. However, for a given product, it sometimes is not possible, even with access to millions of components, to achieve on one integrated substrate (or integrated circuits, also know as chips) all of the circuitry or performance required. Thus, two or more substrates may be required. Also, fabrication process limitations sometimes dictate the use of two or more substrates for manufacturing different components. A major challenge then becomes the interconnection of the circuitry on multiple substrates. There may be hundreds of connections required between chips and it is necessary to keep connection resistance low and path lengths short to minimize inductive and capacitive effects, permitting high speed operation. While numerous interconnection arrangements and processes are known, many require special, complicated processes or expensive structures.

Additionally, as the number of components and devices on integrated circuits continues to increase, there exists an increasing number and complexity of on-chip wires used to connect the various components and devices, and to connect internal components and devices to external circuitry. These interconnections may be space-consuming, forcing the length of the interconnections to be longer and thus introducing more delay in signal propagation along these on-chip wires. Introducing additional wiring layers can result in a reduction of wiring lengths, but the formation or fabrication of such additional wiring layers may require additional or complicated processing steps. In addition, the cost of making interconnections is often a critical factor in determining the number of interconnections that may be used if a product is to sell.

Another way to reduce the length of interconnections (and the corresponding wiring delay, coupling capacitance between wires, loss mechanisms, and other unwanted wire parasitic) is to position the devices to be interconnected in a three-dimensional (3D) spatial arrangement. Part of the wire congestion in two-dimensional (2D) spatial arrangements comes from the inability to optimally place the components to be connected, and a 3D arrangement allows more possibilities for attaining optimal placement of components and devices. However, to attain the maximum advantage of wire shortening, the wires would have to be able to be directed vertically through vias between the 3D stacked circuits anywhere within the volume of the circuitry, and not just around the periphery of the stack. FIG. 1 illustrates an example of a 3D chip stack with vertical vias in the interior of the stack. The chip stack 100 includes substrates 110, 120, 130, and 140. Examples of vertical vias are shown as 112, 114, and 116.

A further advantage of 3D placement of components can be a reduction in the overall size of the package required to house these integrated circuits. Packages are often more expensive than the integrated circuits that they enclose, so housing more than one integrated circuit in a single package that would normally enclose only one integrated circuit produces a cost advantage, provided heat removal from the package does not exceed reasonable limits. One kind of multi-chip package would stack dies one upon another. For example, one existing method of packaging 3D integrated circuits consists of centering consecutively larger dies one upon another using wire-bond or perimeter tape connections along the edges of the dies. Stacking by wire bonding is in current use today in multifunction cell phones and digital cameras. But this technique does not permit vertical vias within the body of the 3D circuit that can achieve optimal wire shortening between components within the stack, as the only vertical connections are around the periphery of the dies.

Another 3D configuration utilizes two substrates stacked in a face-to-face configuration, as illustrated in FIGS. 2A and 2B. The term face-to-face implies that the surfaces of the substrates that contain the devices and their contacts, called the faces, will be bonded facing each other. As shown, the two substrates 210 and 220 are aligned and bonded with their respective face surfaces facing each other. In such a configuration, a bridge via may be used to form an interconnection. Bridge vias are relatively expensive in chip area since they require the space of two vertical tunnels as well as the space (gap) between the tunnels to be dedicated to one vertical via signal connection. Since each tunnel and gap takes up surface area and creates some wire exclusion area, it is desirable to minimize this exclusion area for layout compactness.

Thus, a structure and method of forming compact integrated circuit assemblies and interconnections is needed. Preferably, this structure and method will be economical, will facilitate vertical connections within the body of the SD assembly and not just around the periphery, and will not require processing equipment beyond that employed for semiconductor monolithic wafer fabrication including those developed for existing Microelectromecanical Systems (MEMS). It is also desired that such structures and methods should support device interconnections that maintain low inductive, capacitive and resistive coupling between devices on different layers of the 3D die assembly.

SUMMARY OF INVENTION

According to an aspect of the invention, an integrated circuit assembly is provided. The integrated circuit assembly comprises a first chip having a face surface, the first chip including a first metal layer and a collet having an opening, and a second chip including a second metal layer and having a face surface, wherein the first chip and the second chip are bonded in a face-to-face configuration. The integrated circuit assembly further comprises a via electrically contacting the second metal layer and disposed to pass through the opening of the collet.

According to an embodiment of the invention, the via is shaped and arranged to comprise a pillar portion and a nail head portion. According to an embodiment of the invention, the via is disposed to electrically contact the collet. According to an embodiment of the invention, the via electrically contacts the first metal layer. According to an embodiment of the invention, the collet contacts the first metal layer. The via electrically contacts the collet.

According to an embodiment of the invention, the via is formed of metal. According to one embodiment, the metal is copper. According to an embodiment of the invention, a substrate of the first chip forms a hole, and the via passes through the hole. According to one embodiment, the substrate of the first chip is a thinned substrate.

According to an embodiment of the invention, the integrated circuit assembly further comprises a bonding layer used to bond the first chip and the second chip in the face-to-face configuration. The via passes through the bonding layer.

According to an aspect of the invention, a method of forming a via is provided. The method comprises bonding a first chip comprising a first metal layer and a second chip comprising a second metal layer in a face-to-face configuration. After bonding the first chip and the second chip in the face-to-face configuration, a substrate of the first chip is thinned. After bonding the first chip and the second chip in the face-to-face configuration, the via is formed at least partially within the first chip and contacting the second metal layer.

According to an embodiment of the invention, thinning the substrate is performed prior to forming the via. According to another embodiment of the invention, the via is formed to electrically contact the first metal layer.

According to an embodiment of the invention, the method further comprises forming a hole in the substrate of the first chip, wherein forming the via comprises forming a pillar to pass through the hole in the substrate.

According to an embodiment of the invention, the via comprises a pillar portion and a nail head portion. The nail head portion is formed such that it is accessible for use as an external contact.

According to an embodiment of the invention, the first chip further comprises a collet having an opening, wherein forming the via comprises forming a pillar so that at least a portion of the pillar passes through the opening of the collet. The via may be formed to electrically contact the collet. The collet may electrically contact the first metal layer.

According to an embodiment of the invention, bonding the first chip and the second chip in a face-to-face configuration comprises bonding the first chip and the second chip using a bonding layer. According to one embodiment, the via comprises a pillar portion and a nail head portion, wherein the pillar portion passes through the bonding layer.

According to an embodiment of the invention, thinning the substrate comprises thinning to a stopping layer. According to one embodiment, the stopping layer comprises a stud. According to one embodiment, the stopping layer comprises a buried oxide layer.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 7A-7J are diagrammatic cross-sectional illustrations of another process of fabricating a two-chip structure with a deep pillar nail head via in accordance with an aspect of the present invention;

DETAILED DESCRIPTION

Figure 1:
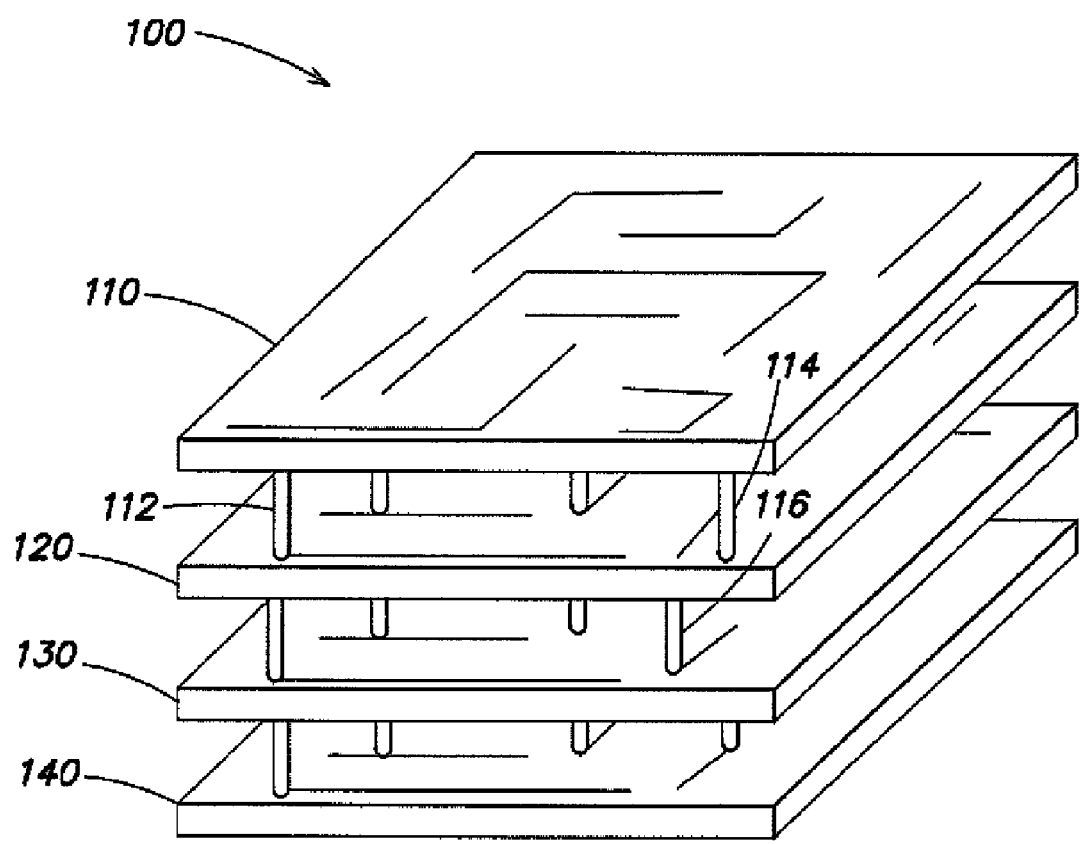
FIG. 1, previously described, is a diagrammatic illustration of a 3D chip stack with vertical vias in the interior of the stack.
Figure 2A:
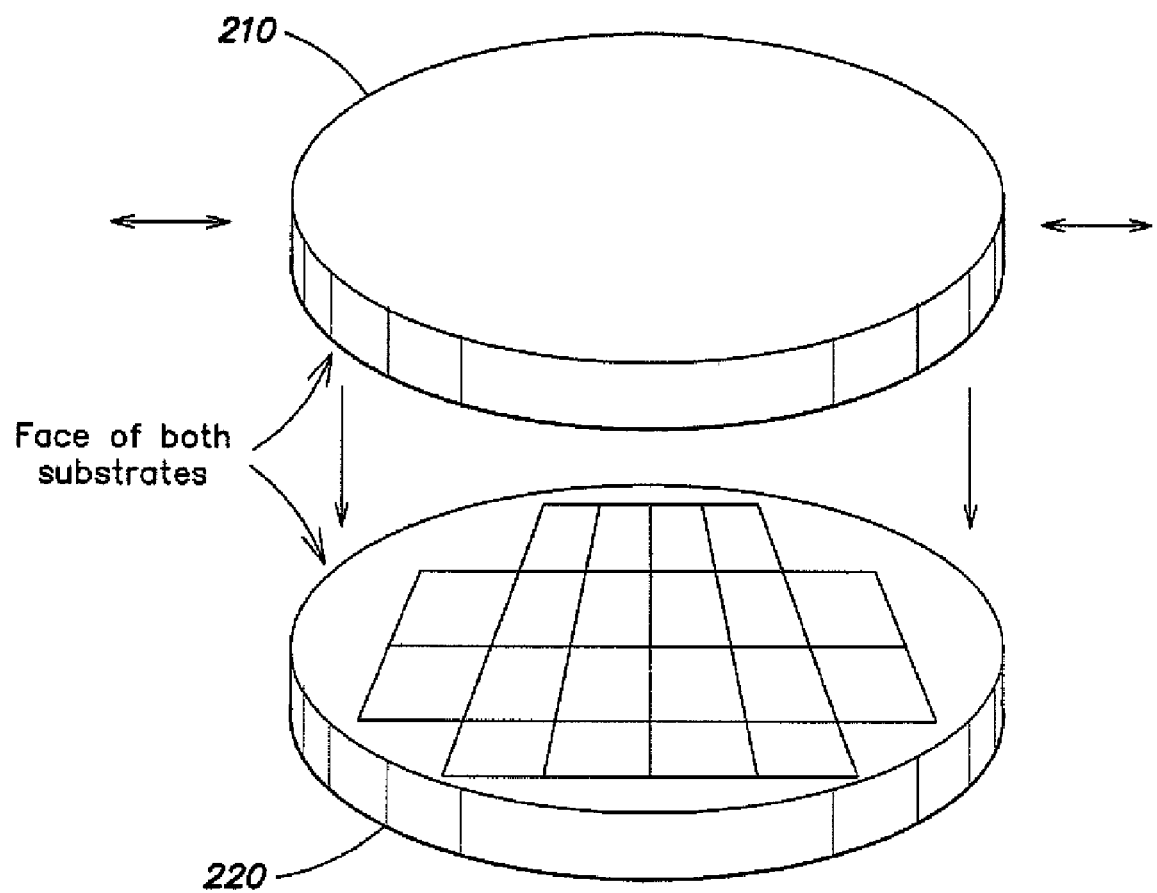
FIGS. 2A and 2B, previously described, are diagrammatic illustrations of the alignment action for face-to-face wafer substrate alignment for monolithic fabrication of 3D die assemblies, and the face-to-face bonding of two aligned substrates for monolithic 3D circuit lamination, respectively.
Figure 2B:
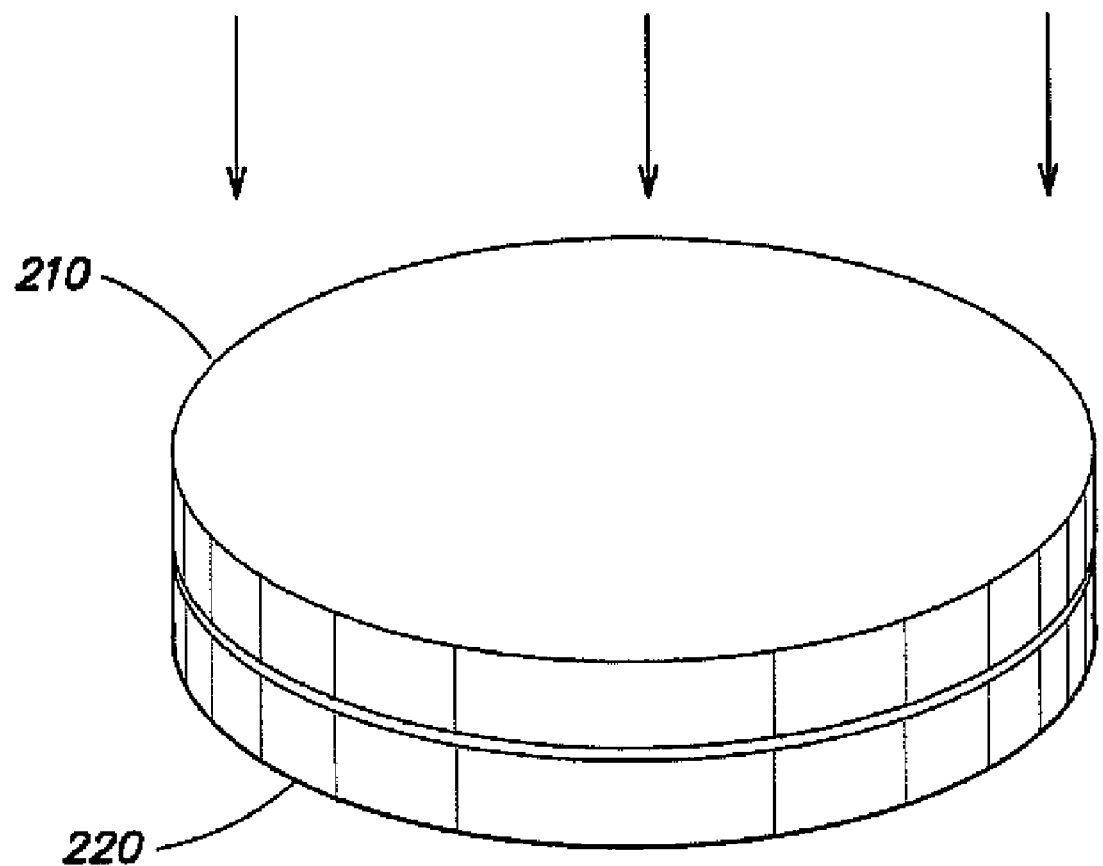

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items. In this application, the phrase "at least one of A and B" is equivalent to A and/or B, meaning A or B or (A and B).

It should also be noted that in describing the semiconductor structures that follow, the term "on" will be used to describe the placement of devices, layers and features relative to each other. The term "on" in such situations is not meant to be limited to an interpretation of "directly on," and is not meant to exclude the possibility of structures being disposed within layers, or at least partially within layers, or the possibility of the presence of intervening layers. Thus, "on" can include "in," "partially in," and "over" as appropriate to the situation.

It is further noted that for purposes of this application, the term "substrate" refers to a support upon which, in which or partially within which layers, structures and/or devices may be formed. The term "chip" as used herein refers to a substrate plus any layers, structures or devices formed on, within or partially within the substrate. A "chip" is often commonly referred to as a "die" or as an "integrated circuit," but an integrated circuit may include additional components such as a lead frame, bond wires and packaging; and an integrated circuit may include multiple chips in one package.

A compact three-dimensional structure of an integrated circuit assembly is provided. Corresponding methods for fabricating the structure also are provided. The structure includes a first substrate (sometimes called a wafer) having a front surface, upon or in which components and devices may be formed, thus forming a first chip. The face of the chip corresponds to the active side of the chip, or the side with the components and/or devices. The structure further includes a second substrate having a front surface, upon or in which components and devices may be formed, thus forming a second chip. The face of the second chip corresponds to the active side of the chip, or the side with the components and/or devices. The first chip and second chip are bonded together, with the respective faces of the chips facing each other. A deep via, which is termed a "pillar" via, formed at least partially within a single trench in one of the chips, is provided to connect metallization layers of the two chips. According to some embodiments, the chips are bonded together with a suitable bonding agent, for example, an appropriate adhesive. The pillar via may be formed through a substrate of one of the chips, thus exposing the pillar at a backside of the substrate. According to some embodiments, a first pair of face-to-face bonded chips may be bonded in an appropriate configuration to a second pair of face-to-face bonded chips, thus forming a multi-chip integrated circuit assembly. For example, in some embodiments, a back surface of a substrate of a first face-to-face bonded chip stack, having exposed pillars, will be treated as a new face for subsequent face-to-face bonding with a back surface of a substrate of a second face-to-face bonded chip stack.

An interconnection for a three-dimensional integrated circuit assembly is provided, along with a method of forming the interconnection. The interconnection may take the form of a via which enables connecting a metal layer of a first chip to a metal layer of a second chip, wherein the first and second chips are bonded in a face-to-face configuration. In some embodiments, the via is disposed at least partially within the opening of a collet, which provides contact to a metal layer of the first chip. The collet may be a ring-like structure that may take the form of a closed (but not necessarily round) contour. Alternatively, the collet may include one or more breaks, forming a segmented contour through which the via passes. According to one embodiment, the via includes two portions. The first portion is a pillar, which is formed at least partially within a single tunnel and extends from a layer of the first chip to a layer of the second chip. The second portion of the via includes a "nail head" structure which contacts the collet, and has a greater cross-sectional area than does the pillar portion of the via.

A low-resistance via for connecting metallization layers of chips bonded in a face-to-face configuration is provided. The via includes a single tunnel structure, and thus occupies a relatively small amount of chip area or volume in the 3D assembly. According to some embodiments, the via is fabricated after the chips have been bonded together. A substrate of one or both of the chips may be thinned after the chips have been bonded together in order to facilitate the via fabrication. According to some embodiments, no portion of the via is formed prior to the bonding of the chips. That is, the via is formed after the chips are aligned and bonded. This "vias in last" approach enables the use of many cleaning processes during the fabrication of the via structure to ensure good contacts and clean surfaces of the via, tunnels, and other fabrication structures. The structure is also inexpensive to make, uses the same processes as are used for semiconductor fabrication, allows for the formation of a high density via array, and exhibits a low inductance due to its relatively short length. These same electrical vias can also serve as thermal pathways to enhance the removal of heat from the interior of the 3D assembly because most metals are also thermally conductive. Of these metals the highest electrical and thermal conductivity at room temperature typically would be obtained with Cu (Copper). The via may also have substantially vertical sidewalls, obtained from high-aspect-ratio processing. The use of copper may help aid the formation of the vertical sidewalls.

It should be appreciated that the aspects and embodiments of the invention listed are not necessarily distinct, but that they may be practiced in any suitable combination. Likewise, the invention is not limited to the aspects and embodiments explicitly described herein, but is capable of additional and alternative aspects and embodiments, as will be apparent to those of skill in the art.

Pillar Via with Nail Head Structure

Figure 3:
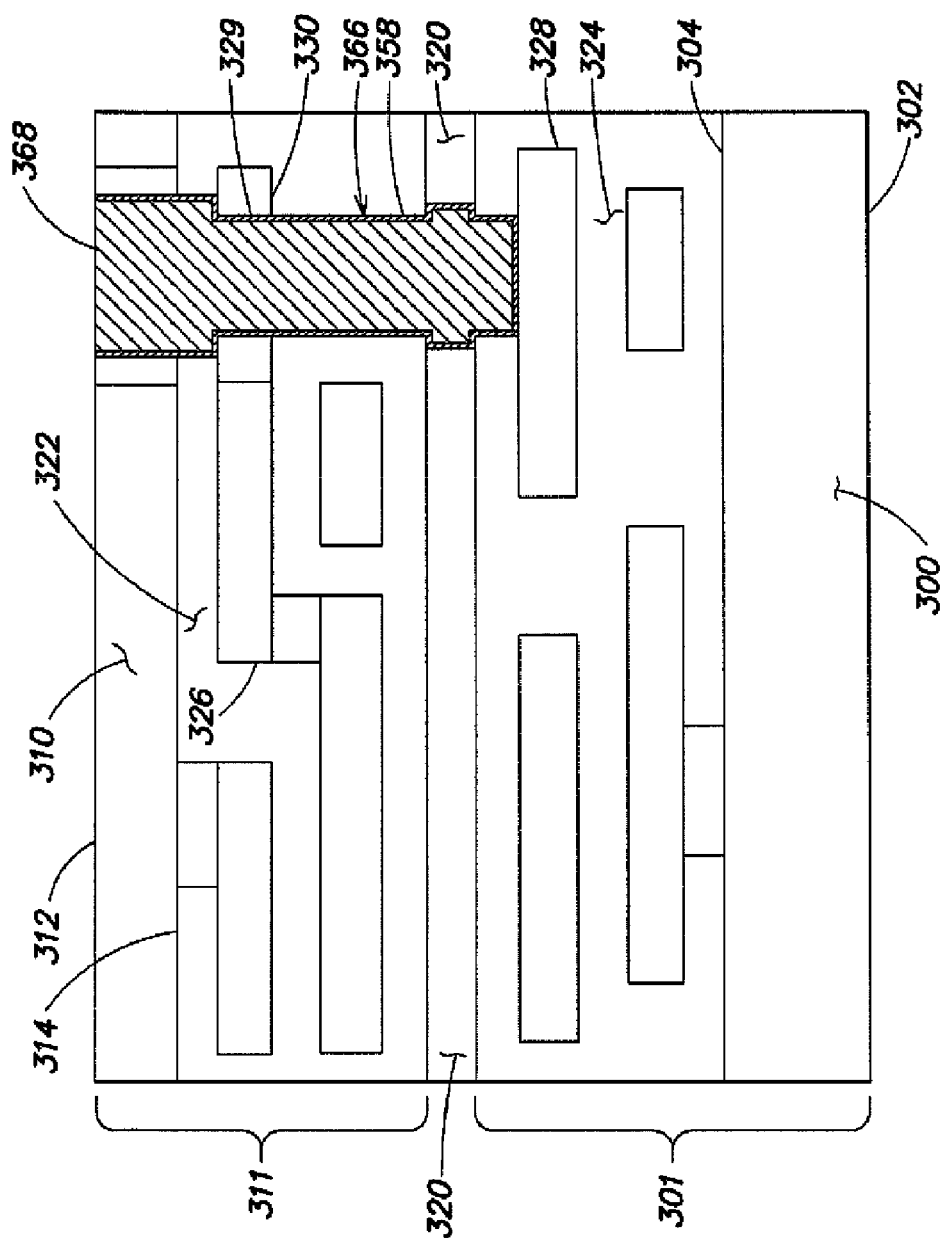
FIG. 3 is a diagrammatic cross-sectional illustration of an example of a two-chip structure formed with a deep pillar nail head via as taught herein.

FIG. 3 illustrates an example of a deep pillar nail head via according to certain aspects of the present invention. As illustrated in FIG. 3, a 3D structure is shown comprising two chips 301 and 311 bonded in a face-to-face configuration, with metallization layers electrically interconnected by a deep pillar via with a nail head.

Figure 4A:
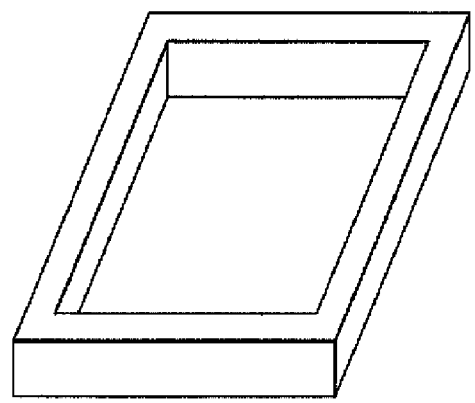
FIGS. 4A-4C are perspective views of examples of collets as taught herein.
Figure 4B:
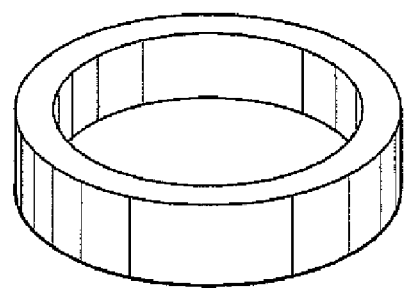
Figure 4C:
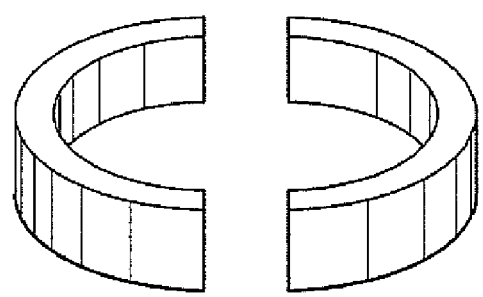

A first chip 311 comprises a first substrate 310 having a front surface 314 and a back surface 312. A dielectric layer 322 is formed on the front surface 314 of substrate 310, and may have one or more metallization layers 326 formed at least partially within it. A collet 330 is also formed within dielectric layer 322, and may partially or completely surround the pillar via, described below. For example, referring to FIG. 4A, the collet may have a rectangular geometry, and may form a closed contour with a "hole" through which the deep pillar via can pass. Alternatively, as shown in FIG. 4B, the closed-contour may be of circular or elliptical geometry. Alternatively, as shown in FIG. 4C, the collet need not be a closed contour, but may instead contain one or more breaks in its contour, thereby providing a partial surround of the later formed deep pillar via. It should be appreciated that any suitable geometry and/or contour may be used for the collet, as FIGS. 4A-4C represent non-limiting examples.

Referring again to FIG. 3, a second chip 301 comprises a substrate 300 having a front surface 304 and a back surface 302. A dielectric layer 324 is formed on front surface 304 of substrate 300. One or more metallization layers 328 may be formed at least partially within the dielectric layer 324, on the dielectric layer, or within other layers.

Chips 311 and 301 are bonded in a face-to-face configuration, such that front surface 314 of substrate 310 faces front surface 304 of substrate 300. The term face-to-face implies that the faces of the chips (i.e., the sides of the chips that contain the layers, structures and/or devices) will be bonded so as to face each other. This also implies that the normal semiconductor alignment marks may be used for die-to-die alignment of the chips before bonding. The chips may be bonded in the face-to-face configuration using bonding layer 320, which may be any suitable bonding layer. For example, this "glue" layer could be 1-3 microns of polymeric compound, or plasma-sensitized surface. Alternatively, a direct chip-to-chip bond may be formed. Any workable means of face-to-face bonding is permissible.

After bonding, substrate 310 may be thinned from the backside by any appropriate method (It is shown in FIG. 3 in the thinned condition.). The thinning of substrate 310 may facilitate the formation of the deep pillar nail head via. The deep pillar nail head via 366, which includes nail head 368, is formed after chips 301 and 311 have been bonded in the face-to-face configuration. In other words, the illustrated embodiment is a "vias in last" approach.

The nail head 368 contacts the upper surface of the collet 330. Due to the previously mentioned hole in the collet 330, the deep pillar nail head via 366 may be fabricated to pass concentrically through the hole. In this sense, the deep pillar nail head via is like thread which is threaded through the eye (collet) of a needle. Depending on the kind of processing being used to form these structures, the deep pillar via may need to have a smaller cross-sectional diameter than the inner diameter of the collet opening, leaving a gap between the deep pillar via and the inner walls 329 of the collet (this gap is not shown in FIG. 3). In other cases, the cross-sectional diameter of the deep pillar via may have the same size as the opening. The deep pillar nail head via 366 may be formed to extend through dielectric layer 322, bonding layer 320 and part of dielectric layer 324 to metallization layer 328. In this manner, deep pillar nail head via 366 acts as a conductive interconnection between collet 330 and metallization layer 328. The collet 330 may also be connected to a metallization layer 326 within the dielectric layer 322, so that an interconnection exists between the metallization layer 326 of chip 311 and metallization layer 328 of chip 301.

Due to the single tunnel structure of deep pillar nail head via 366 (i.e., the trench in which the via is formed), a plurality of deep pillar nail head vias may be formed in an array of higher density than other structures, such as the previously mentioned "bridge" vias based on pairs of tunnels. The vias according to aspects of the present invention also contain substantially vertical sidewalls, which are not significantly sloped, further facilitating the formation of high density arrays of the vias.

The structures illustrated in FIG. 3 may be formed of various materials, and the invention is not limited to any specific set of materials. However, for illustrative purposes, the substrates 300 and 310 may be silicon substrates. The dielectric layers 322 and 324 may be silicon dioxide ($SiO_2$) layers, or any other suitable low K dielectric layer, where K is the dielectric constant. Bonding layer 320 may be a polymeric glue layer, or any other suitable bonding layer. According to one embodiment of the invention, the bonding layer 320 need not be used, as the chips 301 and 311 may be bonded by any suitable bonding mechanism, for example, anodic bonding, or $SiO_2$ to $SiO_2$ bonding. The metallization layers 326, 328, collet 330, and deep pillar nail head via 366 may be formed of any suitable electrically conducting materials, including copper (Cu), aluminum (Al), or any other material, as the invention is not limited in this respect. The metallization layers 326, 328, collet 330, and deep pillar nail head via 366 need not be formed of the same material.

Depending on the material used to form deep pillar nail head via 366, it may be desirable to include a barrier layer 358 to prevent diffusion of the pillar material into the surrounding layers, such as the dielectric layers 322 and 324, and the bonding layer 320. For example, since copper is known to diffuse through silicon oxide and many polymers at elevated temperatures, a barrier layer is needed to prevent this diffusion if copper is the pillar material. The barrier layer may be formed of any suitable material, such as tungsten (W), tantalum (Ta) or TaN, or another Nitride, as the invention is not limited in this respect. Such metals also commonly provide adhesion layers promoting the adhesion of metal to tunnel walls when filling the tunnel.

Alignment, Bonding, and Backside Thinning

In order to fabricate a deep pillar nail head via, it is desired to attain a face-to-face bonded configuration of two chips, with the backside of a substrate of at least one of the chips being thinned. Although the invention is not limited to any specific method of attaining this configuration, a non-limiting example is now described.

Figure 5A:
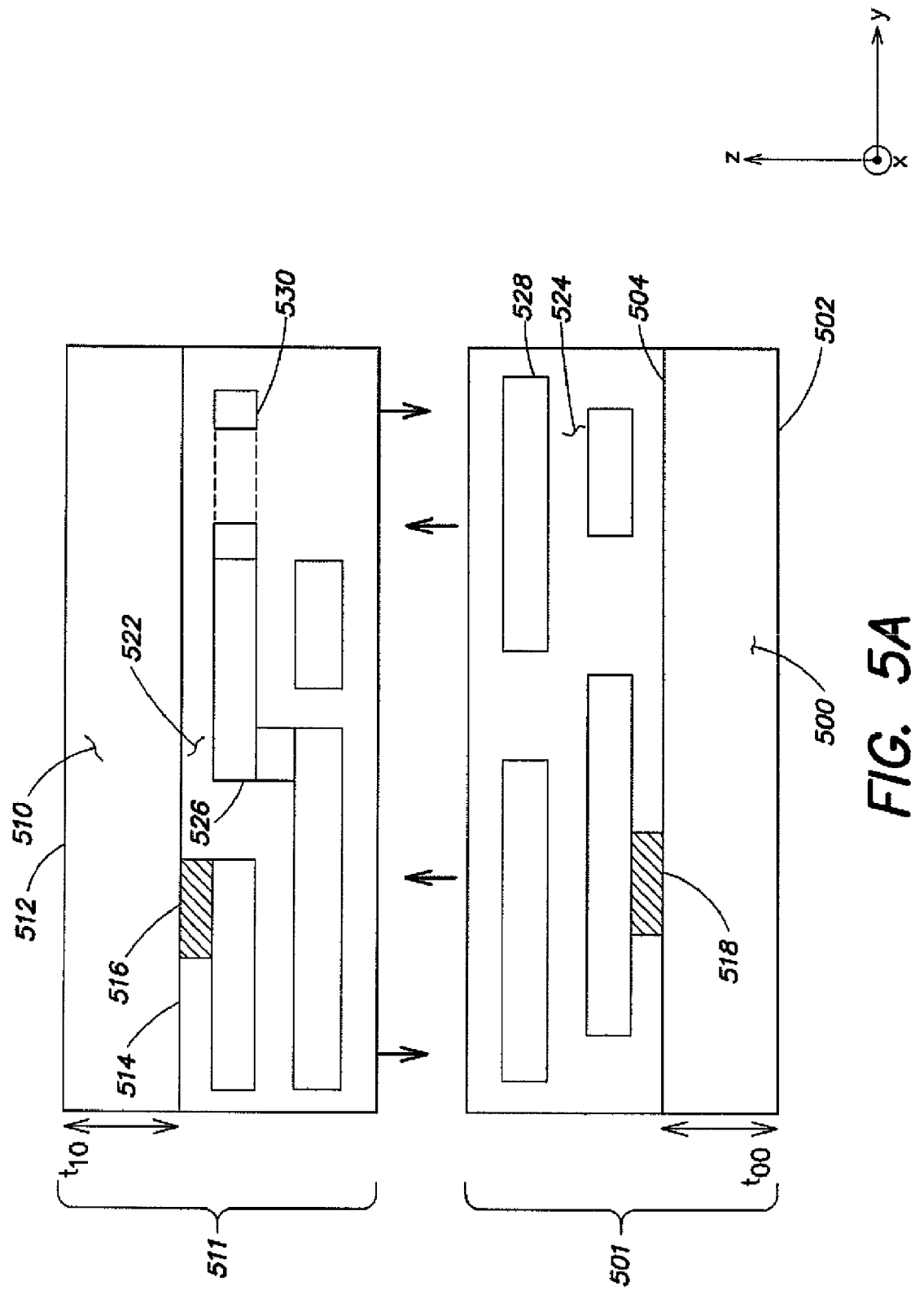
FIGS. 5A-5C are diagrammatic cross-sectional illustrations of an example of the alignment and face-to-face bonding of chips, as well as the backside thinning of one of the substrates of one of the chips.

Prior to bonding, processing may be performed on one or both of two substrates to provide desired components, metallization layers, etc, thereby forming two chips. Referring to FIG. 5A, a chip 501 comprises a substrate 500 having a front surface 504 and a back surface 502. The substrate 500 is a silicon substrate, but could be any other type of substrate, as the invention is not limited in this respect. Substrate 500 has a thickness $t_{00}$, which may be as small as 600-800 microns, or any other thickness, as the invention is not limited in this respect. A dielectric layer 524, which may have a low dielectric constant, K, may be formed on the front surface 504. The dielectric layer 524 may be silicon dioxide, or any other suitable inter-metallic dielectric (IMD) material, as the invention is not limited in this respect. One or more metallization layers 528 may be formed within the dielectric layer 524, and may be formed of copper, aluminum, or any other suitable conducting material, as would be known to those of skill in the art. Contact layer 518, which may be used to provide an ohmic contact between a metallization layer 528 and substrate 500, may be formed on the front surface 504 of substrate 500. The contact layer 518 may be formed of tungsten, or any other suitable contact material. Contact metal can be used to avoid the formation of a Schottky diode instead of an ohmic contact with the device terminals implemented in the substrate or on its face. Appropriate interface metallurgy, as would be known to those of skill in the art, may be used to form the contact layer 518, and to ensure proper contact of contact layer 518 with substrate 500 and metallization layer 528. Collet 530 is formed at least partially within dielectric layer 522. As previously described in connection with FIGS. 4A-4C, the collet 530 may be a ring-like structure, with a closed or open contour. The collet may contact a metallization layer 526. The collet 530 may be formed of copper, aluminum, or any other suitable material for forming a good contact with the deep pillar nail head via and metallization layer 526.

A chip 511 comprises, a substrate 510 having a front surface 514 and a back surface 512. The substrate 510 is a silicon substrate, but could be any other type of substrate, as the invention is not limited in this respect. Substrate 510 has a thickness $t_{10}$, which may be as little as 600-800 microns, or any other thickness, as the invention is not limited in this respect. A dielectric layer 522, which may have a low dielectric constant, K, may be formed on the front surface 514. The dielectric layer 522 may be $SiO_2$, or any other suitable inter-metallic dielectric material, as the invention is not limited in this respect. One or more metallization layers 526 may be formed within dielectric layer 522, and may be formed of copper, aluminum, or any other suitable conducting material, as would be known to those of skill in the art. Contact layer 516, which may be used to provide an ohmic contact between a metallization layer 526 and substrate 510, may be formed on the front surface 514 of substrate 510. The contact layer 516 may be formed of tungsten, or any other suitable contact material. Appropriate interface metallurgy, as would be known to those of skill in the art, may be used to form the contact layer 516, and to ensure proper contact of contact layer 516 with substrate 510 and metallization layer 526.

In anticipation of bonding the two chips 501 and 511 in a face-to-face configuration, a variety of processing steps may be required. The face surface of each chip should be polished to be as flat as possible. Using a deep trench etching process, a trench in the form of a back side alignment mark can be etched part way into the front surface of what will become the thinned substrate partner in a two-chip stack. These trenches will be uncovered in the thinning process, at which point this mark will become visible and useful for backside lithography on the thinned substrate partner. Finally, the front side of the chip needs to be made adhesion-ready, such as by plasma activation of the surfaces or by application of a chemical adhesive by vapor or liquid application methods. This adhesive should be chemically specific for adhering to the face of the chip, contain latent chemistry for adhering to a second adhesion layer, but be capable of existing in a dry state for handling during chip-to-chip alignment and insertion into the bonder.

Figure 5B:
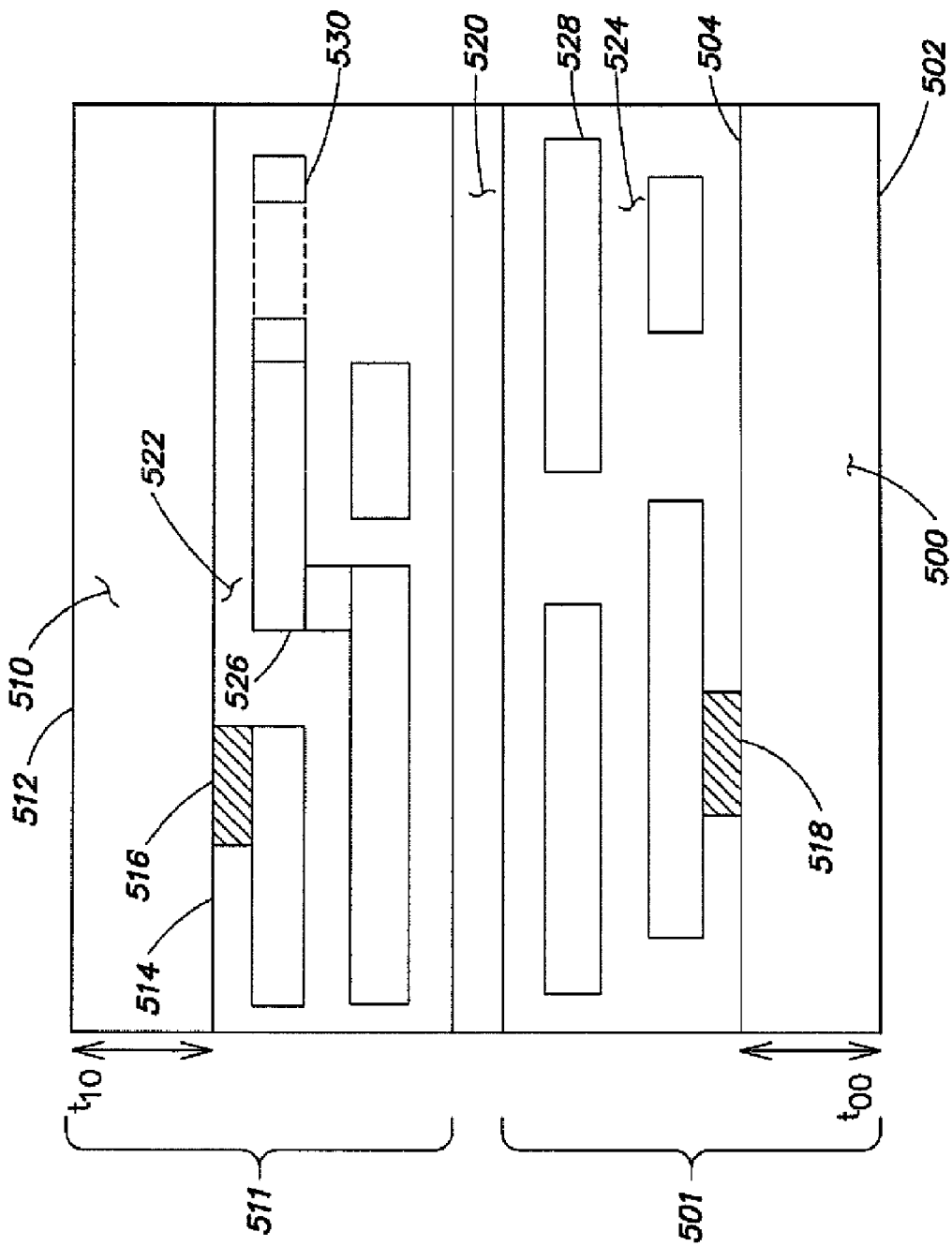

Prior to alignment, one or both faces is/are coated with a bonding layer, such as bonding layer 520 (shown in FIG. 5B). Bonding layer 520 may be a siloxane-based polymeric glue layer. However, alternative bonding layers may be used, for example, epoxy, polyimide, polymethyl siloxane, benzocyclobutene, siloxane copolymers, polyxylylenes, or any other bonding layer. Bonding preparation may also be promoted by plasma activation of the surfaces. It is desired to use a bonding layer that exhibits high thermal stability, a low coefficient of thermal expansion, good adhesion, low resistance to etching, and/or low degradation. Any of these properties or combination of properties may be sought in dependence on the intended application and environment of the structures, and the invention is not limited in this respect.

Due to the face-to-face configuration, in one implementation the alignment can be performed using two imagers. A first imager may be disposed below the chips and may view front surface 514 of substrate 510. A second imager may be disposed above the chips and may view the front surface 504 of substrate 500. Two alignment marks may be aligned on each substrate, the marks being separated from each other by a distance of approximately ¾ of the substrate diameter, although other distances and numbers of alignment marks may be used, or other alignment techniques, as the invention is not limited in this respect.

After the chips are aligned, they may be placed in a bonder in a chuck suitably designed to hold the two chips in horizontal (x-y) alignment while keeping them separated by a small amount in the z-direction for the bonding process to complete. The bonding may be performed by any suitable method. In one embodiment, the bonder heats the two substrates from their backsides and then carefully moves the two substrates together in the z-direction while maintaining their x-y alignment. Due to the indicated thicknesses of substrates 500 and 510, on the order of 600-800 microns, the substrates may be substantially rigid, facilitating their bonding without wrinkling, cracking, or otherwise sustaining damage. The completed face-to-face configuration is shown in FIG. 5B.

Figure 5C:
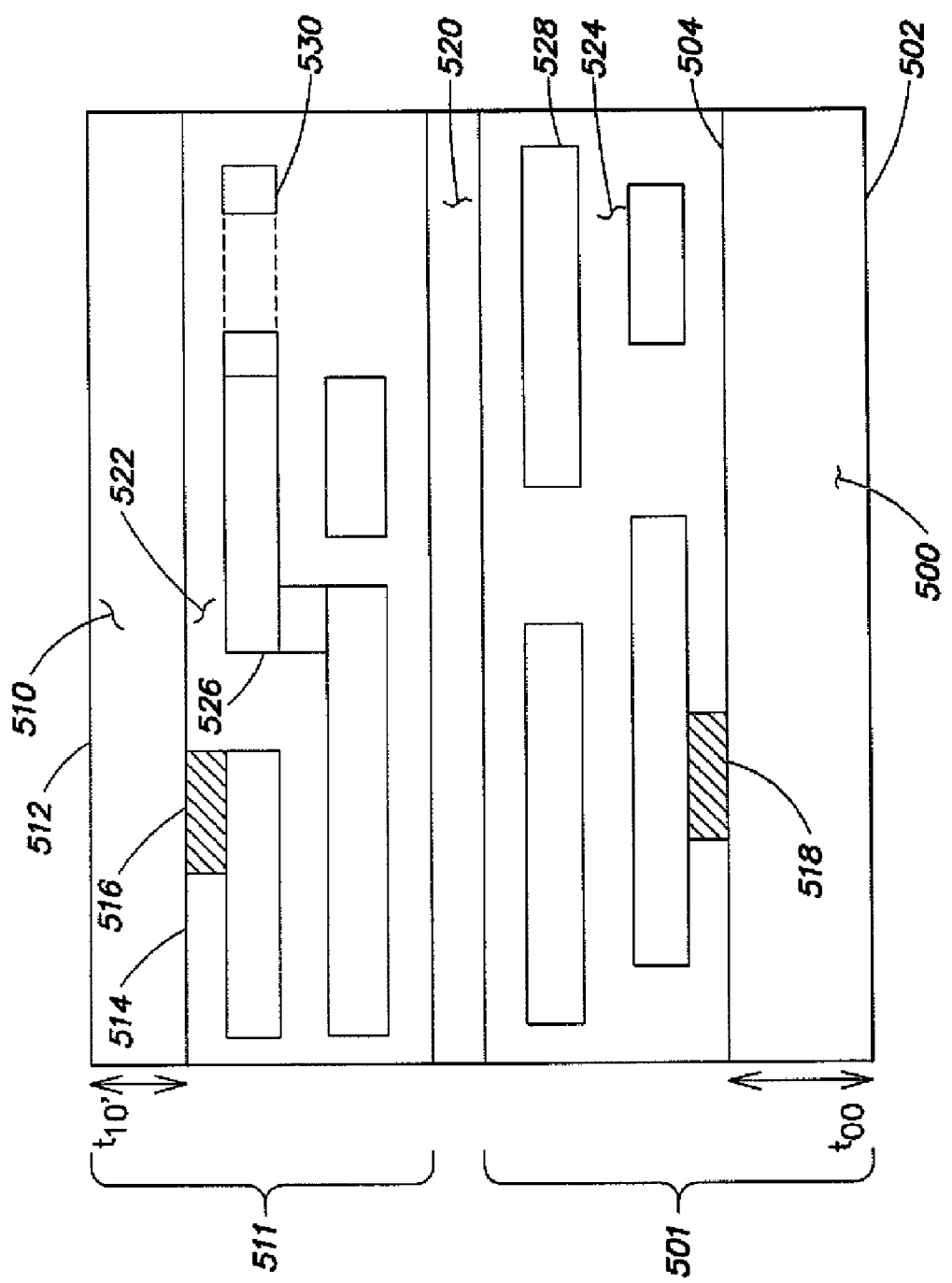

FIG. 5C illustrates the face-to-face configuration of FIG. 5B wherein the substrate 510 has been thinned from the back surface 512. The thinning may be performed by any suitable method for thinning silicon, for example, lapping, wet etching, or plasma thinning. Substrate 510, which had an initial thickness $t_{10}$, now has a thinned thickness $t_{10'}$, through which a hole or trench may be etched more easily than through the initial thickness $t_{10}$. The thinned substrate may also exhibit a greater optical transparency than an un-thinned substrate, thus facilitating further optical processing and/or aligning. The thinned thickness $t_{10'}$ may be 200 angstroms to 10 microns, or any other suitable reduced thickness. If the thickness remaining after thinning is too large to acquire the registration information, special substrate preparation steps can be used to insert deep trench features from the front surface of the substrate, which will be exposed after thinning and then be used for registration.

It is important that the thinned substrate have a highly uniform thickness. This may be achieved by any suitable method. For example, one method is to use an etching process that selectively stops etching or substantially slows the etching process at a buried oxide layer, such as is normally used in an SOI wafer process. Specifically, substrate 510 may be formed using SOI (silicon on insulator) technology, using materials with contrasting etch resistances. The contrasting etch resistances may facilitate uniform thinning of substrate 510.

If the wafer substrates are not SOI structures, other buried layers such as SiGe alloy layers, or heavily doped layers can be selective enough to slow or substantially end the thinning process. For instance, although not shown, substrate 510 may initially comprise a silicon substrate, a thin (approximately 200 angstrom) deposited SiGe layer, and epitaxial Si grown on the SiGe layer. The front surface 514 may correspond to a surface of the epitaxial layer, with the back surface 512 corresponding to a surface of the silicon substrate. After bonding chips 501 and 511 in the face-to-face configuration, the thinning process may function to thin the silicon substrate, stopping at the deposited SiGe layer, and thus leaving the SiGe layer and the epitaxial silicon layer intact.

Other techniques of thinning could involve adding additional deep trench structures from the face side of the wafer, filling them with an appropriate material that would be exposed during the thinning process and either slow down the etching process or serve as a signal indicator for regional thinning that the desired thickness has been locally achieved. For example, substrate 510 may comprise studs of any suitable material, such as tungsten formed from the front surface 514. Upon thinning substrate 510 from the back surface 512, after bonding, the tips of the studs may become exposed and either hinder any further thinning, or otherwise indicate that thinning is completed. Such a technique could be used with a regional plasma plume for example, sensing the exposure of the deep trench isolation (DTI) through the erosion of the material in the DTI structure by, say, a residual gas analyzer or other signaling means.

The method of thinning the substrate may be chosen depending on the type of stopping layer used, or vice-versa. By following the process of the above-described non-limiting example, a face-to-face bonded configuration with a uniformly thinned substrate may be obtained.

Formation of Pillar Via with Nail Head

Various fabrication sequences will now be described in relation to the formation of a pillar via with a nail head according to certain aspects of the present invention, assuming a face-to-face bonded, and thinned, configuration as the starting point (for example, the structure of FIG. 5C). For purposes of simplicity, specific values and/or characteristics of the process (such as aspect ratios, etchants, structure dimensions, etc.) will be listed, where appropriate. It should be appreciated that such specific examples are not intended to be limiting. Furthermore, it should be appreciated that the discussed order of processing steps is intended as illustrative and non-limiting, and that the steps may be performed in various orders. Additional processing steps may be added, and not all of the steps discussed herein are required.

Process Sequence 1

Figure 6A:
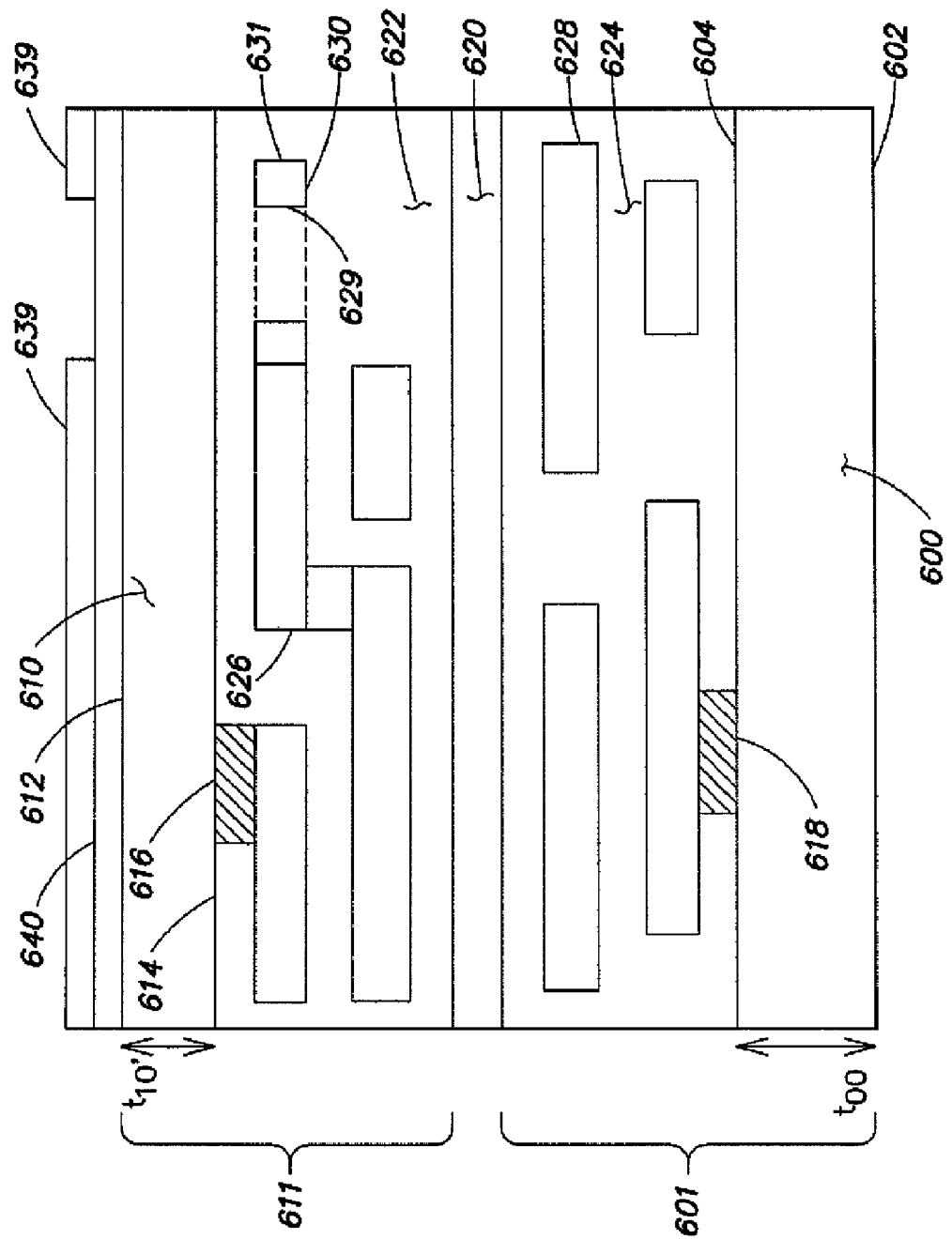
FIGS. 6A-6U are diagrammatic cross-sectional illustrations of a process of fabricating a two-chip structure with a deep pillar nail head via in accordance with an aspect of the present invention.
Figure 6B:
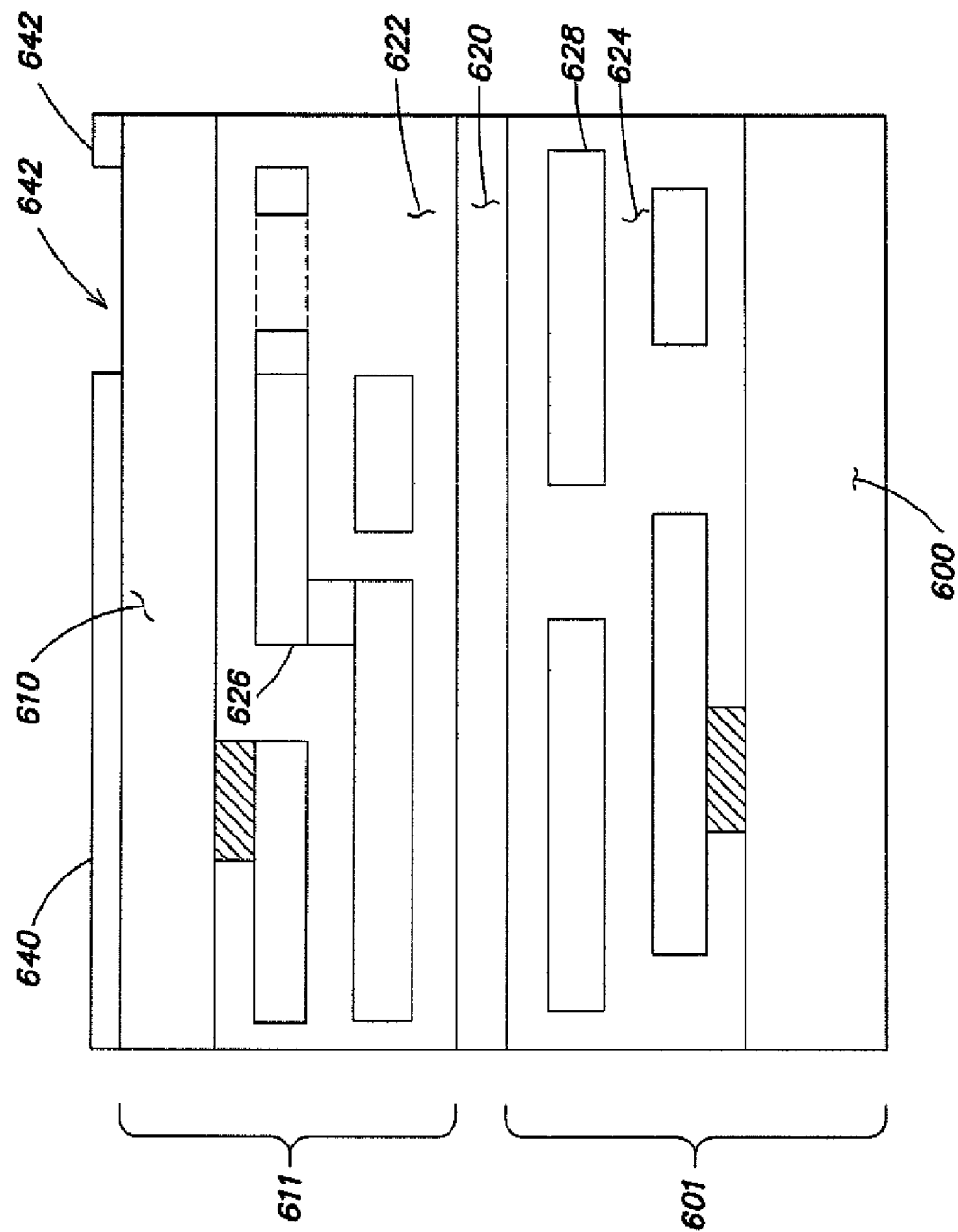
Figure 6C:
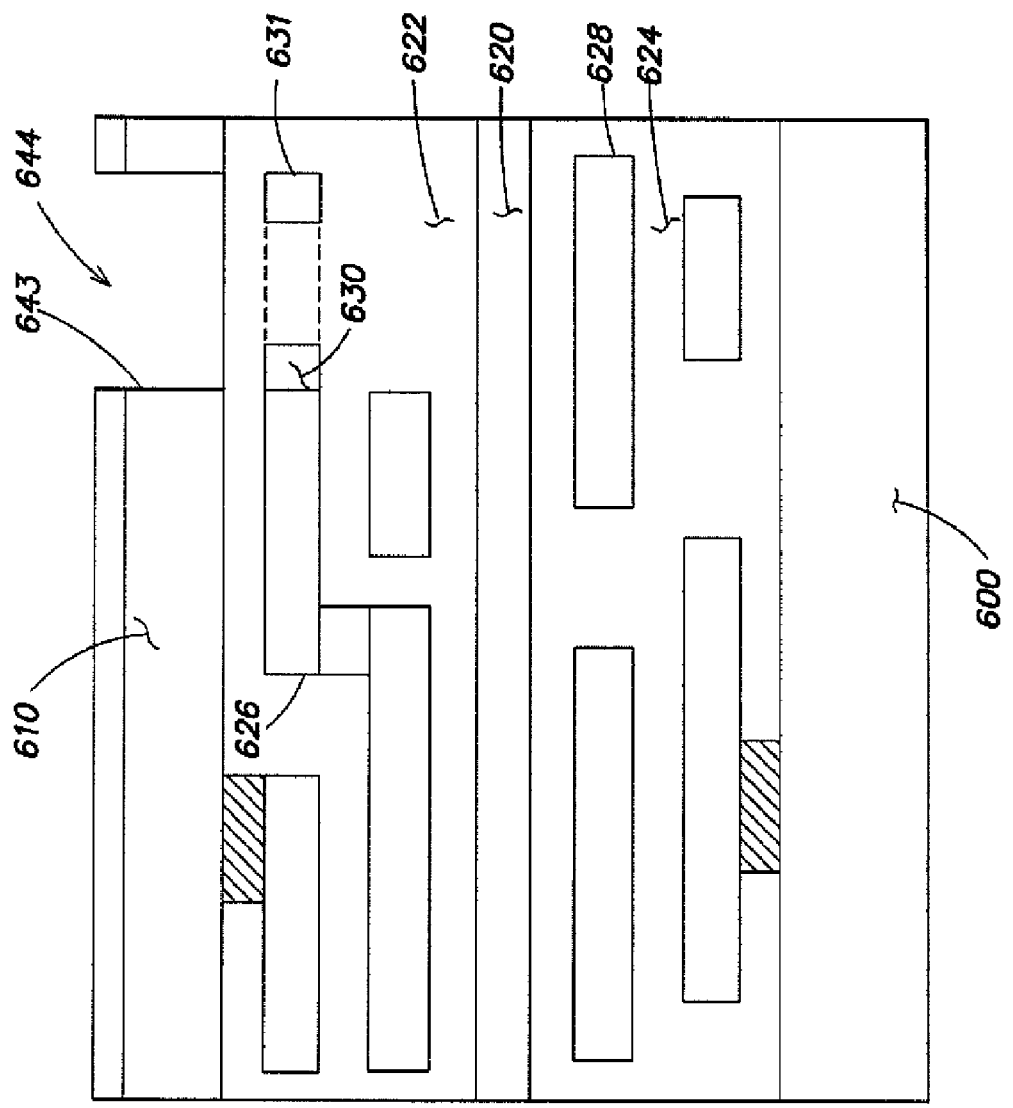
Figure 6D:
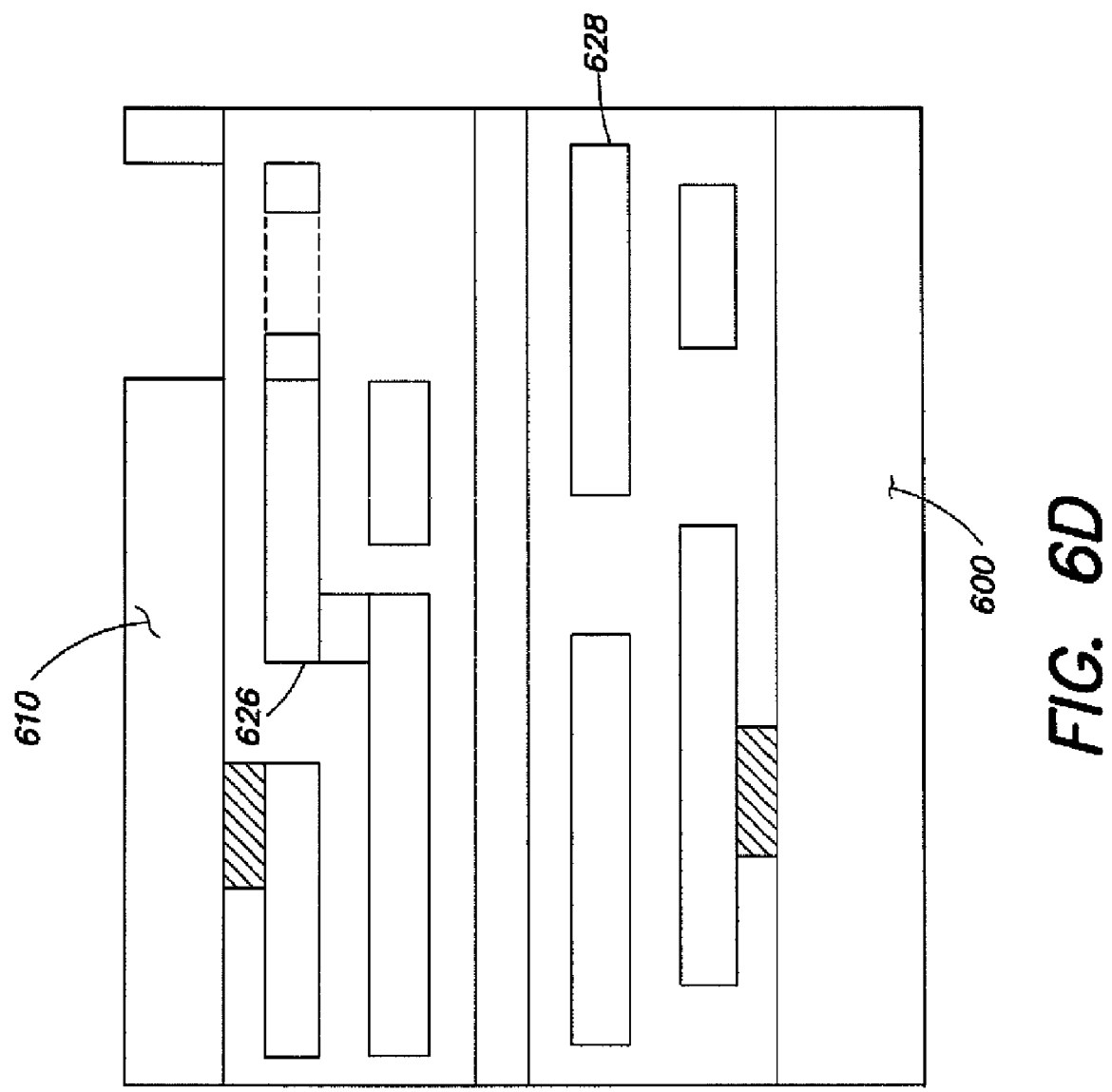
Figure 6E:
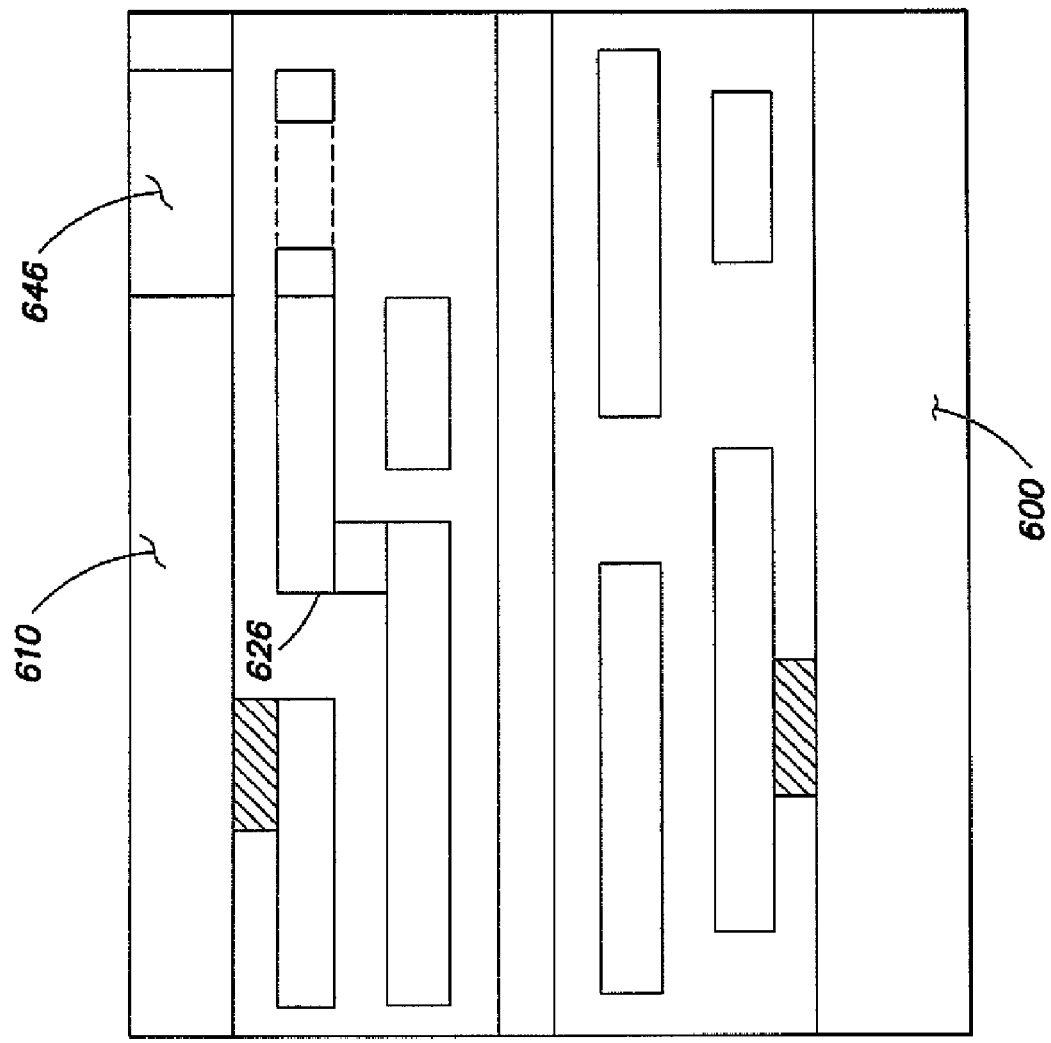
Figure 6F:
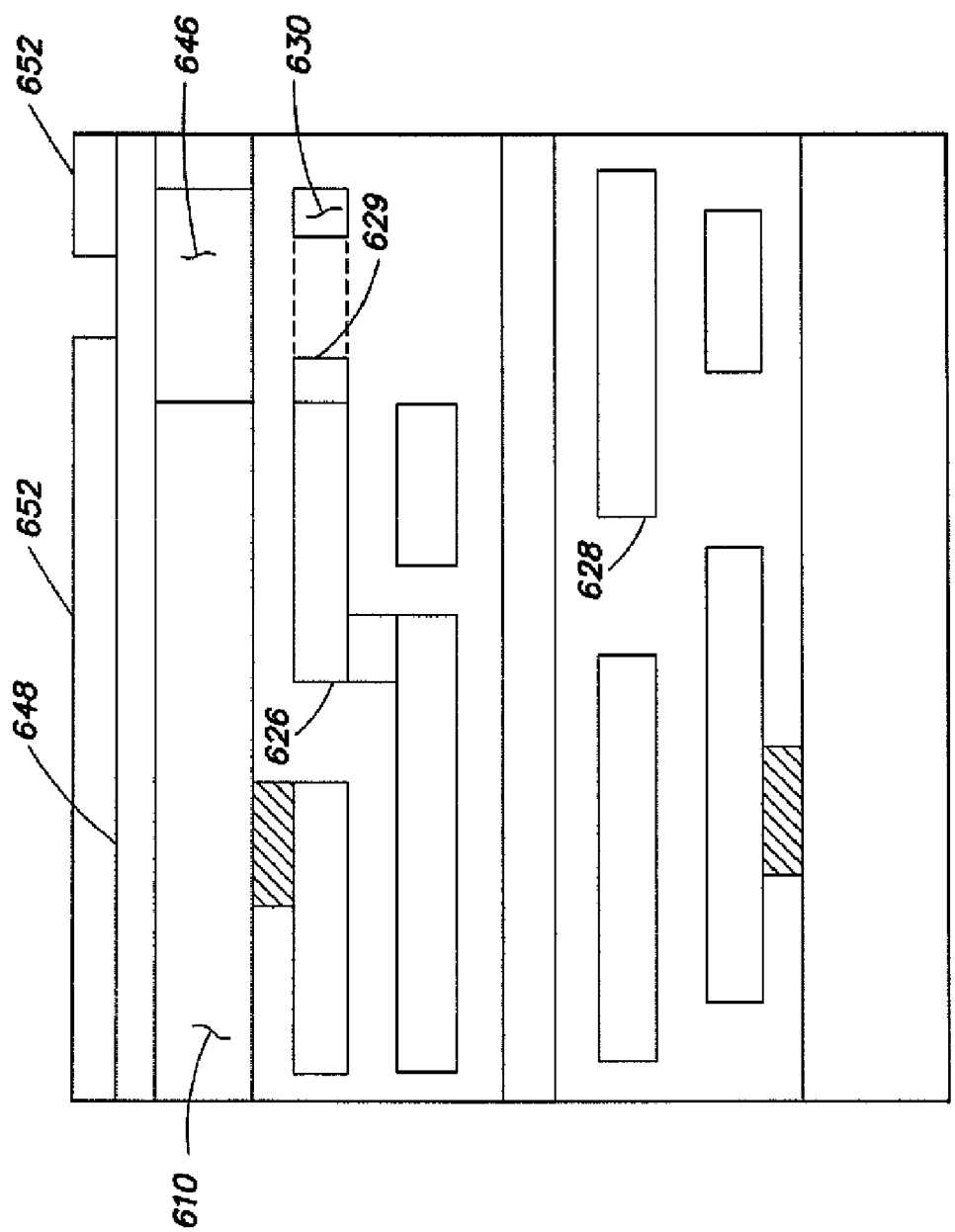
Figure 6G:
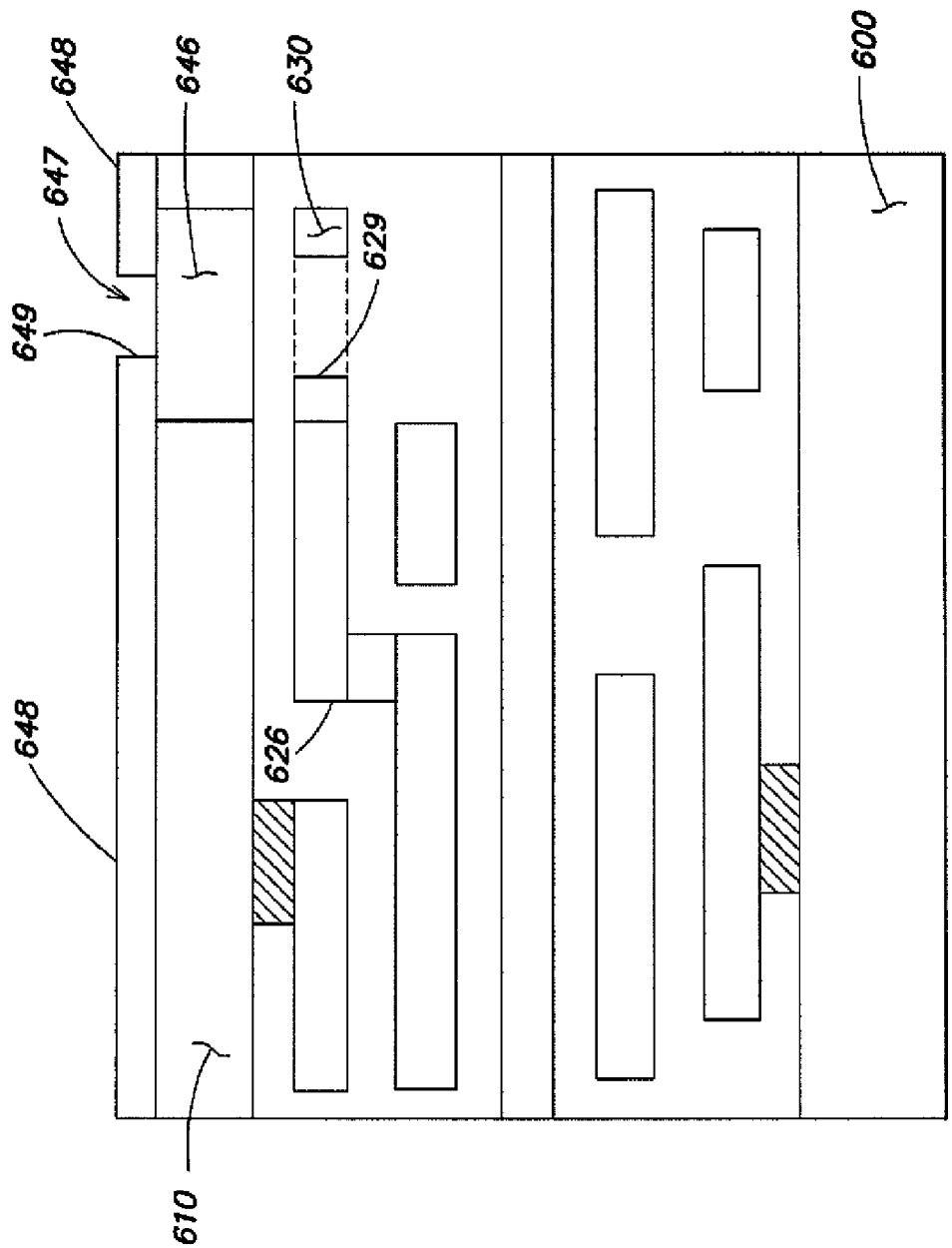
Figure 6H:
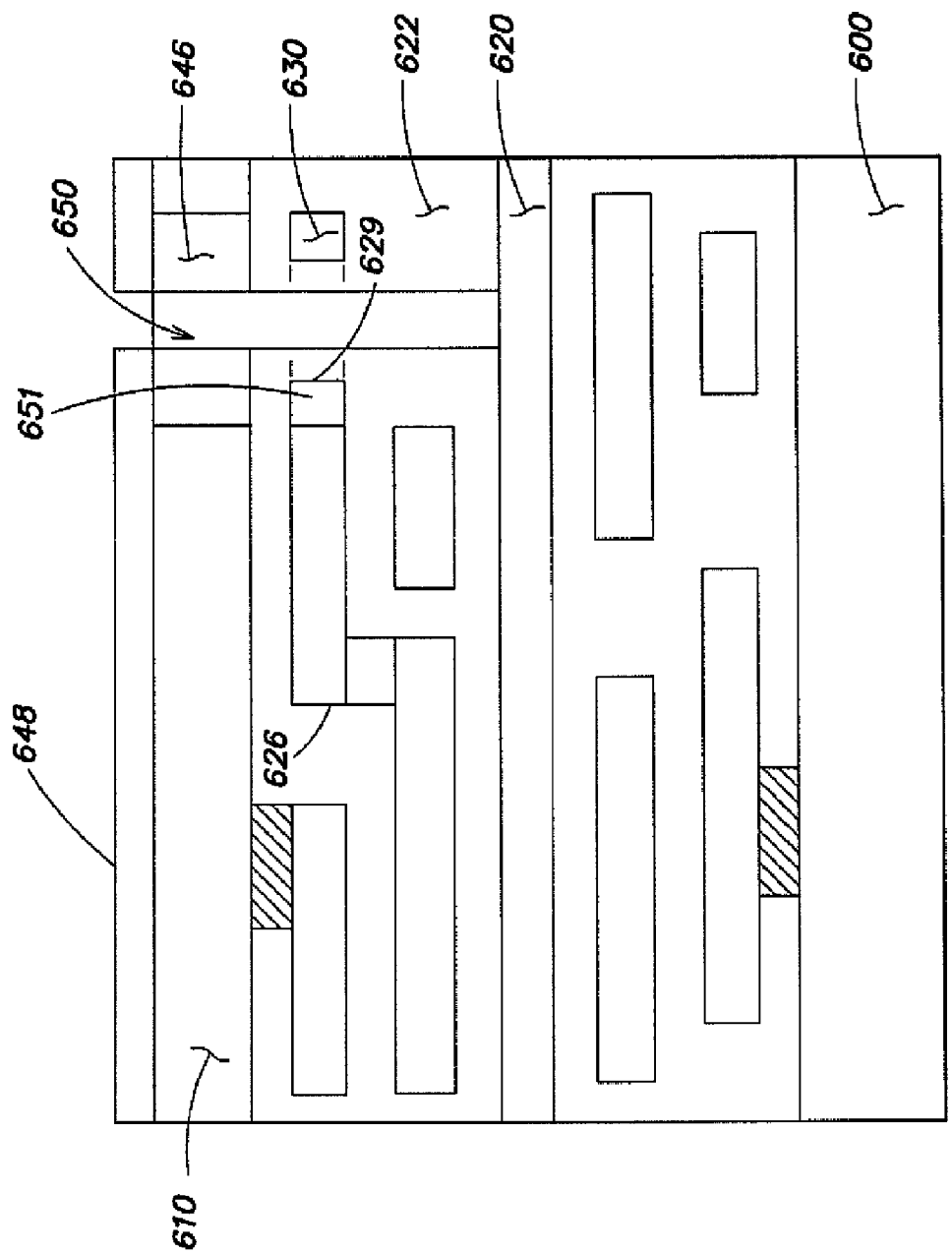
Figure 61:
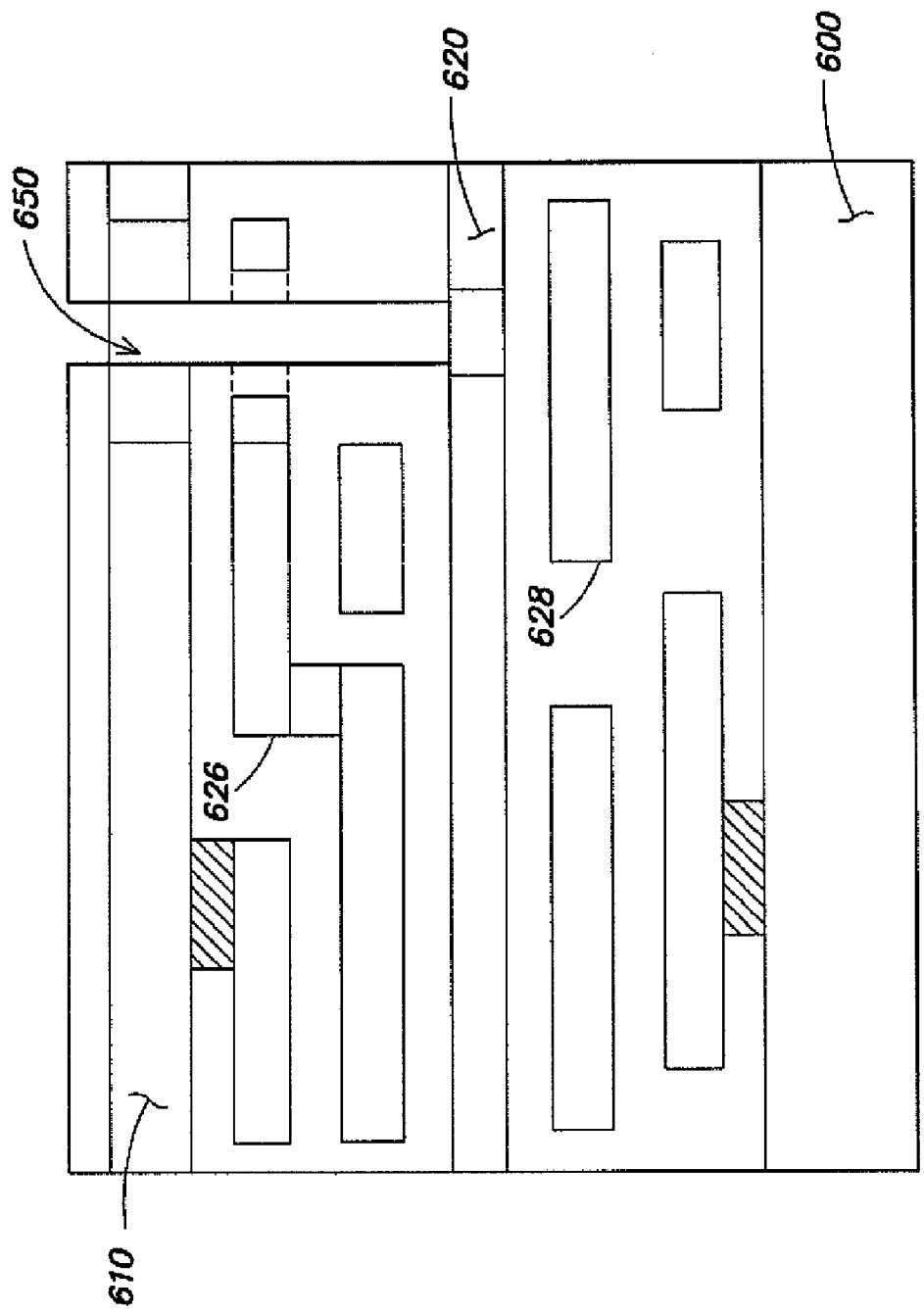
Figure 6J:
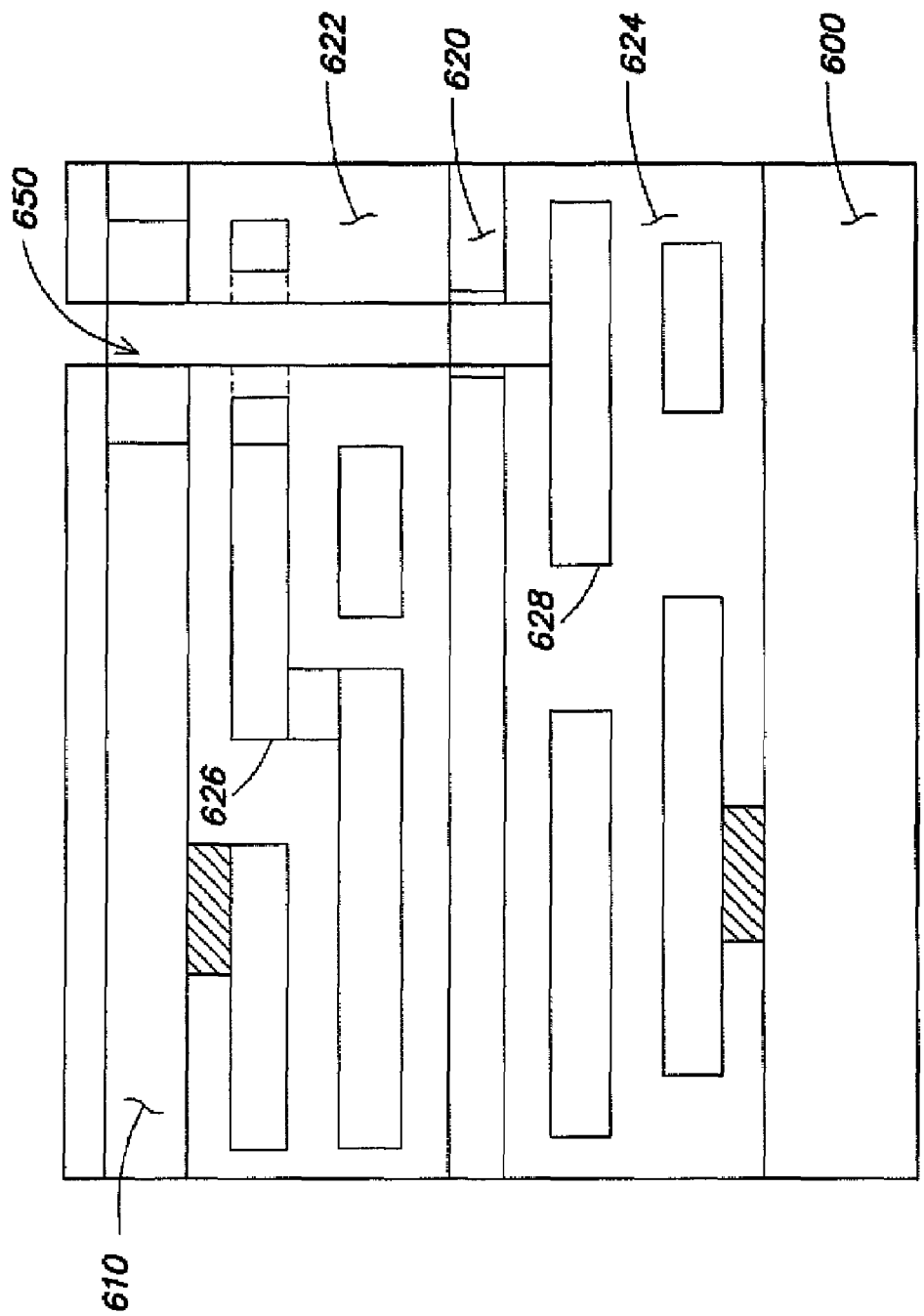
Figure 6K:
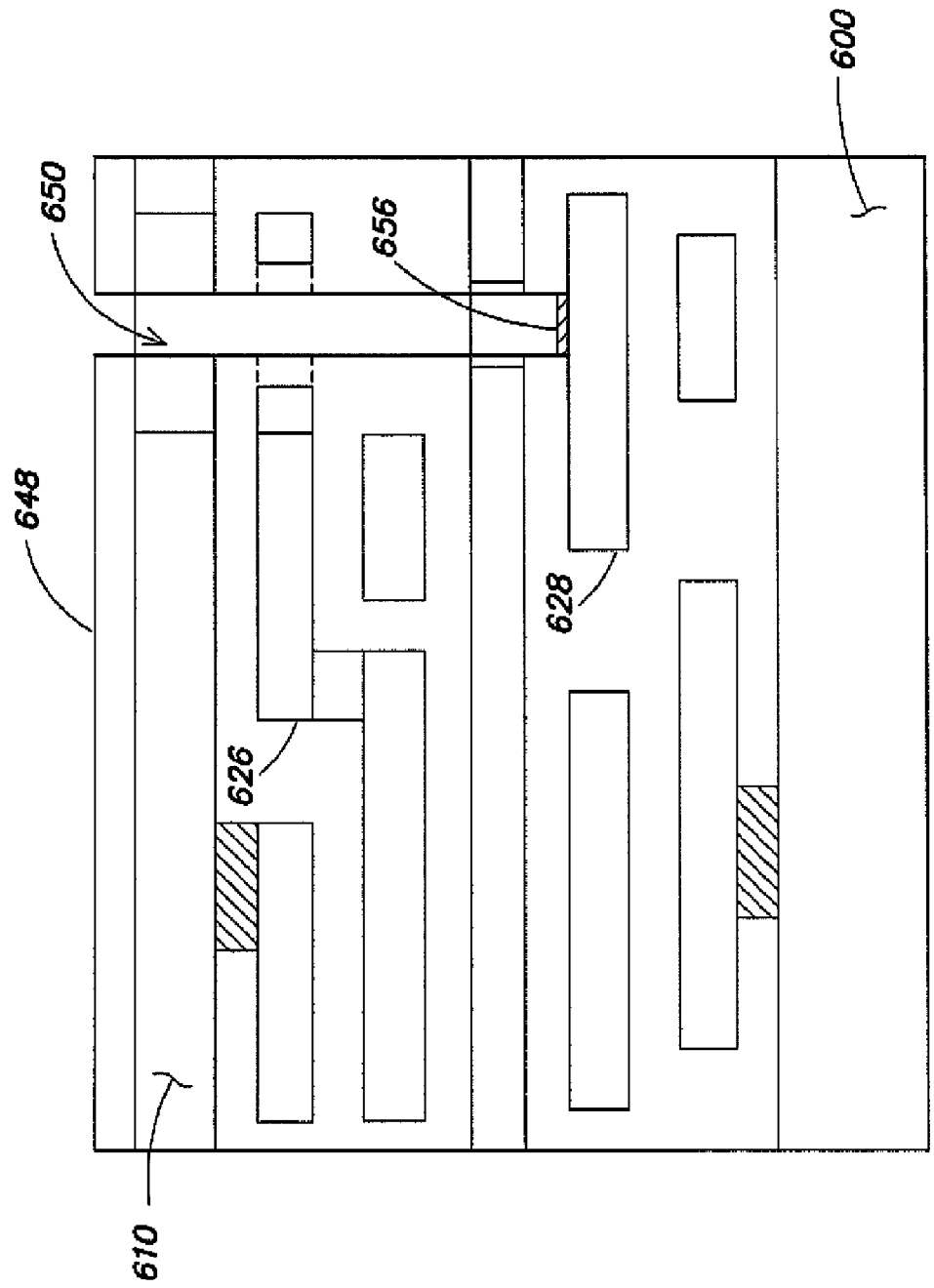
Figure 6L:
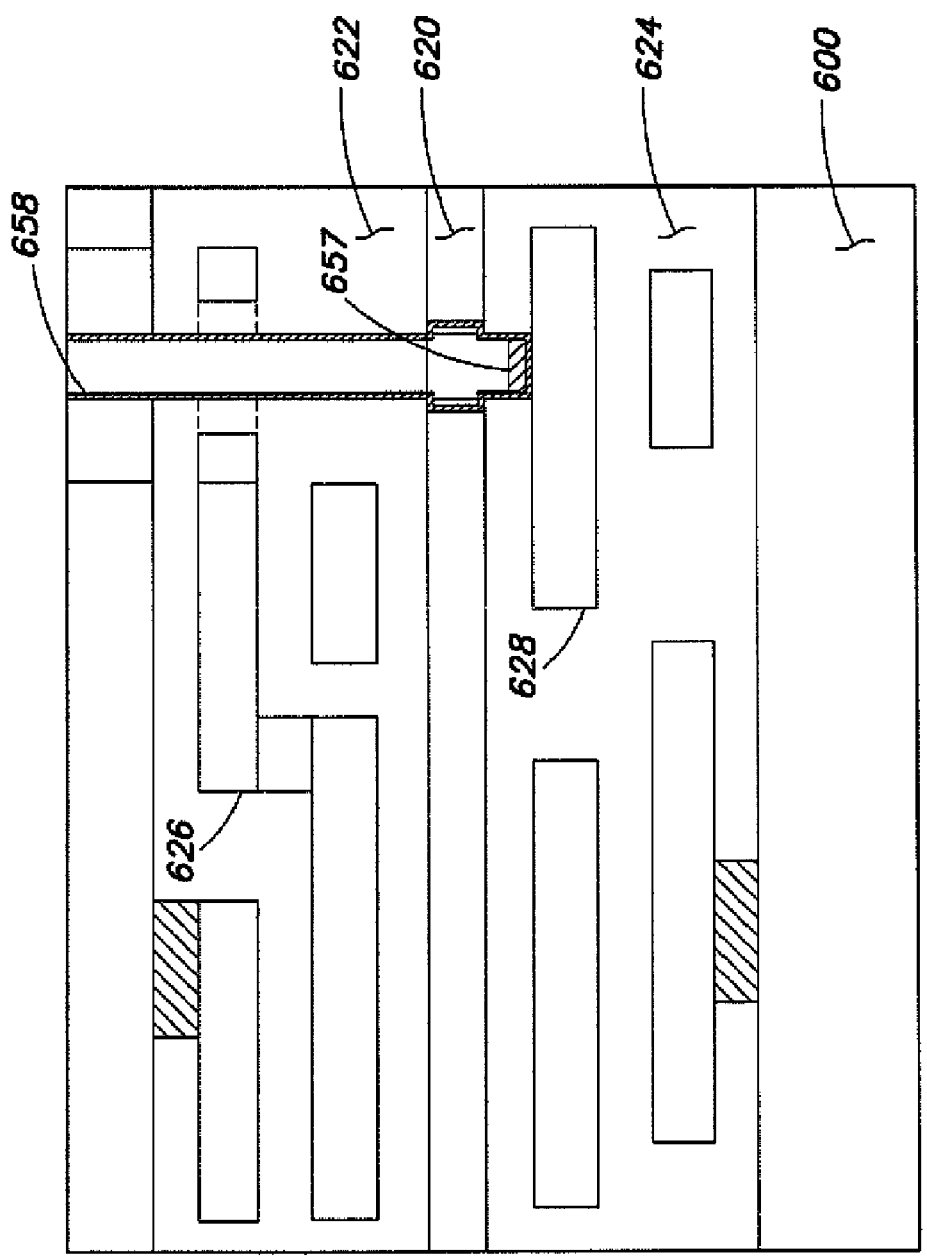
Figure 6M:
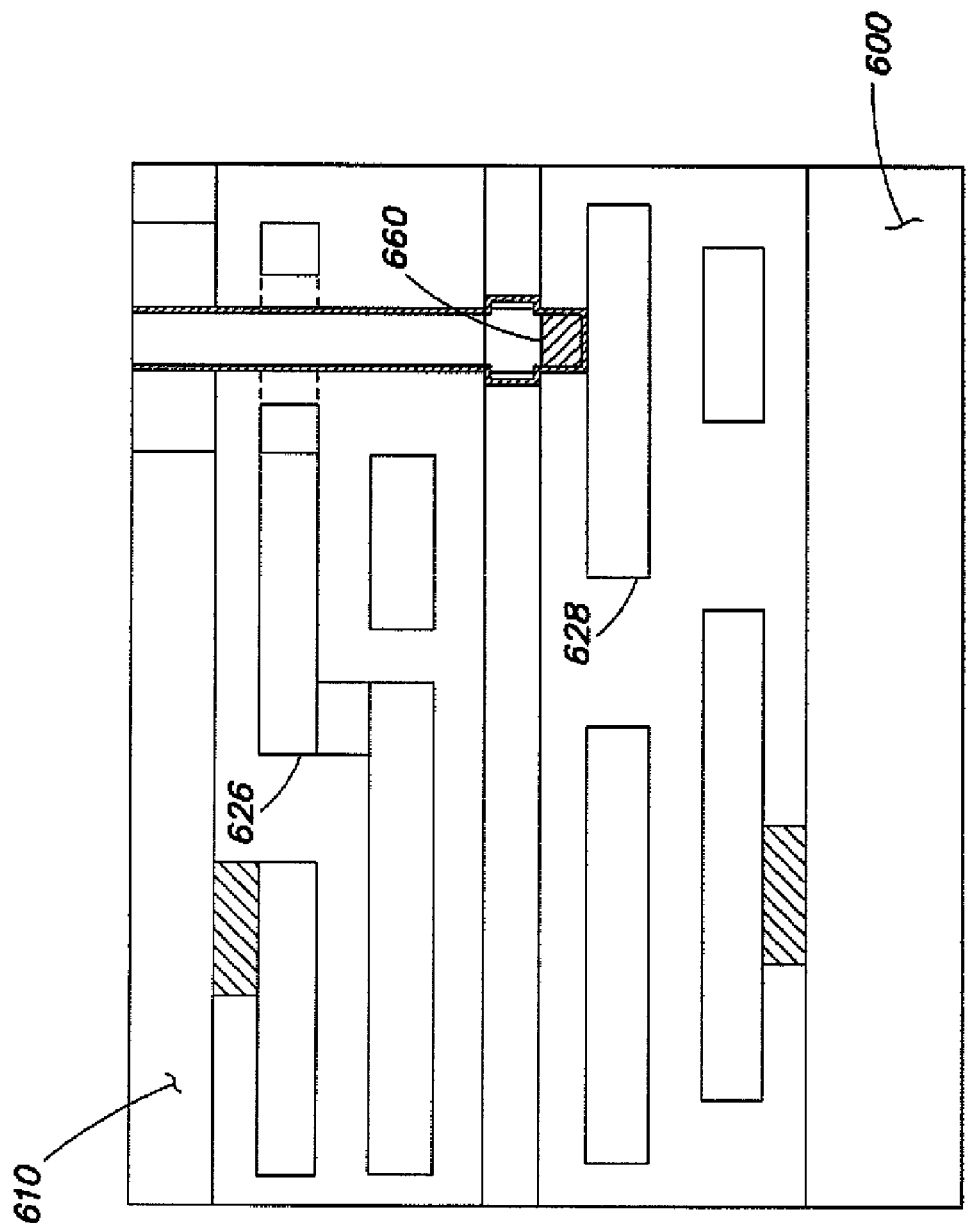
Figure 6N:
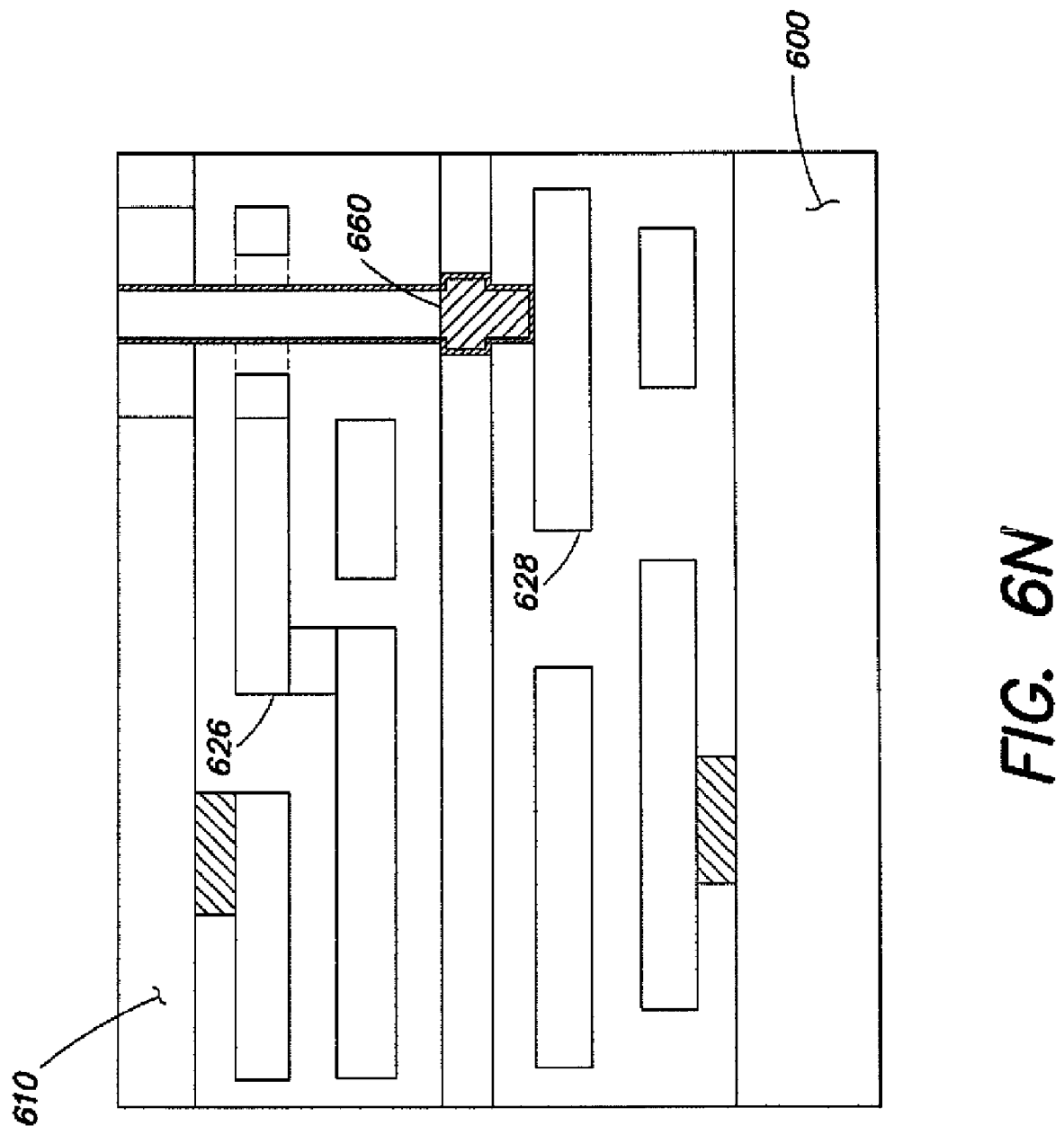
Figure 60:
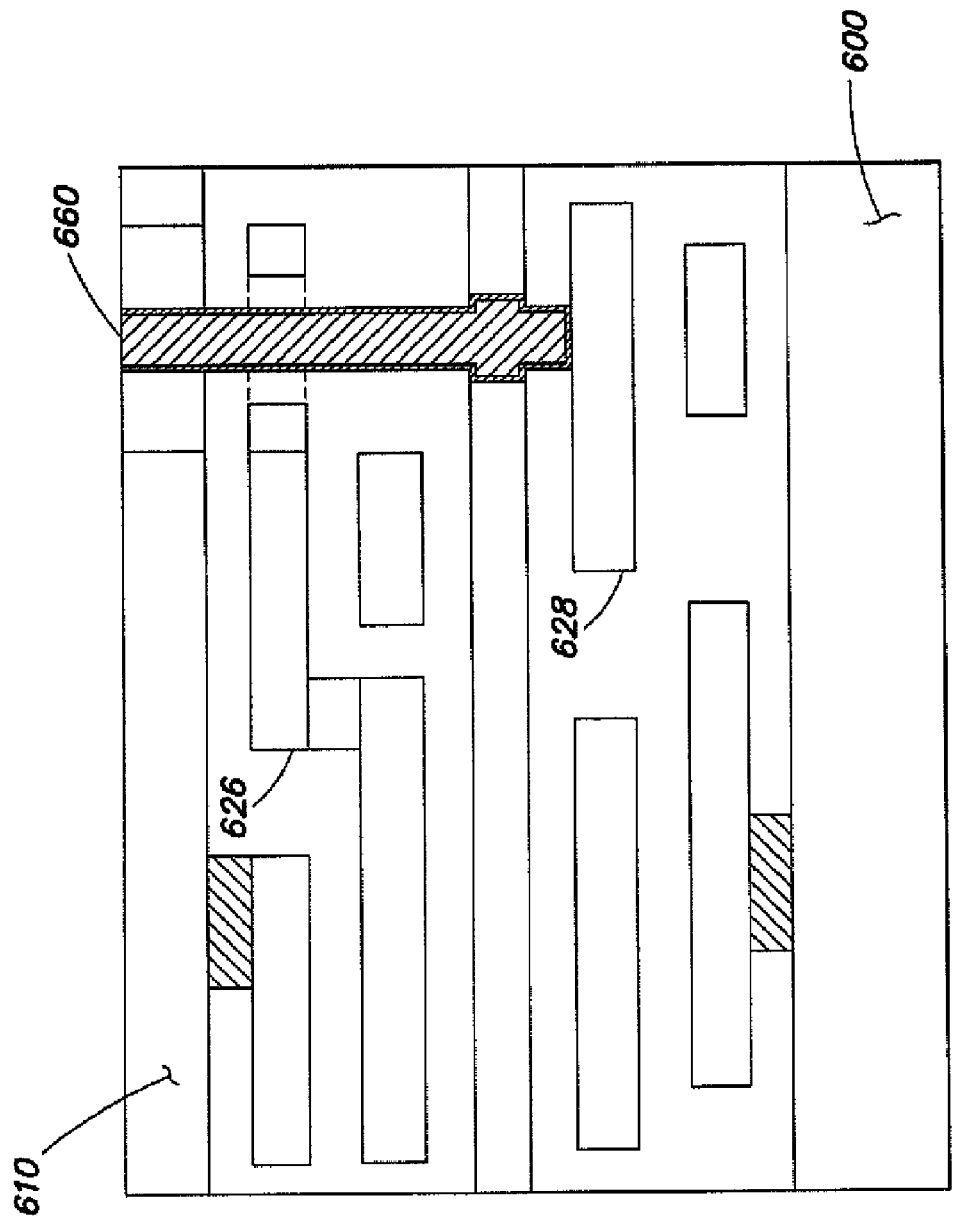
Figure 6P:
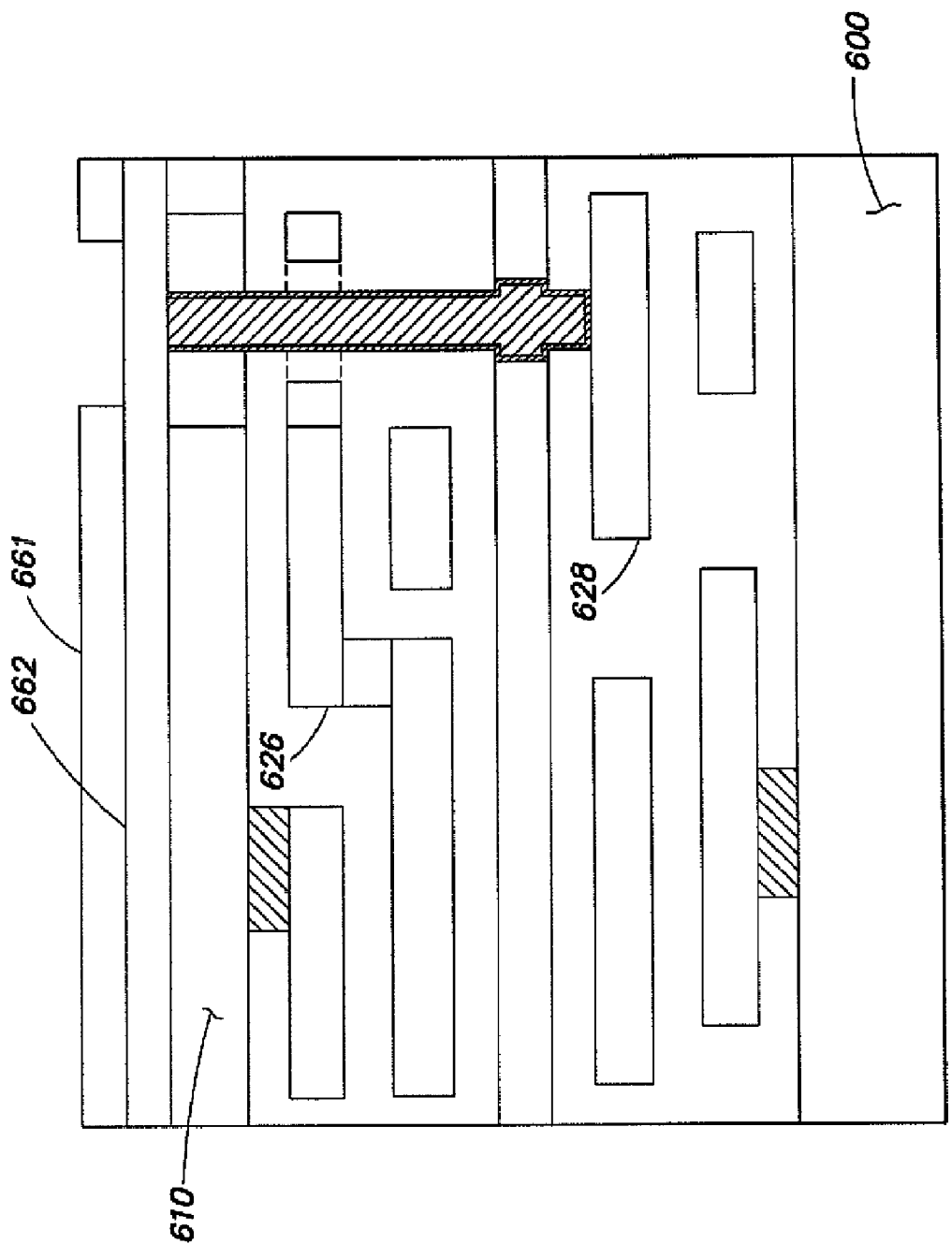
Figure 6Q:
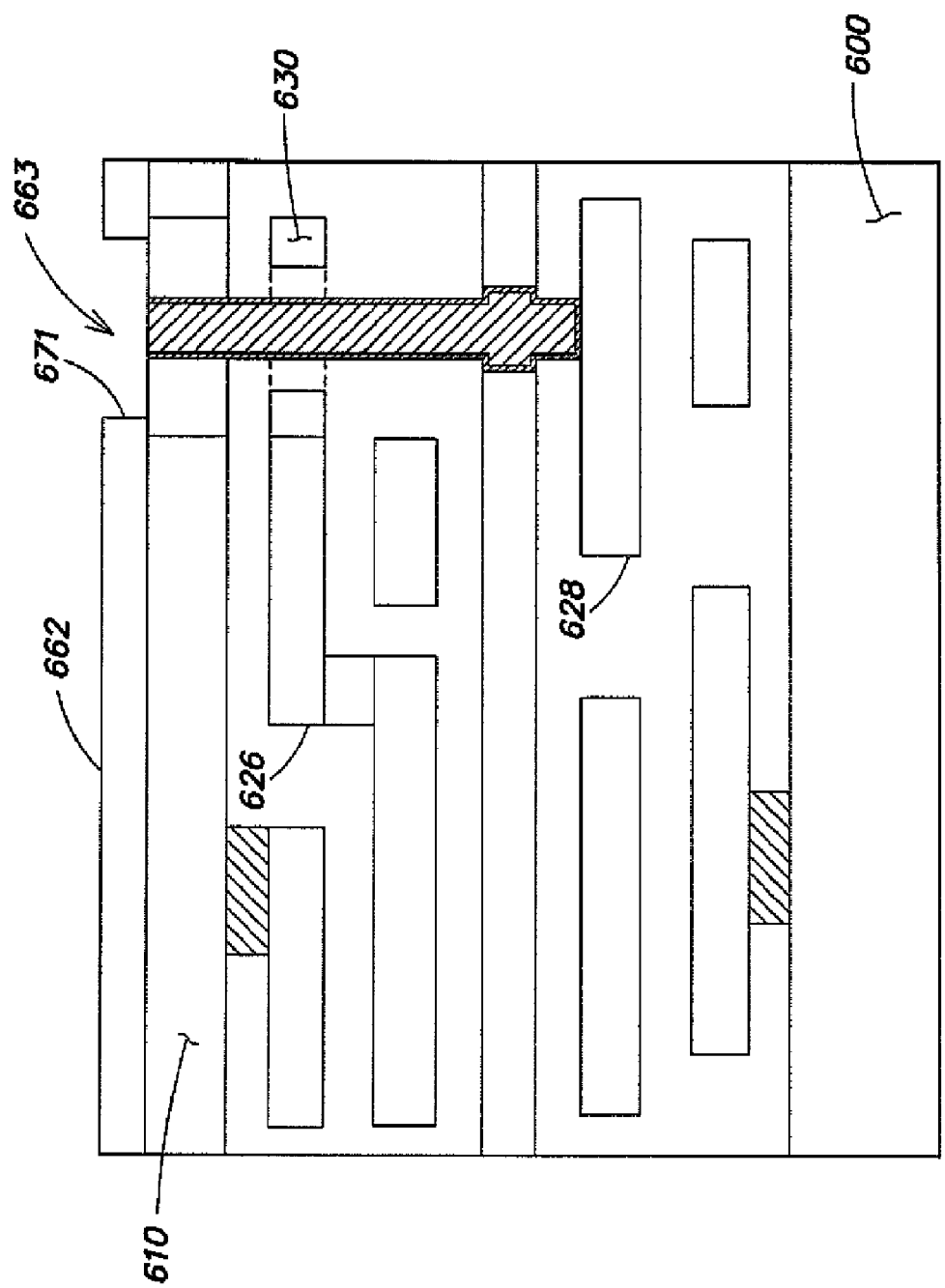
Figure 6R:
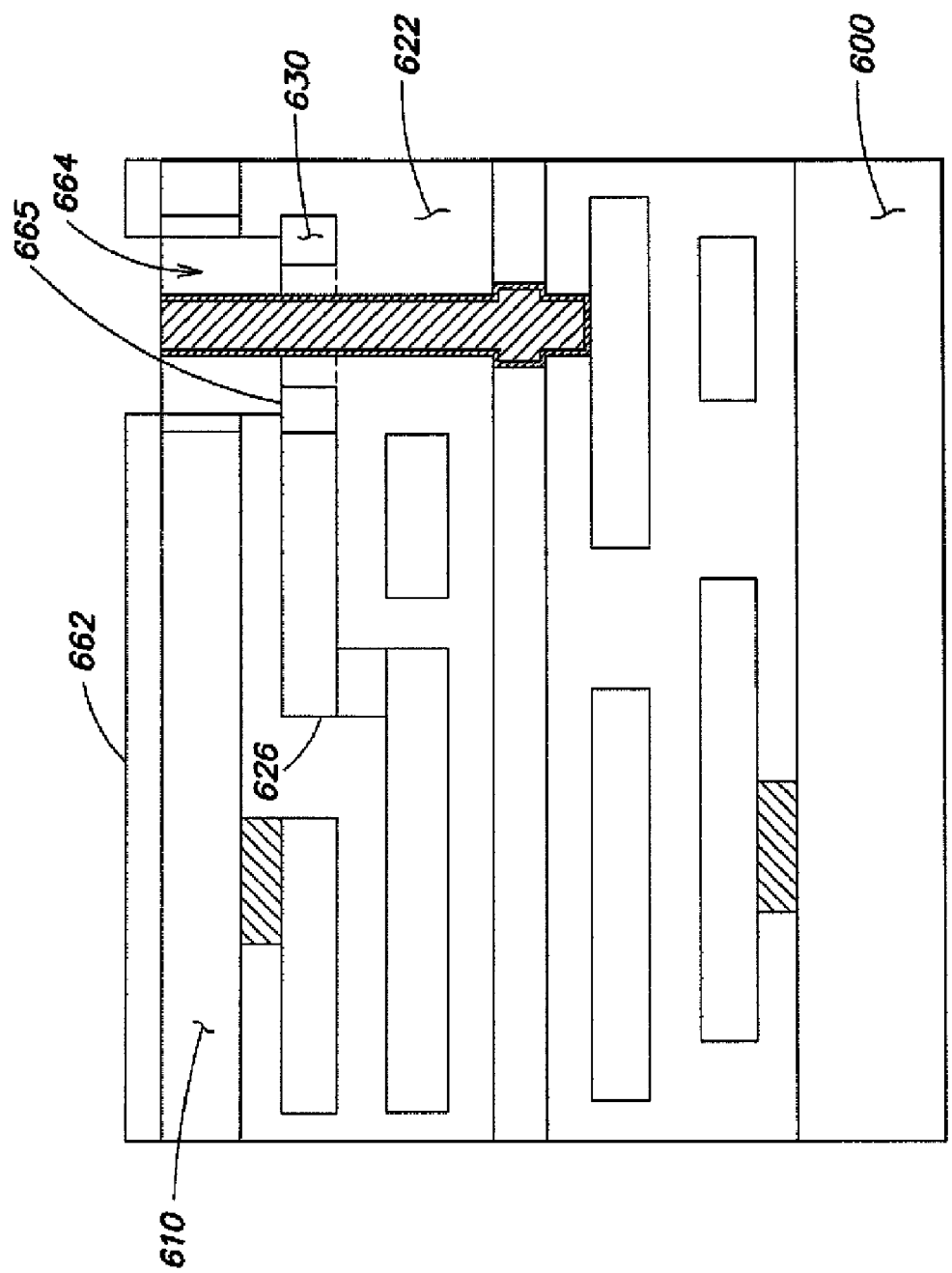
Figure 6S:
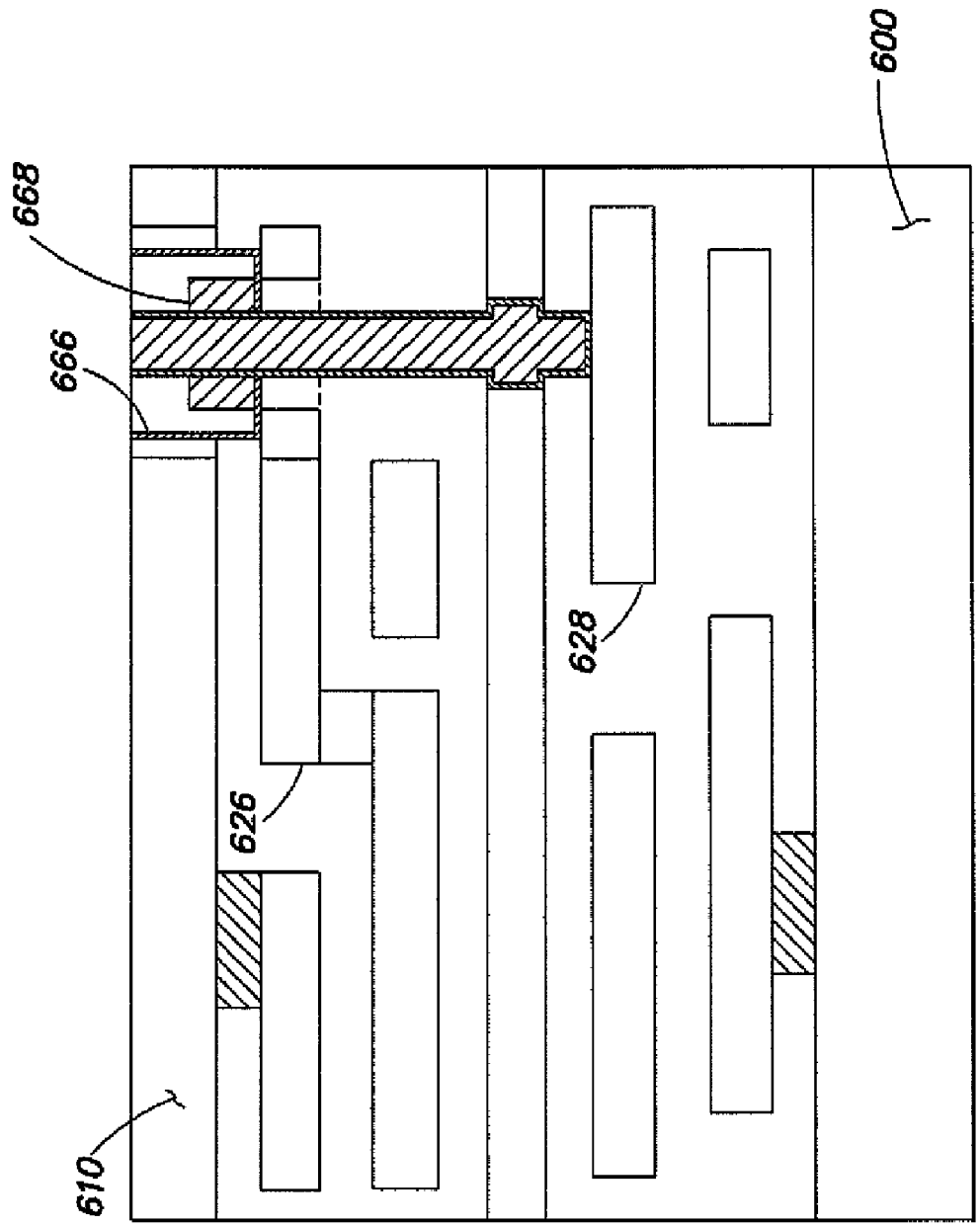
Figure 6T:
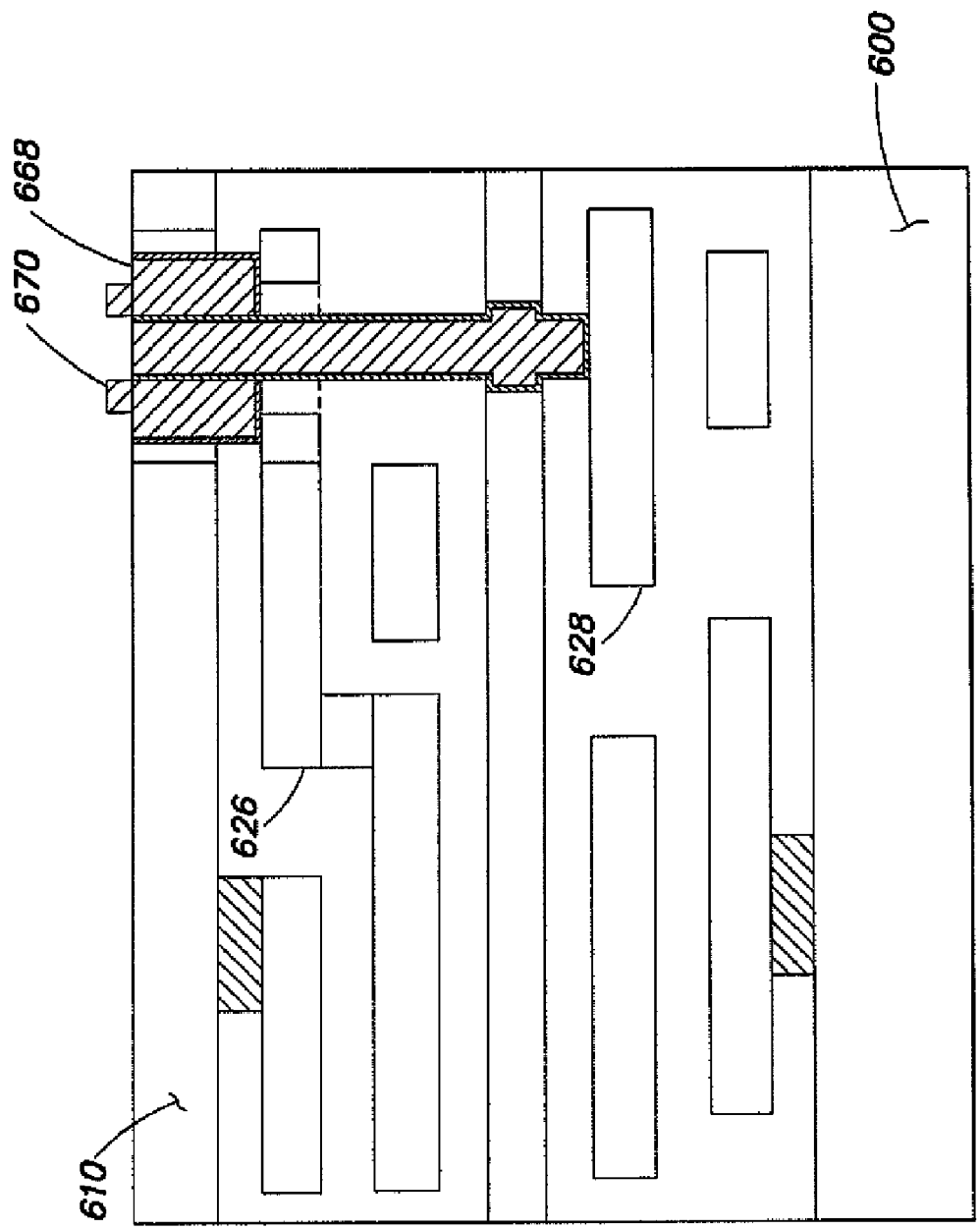
Figure 6U:
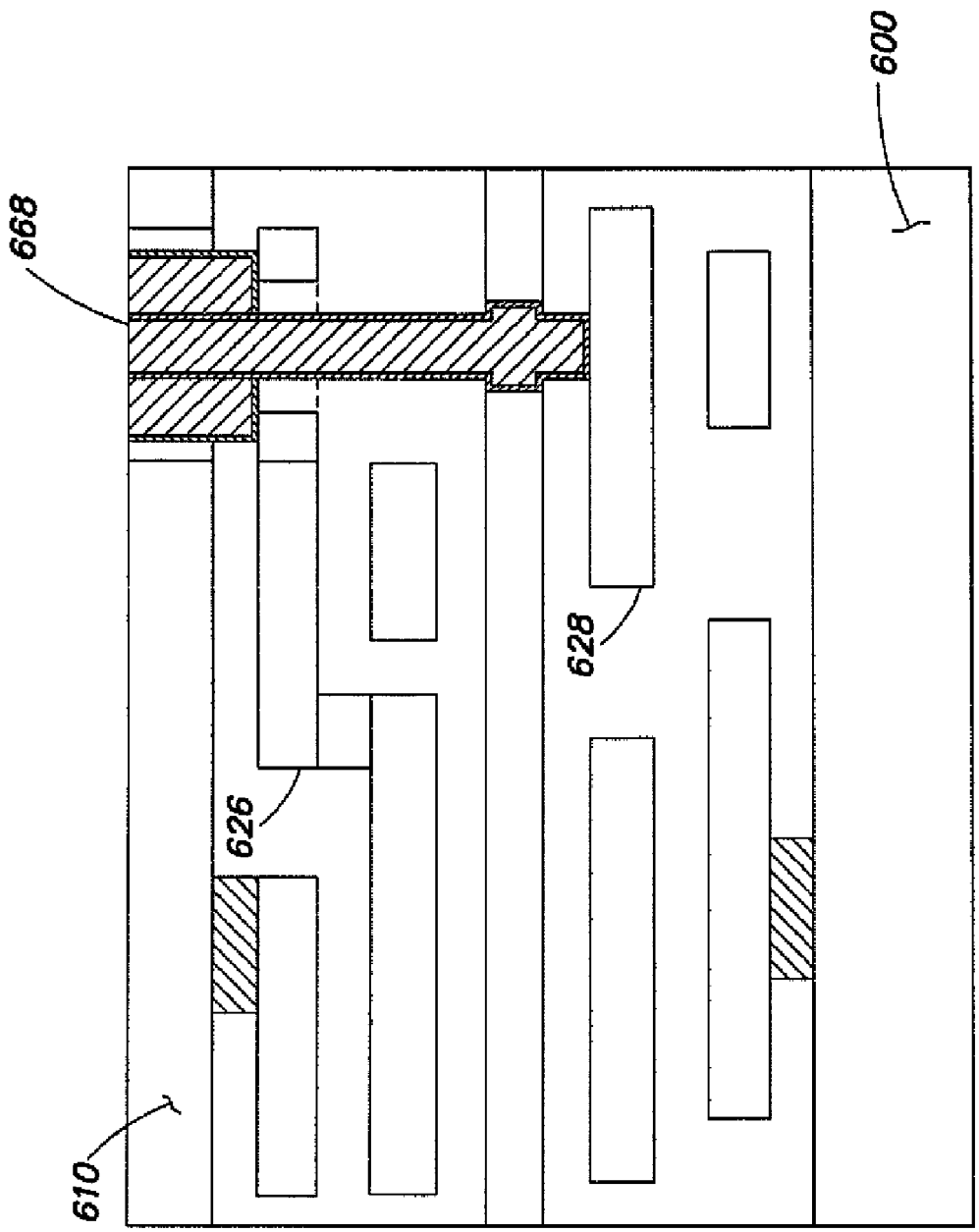

FIGS. 6A-6U illustrate a sequence for fabricating a deep pillar nail head via for connecting metal layers of chips bonded in a face-to-face configuration.

FIG. 6A illustrates a face-to-face configuration similar to that of FIG. 5C, wherein the substrate 610 has been thinned from the back surface 612. A metal shield layer 640 may be deposited on the back surface of thinned substrate 610. The metal shield layer may provide added etch resistance during the following etching of the silicon substrate 610. The metal shield layer may be formed of molybdenum, nickel, or any other suitable shield material. The chemistry of this layer preferably should be orthogonal to the etch chemistries for the other layers employed in the process, to avoid damaging these other layers when the shield layer is removed. A mask layer 639 may be formed on the metal shield layer 640. The mask layer 639, which may be photoresist, or any other suitable material, may be deposited, or formed by any suitable method. The mask layer 639 is patterned to form an etch mask for etching the metal shield layer 640.

FIG. 6B shows the metal shield layer 640 after it has been patterned and the mask layer 639 has been removed. For example, if the mask layer 639 is formed of photoresist, it may be removed by ashing. The metal shield layer may be etched using any suitable etchant, including wet etch or dry etch, as the invention is not limited in this respect. After patterning, the metal shield layer forms an etch mask for subsequent processing. The patterning includes openings such as 642.

The fabrication of the deep pillar nail head via proceeds in FIG. 6C with the etching of an opening 644 in the thinned substrate 610. It is desired to use an etch technology with a high anisotropy, which may be a wet etch or a dry etch, as the invention is not limited in this respect. For instance, $SF_6$ may be used as the etchant. As shown in FIG. 6C, the walls 643 of the opening 644 are approximately aligned with the outer edges 631 of the collet 630. While this need not be the case, good alignment of the walls 643 with the outer edges 631 of collet 630 may facilitate forming a good contact between the nail head (shown later) and the collet 630. It is desirable that the walls 643 of opening 644 not be aligned outside the outer edges 631, which might lead to the undesired formation of a tunnel outside the collet during etching.

As shown in FIG. 6D, the metal shield layer 640 is removed by any suitable method.

FIG. 6E illustrates the back-filling of opening 644 in the substrate 610. This is performed at least in part, as will be seen more clearly in FIG. 6H, to avoid forming a Schottky-barrier junction between the deep pillar via (shown later) and the substrate 610. The back-filling may include depositing or otherwise forming layer 646, which may be $SiO_2$ or any other suitable dielectric material, typically an oxide. The formation of layer 646 may be performed by chemical vapor deposition (CVD) or any other suitable deposition or selective growth process. After forming layer 646, chemical-mechanical polishing (CMP), or any other suitable planarization process, may be performed so that the upper surface of layer 646 is substantially coplanar with back surface 612 of substrate 610.

FIG. 6F illustrates the formation, next, of a metal shield layer 648 on the back surface of thinned substrate 610. The metal shield layer may provide added etch resistance during subsequent etching. The metal shield layer may be formed of molybdenum, nickel, or any other suitable shield material. The chemistry of this layer preferably should be orthogonal to the etch chemistries for the other layers employed in the process, to avoid damaging these other layers when the shield layer is removed. A mask layer 652 may be formed on the metal shield layer 648. The mask layer 652, which may be photoresist or any other suitable material, may be deposited or formed by any suitable method. The mask layer 652 is patterned to form an etch mask for etching the metal shield layer 648.

FIG. 6G shows the metal shield layer 648 after it has been patterned and the mask layer 652 has been removed. For example, if the mask layer 652 is formed of photoresist, it may be removed by ashing. The metal shield layer may be etched using any suitable etchant technology, including wet etch or dry etch technologies, as the invention is not limited in this respect. After patterning, the metal shield layer forms an etch mask for subsequent processing. The patterning includes opening 647, formed directly above collet 630. As illustrated, the walls 649 of opening 647 are disposed such that opening 647 is narrower than the width of collet 630, defined by the inner edges 629.

FIG. 6H illustrates an early stage of the formation of a tunnel 650. The tunnel 650 is formed by etching through the back-filled layer 646 and the dielectric layer 622. At this stage, the tunnel 650 extends to the bonding layer 620. Tunnel 650 may be formed by a directional etch, such as a deep reactive ion etch (DRIE), using any suitable etchant. For example, if dielectric layer 622 and back-filled layer 646 are $SiO_2$, any of the fluoro-methyl etch candidates may be used, such as $CF_4$, $CF_3H$, or $CFH_3$. These may be used with or without argon. An inductively coupled plasma (ICP) etch may also be used in addition to, or in place of, DRIE. In one embodiment, the formation of tunnel 650 is performed using the Bosch process of repeated deposition and etching steps, which may be used with DRIE or ICP.

The alignment of the tunnel 650 is such that dielectric portions 651 remain between the tunnel 650 and the collet 630. The dielectric portions 651 prevent the growth of metal between the inner edges 629 of the collet 630 when the tunnel 650 is later filled to form the deep pillar via.

As shown in FIG. 6I, the formation of tunnel 650 continues by etching bonding layer 620 using, for example, DRIE or ICP with any suitable etchant. If the bonding layer 620 is a polymeric glue layer, then oxygen may serve as the etchant, possibly enhanced by Bosch reoxidation. Depending on the composition of bonding layer 620, and the type of etch used, a lateral etch may necessarily accompany the vertical etch during this step. However, the lateral etch is not required, and the invention is not limited in this respect. It is desired to minimize the amount of lateral etching.

FIG. 6J illustrates the continued formation of tunnel 650. The dielectric layer 624 is etched using DRIE, or ICP, with an appropriate etchant. The etching may again proceed by the Bosch process. If dielectric layer 624 is $SiO_2$, then any of the fluoro-methyl etch candidates may be used, such as $CF_4$, $CF_3H$, or $CFH_3$. These may be used with or without argon. The etching proceeds to the metallization layer 628, which operates as a natural etch stop.

Depending on the materials etched thus far, and the etching methods used, there may be a layer 656 of etching by-product that forms on the bottom of the tunnel 650, as illustrated in FIG. 6K. Such a by-product layer often accompanies DRIE etch processes. The by-product layer 656 may increase via resistance, and degrade the quality of the contact between the deep pillar via (shown in later figures) and the metallization layer 628, thus degrading performance of the via as an intermetallic connection. The by-product layer 656 may be removed, such as by way of non-reactive ion etching, for example, using argon. Wet etching, noble ionized plasma etching, accelerated ion etching, or any combination of these may be used in addition to, or in place of, non-reactive ion etching.

With the tunnel 650 completed, the process proceeds with the formation of the deep pillar nail head via. As shown in FIG. 6L, a barrier layer 658 is deposited on the walls and bottom of tunnel 650. The barrier layer 658 may be W, Ti, Ta, TiN, TaN or any other suitable material, and is used to prevent diffusion of the later-deposited pillar material into the surrounding dielectric layers 622 and 624, and the bonding layer 620. The barrier layer 658 may be deposited by a highly conformal CVD process, or by atomic layer deposition, and thus may be very thin.

In preparation for filling the tunnel 650 with copper, the pillar material in this embodiment, a copper seed layer 657, shown in FIG. 6L, is deposited on the bottom of the tunnel 650 after the barrier layer 658 has been deposited. The seed layer may aggregate by gravity or capillary force, as the invention is not limited in this respect. It is desirable to deposit the seed layer 657 on the bottom of tunnel 650 to encourage the bottom-up filling of the tunnel with copper.

The metal shield layer 648 may be removed from the back surface 612 of substrate 610 by any suitable method.

The process proceeds in FIGS. 6M-6O with the plating of copper 660 from the bottom of tunnel 650, from the copper seed layer 657, upward. It is preferable to fill the tunnel with copper vertically, since lateral growth of copper within the tunnel may lead to the formation of voids, and thus increased via resistance and decreased performance. For this reason the seed layer is used. The copper may be plated by liquid processes or CVD, as the invention is not limited in this respect.

As shown in FIG. 6N, the plating of copper 660 proceeds to approximately the top of bonding layer 620.

As shown in FIG. 6O, the copper 660 is plated to approximately the top of tunnel 650.

As mentioned previously in connection with FIG. 6H, the dielectric portions 651 prevent the growth of copper between the inner edges 629 of the collet 630, which might otherwise occur if the dielectric portions 651 were not present. Such growth would potentially choke off the filling of the tunnel, thus leaving a void.

In FIG. 6P, the tunnel 650 is filled with copper 660 extending to a height approximately planar with the back surface 612 of substrate 610. A metal shield layer 662 then is formed on the back surface of thinned substrate 610. The metal shield layer may provide added etch resistance during subsequent etching. A mask layer 661 may be formed on the metal shield layer 662. The mask layer 661, which may be photoresist or any other suitable material, may be deposited, or formed by any suitable method. The mask layer 661 is patterned to form an etch mask for etching the metal shield layer 662.

FIG. 6Q shows the metal shield layer 662 after it has been patterned and the mask layer 661 has been removed. For example, if the mask layer 661 is formed of photoresist, it may be removed by ashing. The metal shield layer may be etched using any suitable etchant, including wet etch or dry etch, as the invention is not limited in this respect. After patterning, the metal shield layer forms an etch mask for subsequent processing. The patterning includes openings such as 663. In the illustrated embodiment, the walls 671 of opening 663 are aligned over the collet 630.

As illustrated in FIG. 6R, a trench 664 is etched through layer 646 (fully or partially removing layer 646 and a portion of dielectric layer 622, such that the bottom of the trench 664 coincides with the upper surface 665 of the collet 630). A cleaning step may be performed to remove any detritus which may form on the upper surface 665 of the collet 630 during the etching of trench 664.

As illustrated in FIG. 6S, a barrier layer 666 may be deposited in trench 664 to prevent diffusion of copper into the surrounding layers. Metal shield layer 662 may also be removed at this time by any suitable method. The copper is subsequently plated or deposited to form the nail head 668, an early stage of which is shown. The barrier layer 666 may be of the same material as barrier layer 658.

As illustrated in FIG. 6T, the filling of copper for the nail head 668 may proceed in a non-uniform manner, leaving excess copper 670. The excess copper 670 may be removed by any suitable processing, for example, CMP, as shown in FIG. 6U. The top surface of nail head 668 is thus approximately level with back surface 612 of substrate 610, and is accessible for forming external contacts.

Process Sequence 2

FIGS. 7A-7J illustrate a sequence for fabricating a deep pillar nail head via for connecting metal layers of chips bonded in a face-to-face configuration. This sequence is similar to that of Process Sequence 1 up through FIG. 6N. However, the processes differ from that point on, as now described.

Figure 7A:
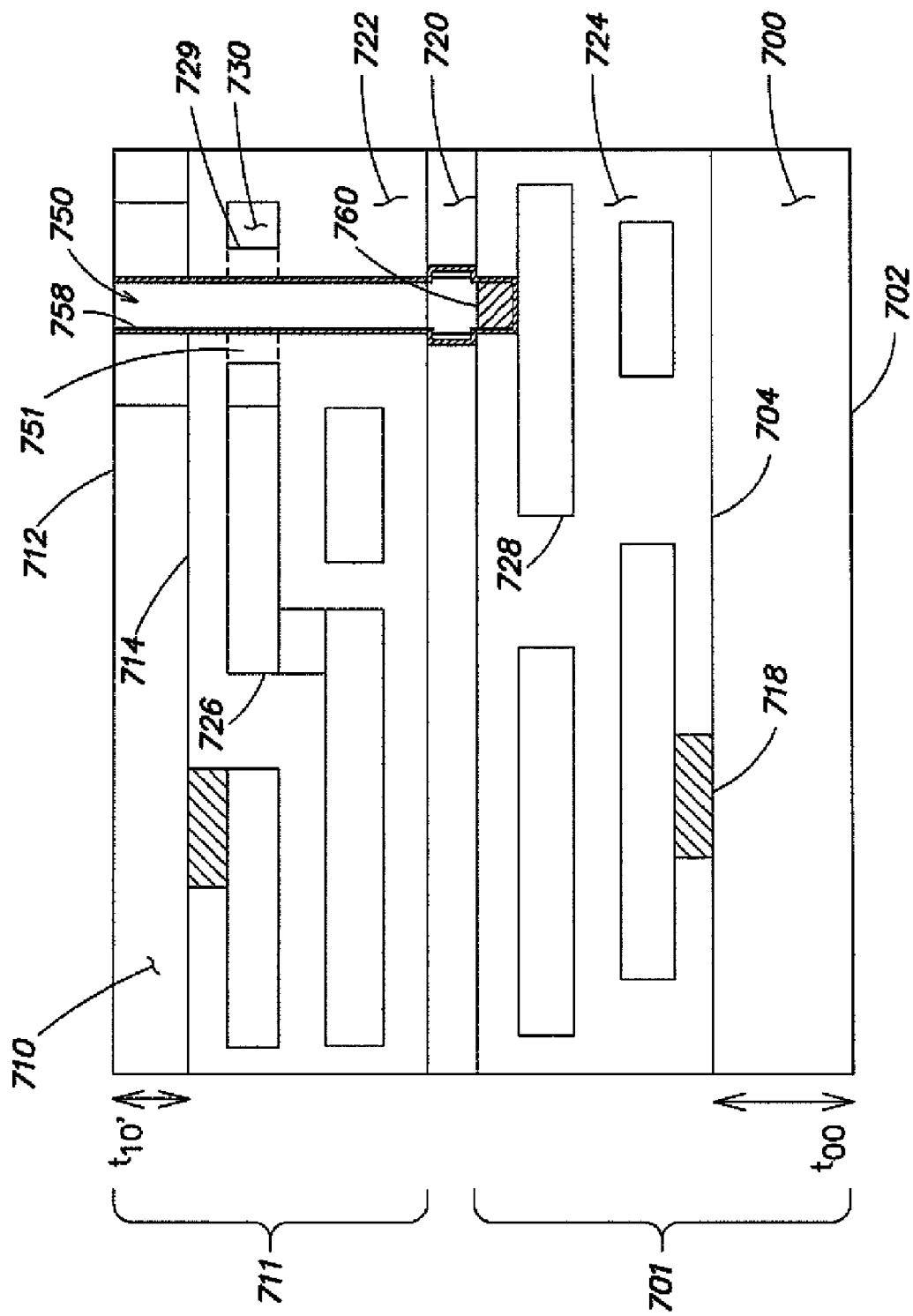
Figure 7B:
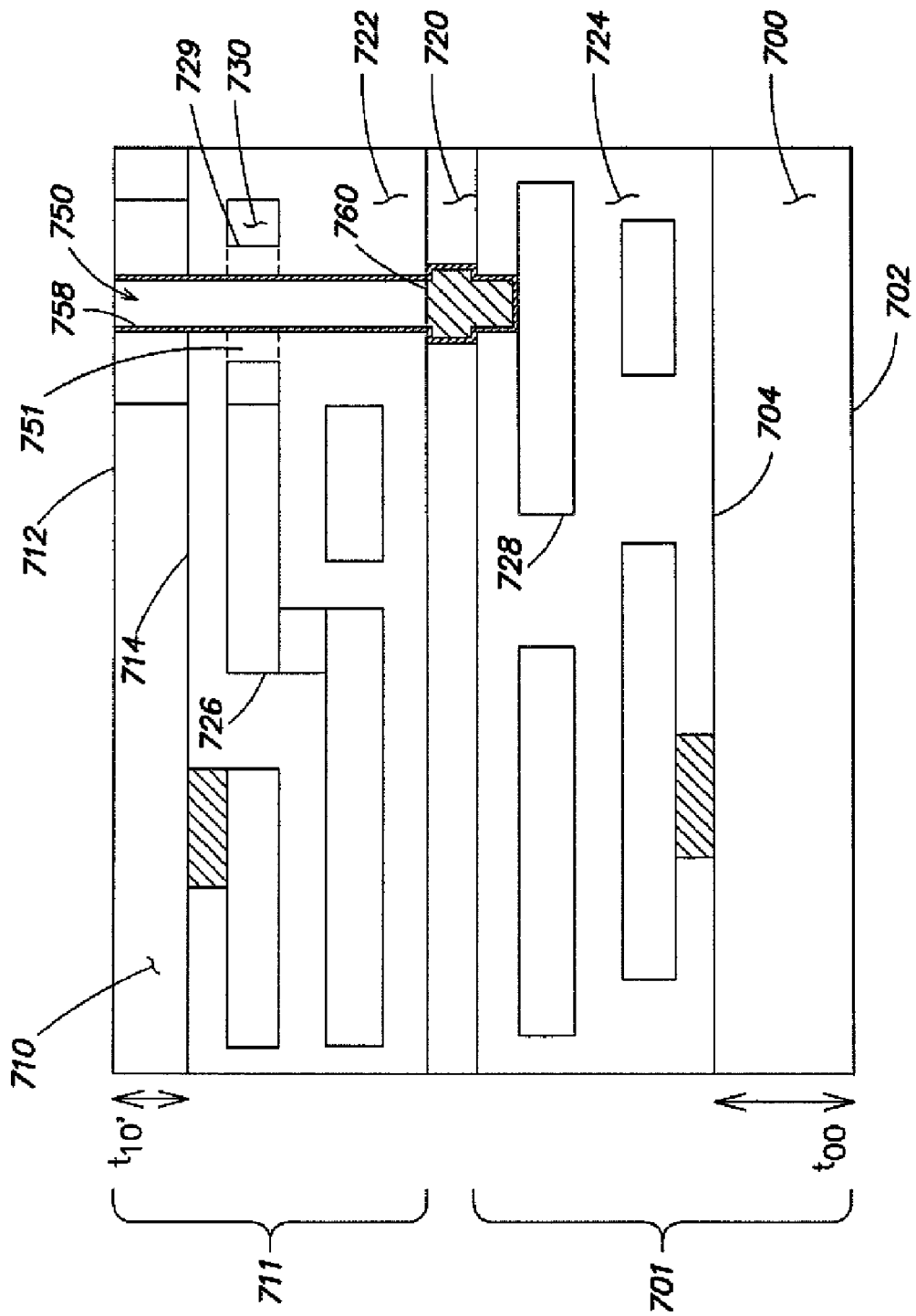
Figure 7C:
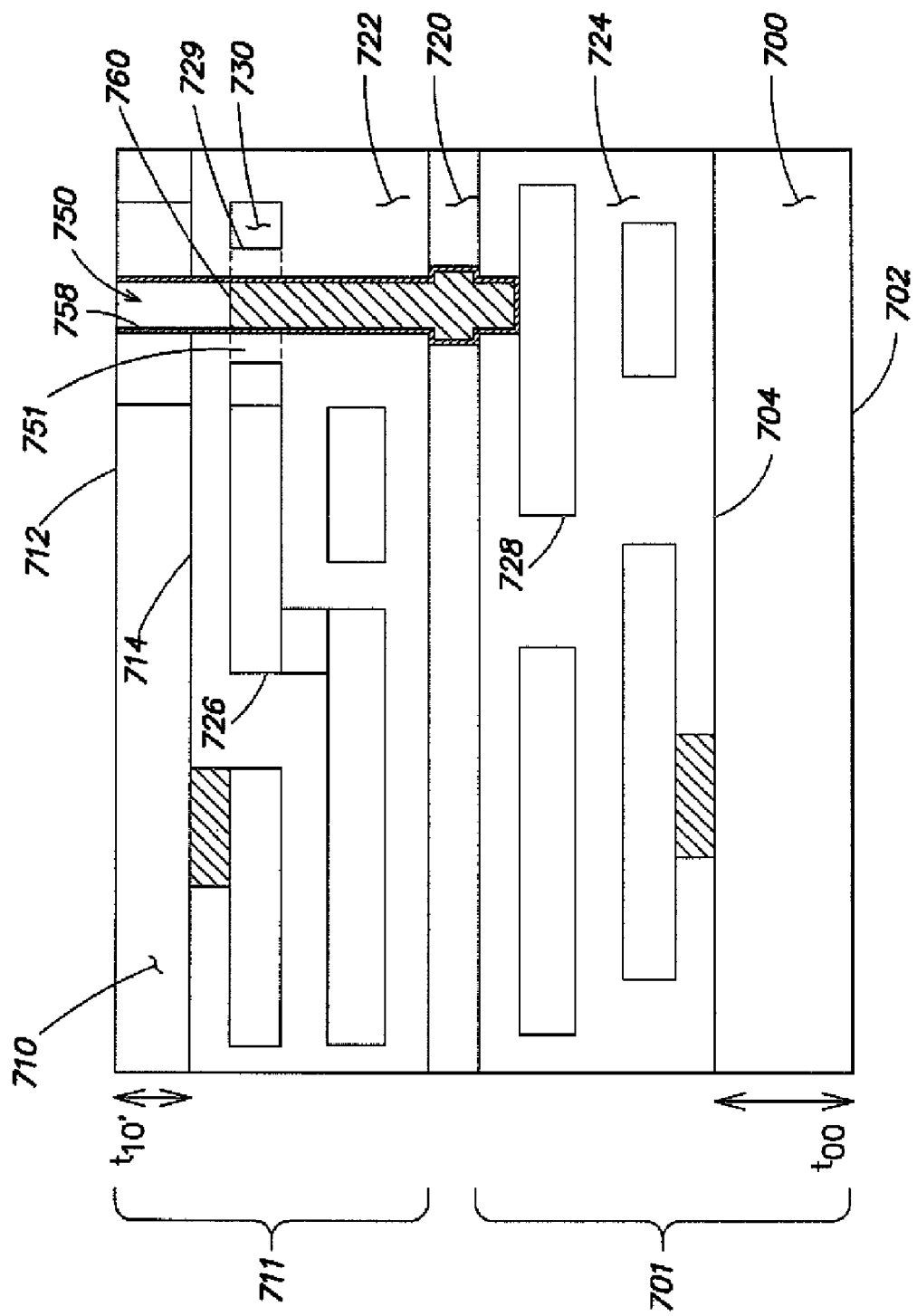

For simplicity, the steps corresponding to those of FIGS. 6A-6L are omitted, and the sequence starts with FIG. 7A, which shows the start of the copper plating, from the bottom of tunnel 750 upward, and corresponds to FIG. 6M. The process proceeds in FIGS. 7A-7C with the plating of copper 760 from the bottom of tunnel 750, from a copper seed layer (not shown), upward. It is preferable to fill the tunnel with copper vertically, since lateral growth of copper within the tunnel may lead to the formation of voids, and thus increased via resistance and decreased performance. For this reason the seed layer is used. The copper may be plated by liquid processes or CVD, as the invention is not limited in this respect.

As mentioned previously in connection with Process Sequence 1, the dielectric portions 751 prevent the growth of copper between the inner edges 729 of the collet 730, which might otherwise occur if the dielectric portions 751 were not present. Such growth would potentially choke off the filling of the tunnel, thus leaving a void.

Figure 7D:
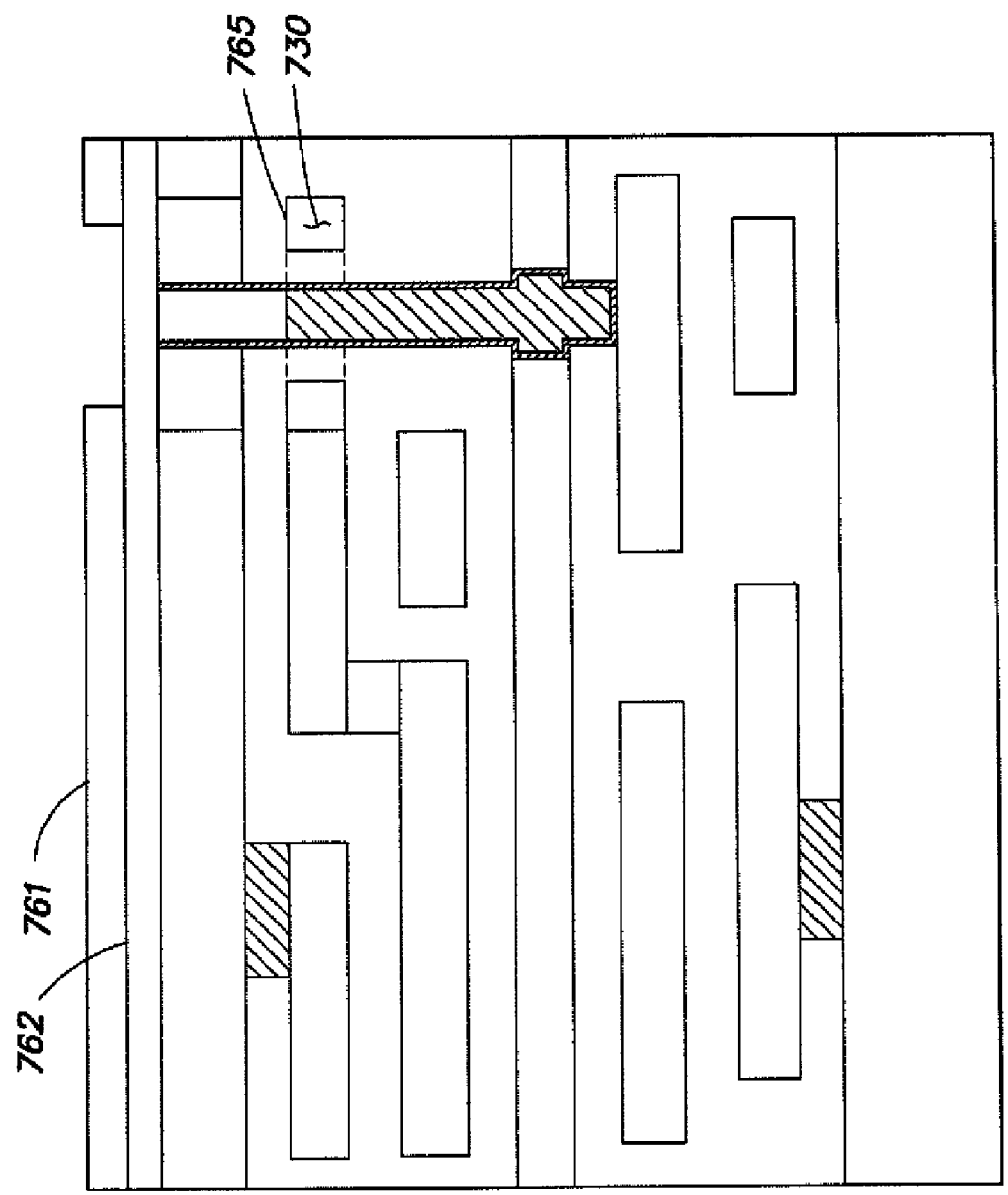

In FIG. 7D, the tunnel 750 is filled with copper 760 extending to a height approximately planar with the upper surface of 765 of collet 730. A metal shield layer 762 then may be formed on the back surface of thinned substrate 710. The metal shield layer may be formed of molybdenum, nickel, or any other suitable shield material. The chemistry of this layer should preferably be orthogonal to the etch chemistries for the other layers employed in the process, to avoid damaging these other layers when the shield layer is removed. A mask layer 761 may be formed on the metal shield layer 762. The mask layer 761, which may be photoresist or any other suitable material, may be deposited or formed by any suitable method. The mask layer 761 is patterned to form an etch mask for etching the metal shield layer 762. Due to the opening of tunnel 750, some of the metal shield layer 762 and mask layer 761 may need to be cleaned from the tunnel with additional processing. Whether or not additional steps are needed for this reason may depend on the dimensions of the tunnel.

Figure 7E:
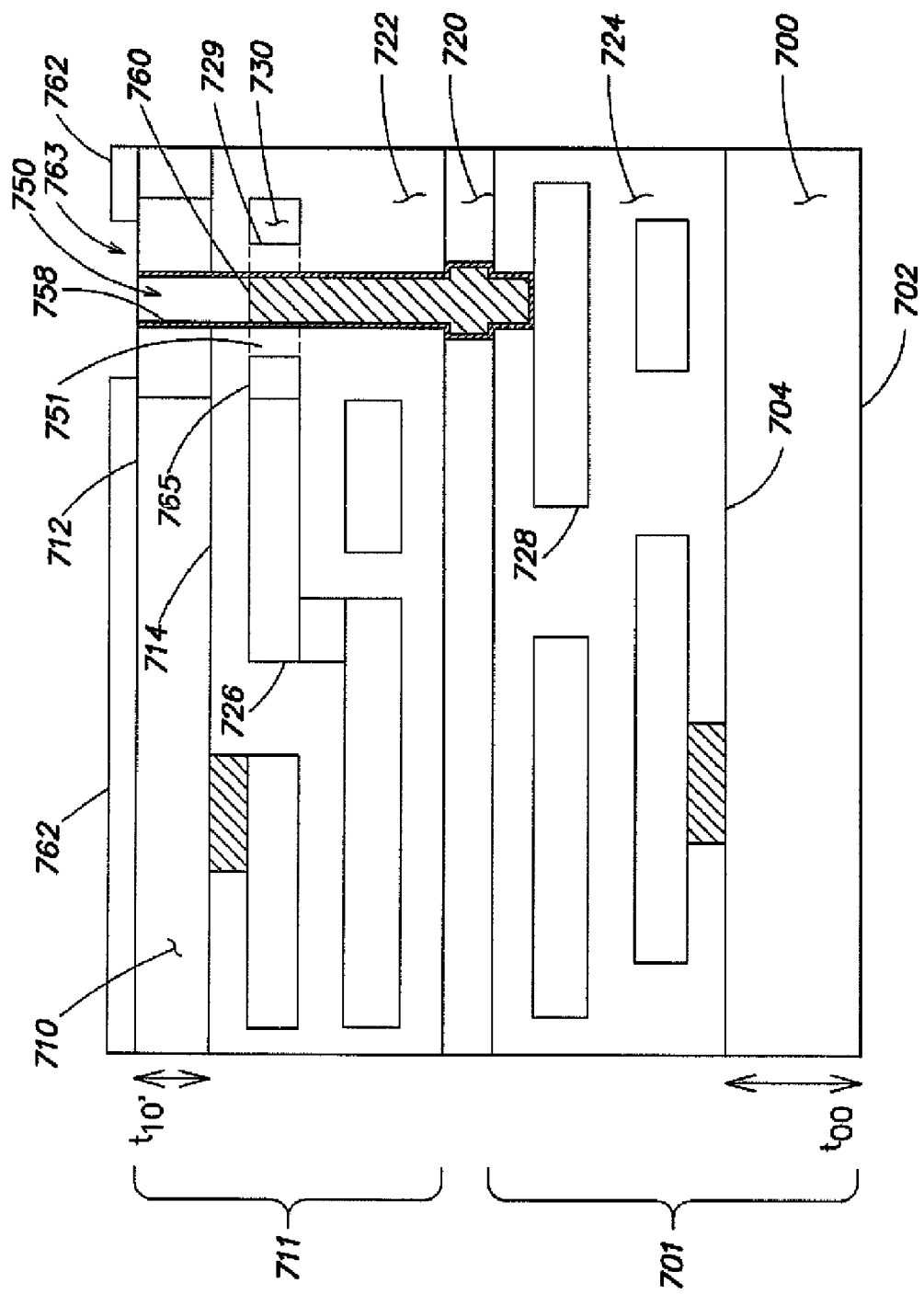

FIG. 7E shows the metal shield layer 762 after it has been patterned and the mask layer 761 has been removed. For example, if the mask layer 761 is formed of photoresist, it may be removed by ashing. The metal shield layer may be etched using any suitable etchant, including wet etch or dry etch, as the invention is not limited in this respect. After patterning, the metal shield layer forms an etch mask for subsequent processing. The patterning includes opening 763, formed above collet 730.

Figure 7F:
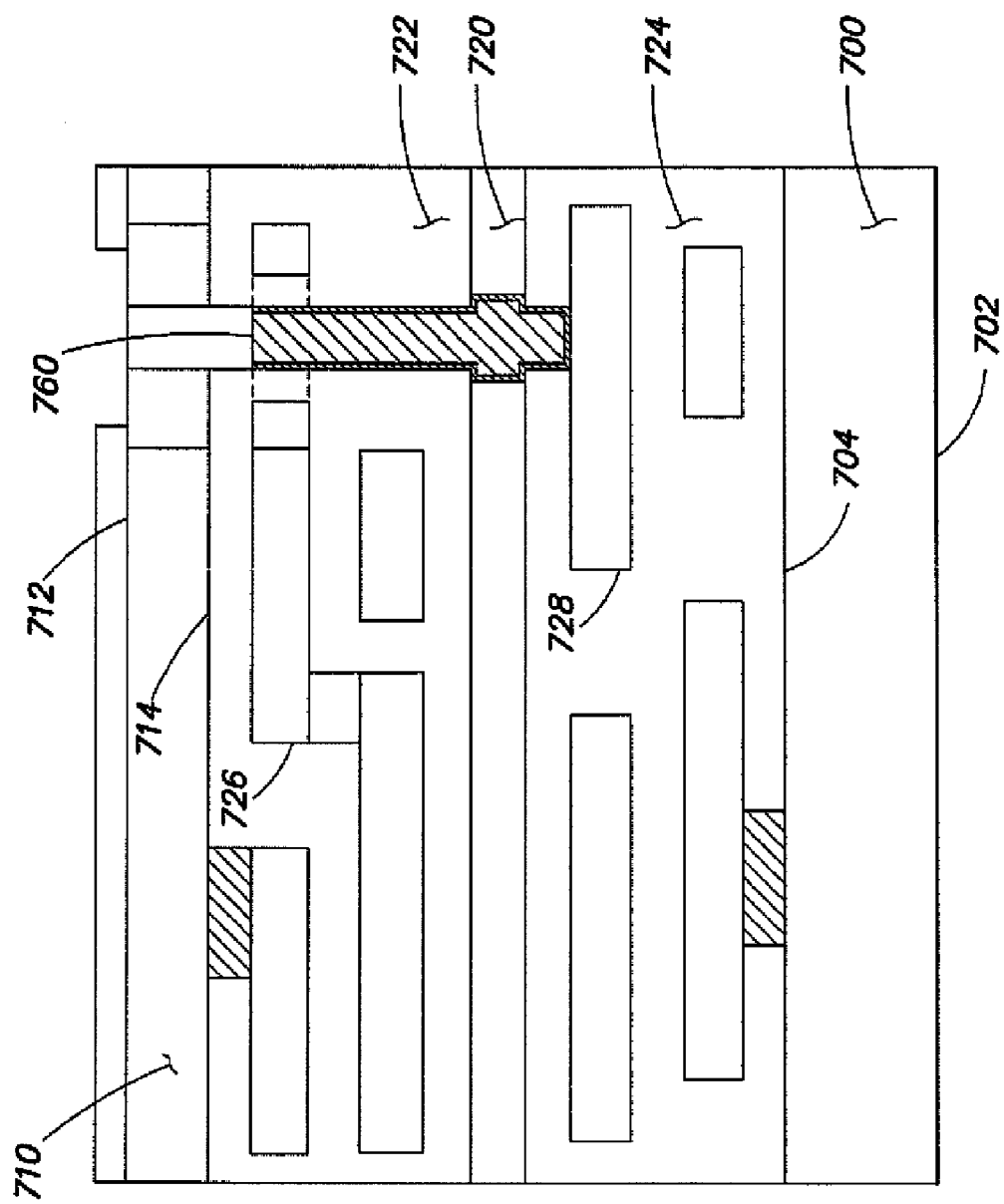

As illustrated in FIG. 7F, the barrier layer 758 is stripped from the walls of tunnel 750, from the upper surface of copper 760 to a height substantially planar with the back surface 712 of substrate 710. This is done in preparation of etching a trench for the formation of the nail head. The barrier layer may be stripped by any suitable method, as would be known to those of skill in the art.

Figure 7G:
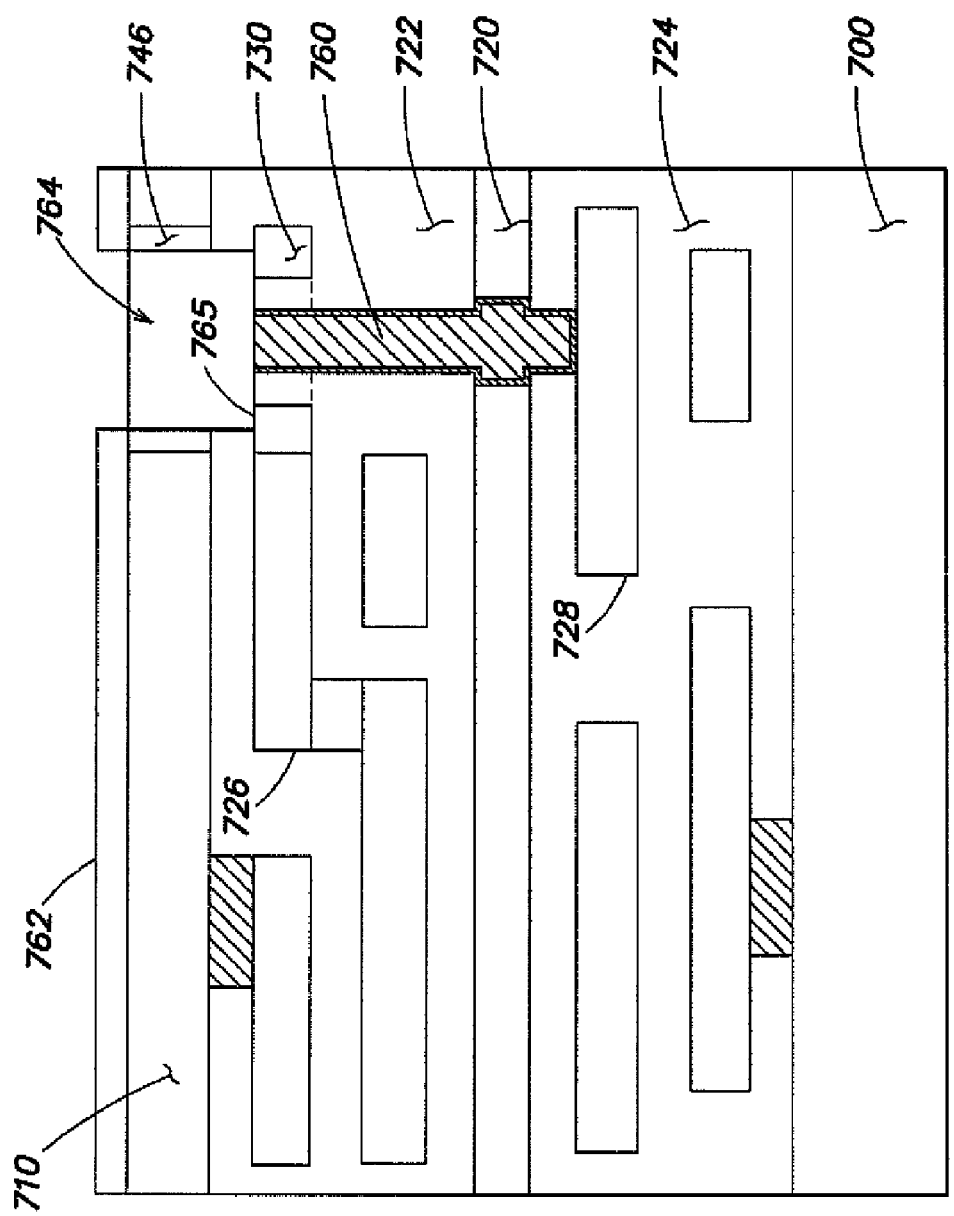

As illustrated in FIG. 7G, a trench 764 is etched through layer 746 and a portion of dielectric layer 722, such that the bottom of the trench 764 is planar with the upper surface 765 of the collet 730. The etch may be a wet etch or a dry etch, as the invention is not limited in this respect. It is preferable to use a highly anisotropic etch. A cleaning step may be performed to remove any detritus which may form on the upper surface 765 of the collet 730 during the etching of trench 764.

Figure 7H:
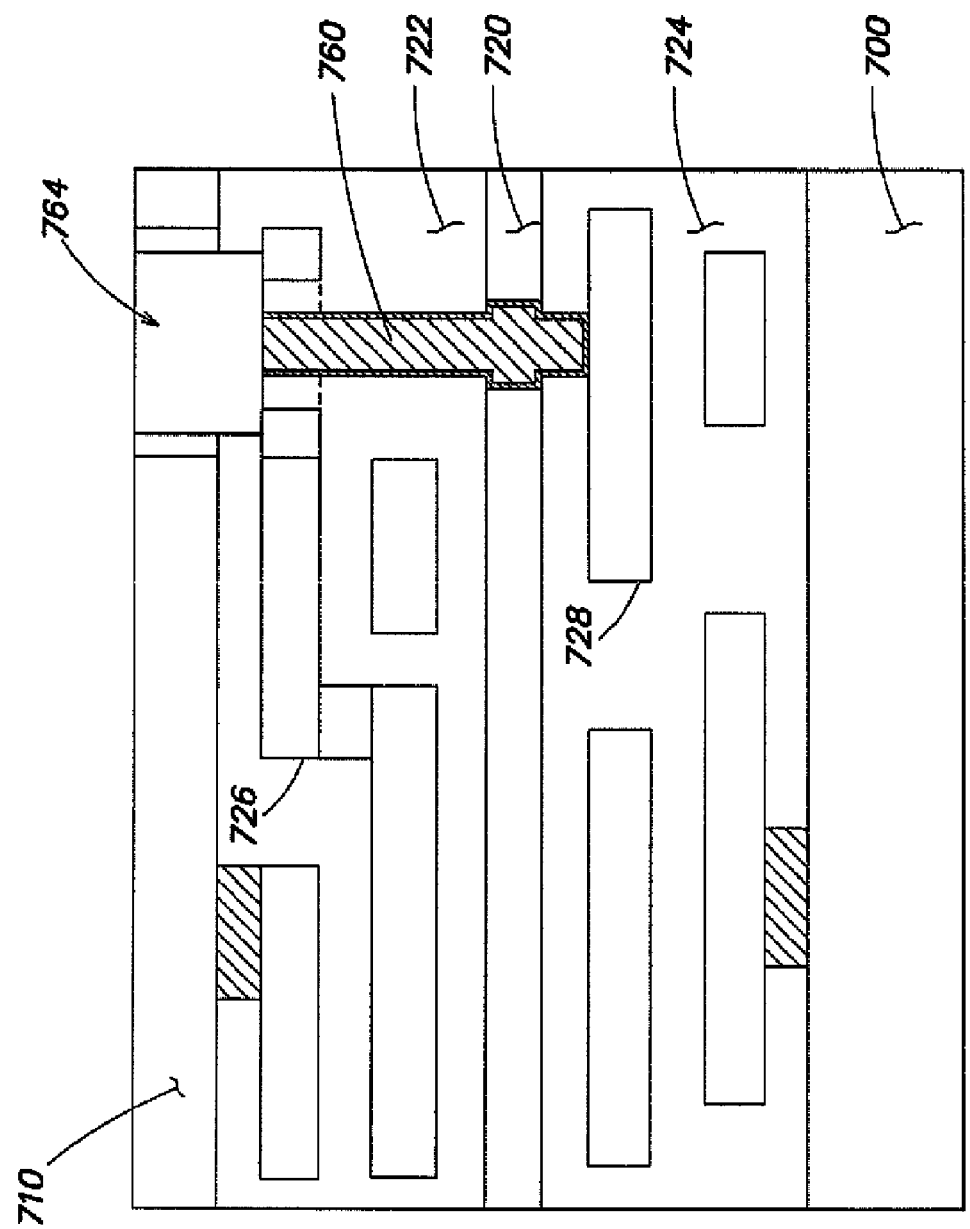
Figure 71:
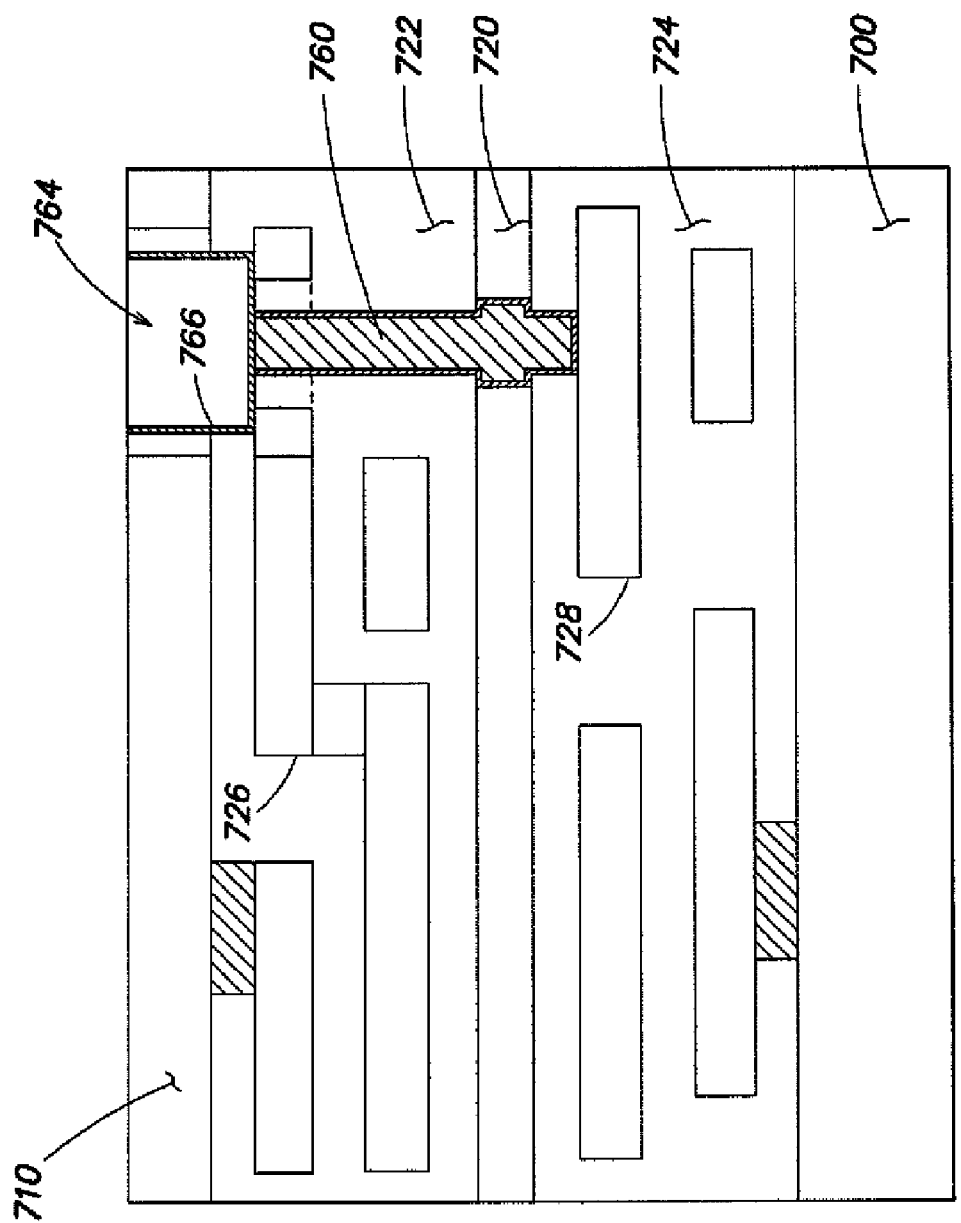

As illustrated in FIG. 7H, the metal shield layer 762 is removed from the back surface 712 of substrate 710 by any suitable method, as the invention is not limited in this respect.

Figure 7J:
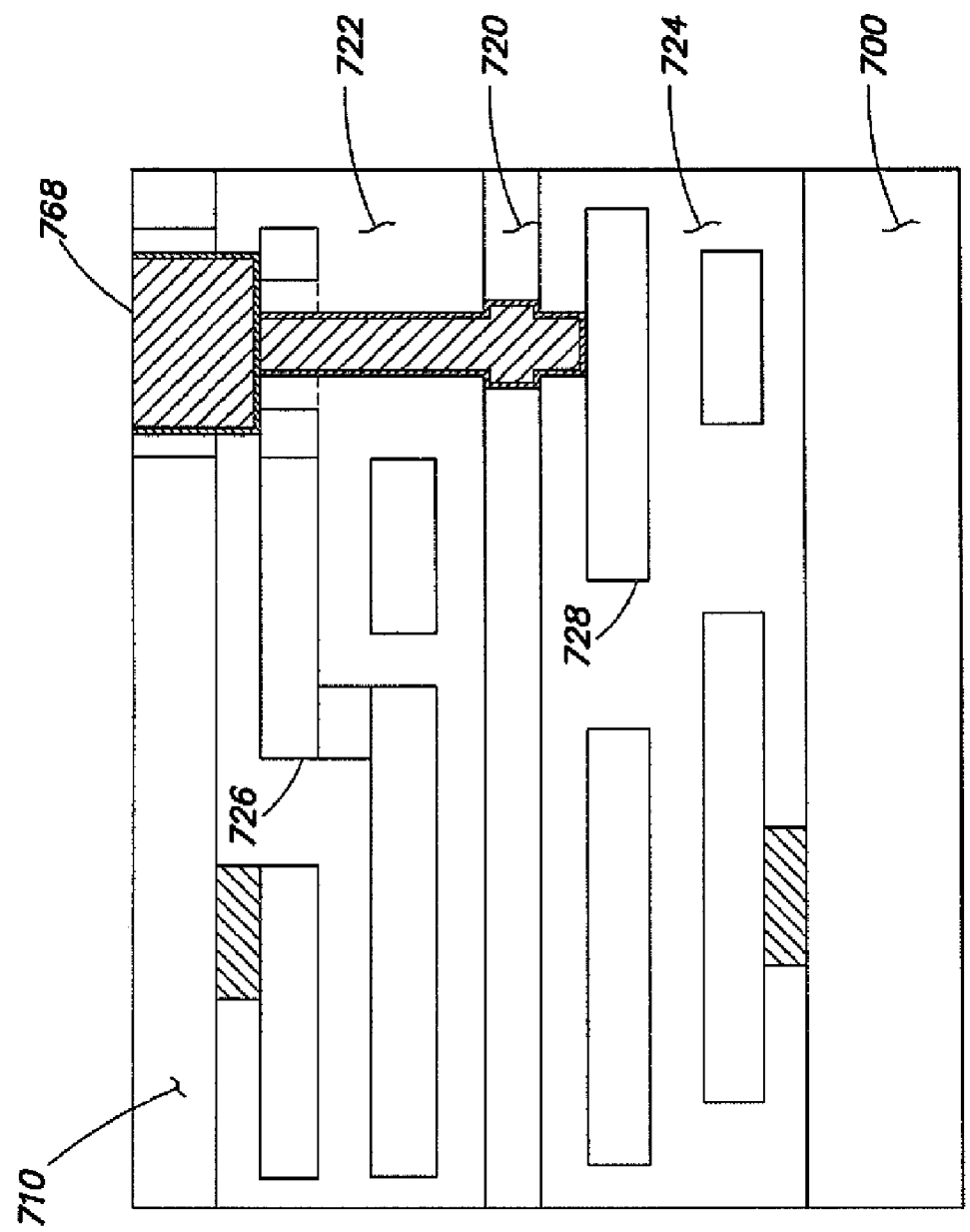

As shown in FIG. 7I, a barrier layer 766 may be deposited in trench 764 to prevent diffusion of copper into the surrounding layers. The barrier layer 766 may be of the same material as barrier layer 758, or any other suitable barrier layer material. copper is subsequently plated or evaporated in the trench 764 to form the nail head 768, as shown in FIG. 7J, so that the top surface of nail head 768 is approximately level with back surface 712 of substrate 710, and is accessible for forming external contacts. If necessary, the top surface of nail head 768 may be planarized by CMP, or any other suitable planarization process.

Process Sequence 3

FIGS. 5A-8N illustrate another sequence for manufacturing a deep pillar nail head via for connecting metal layers of chips bonded in a face-to-face configuration. The sequence proceeds in similar fashion to Process Sequence 1 and Process Sequence 2 up through FIG. 6E. The processing from that point on is now described.

Figure 8A:
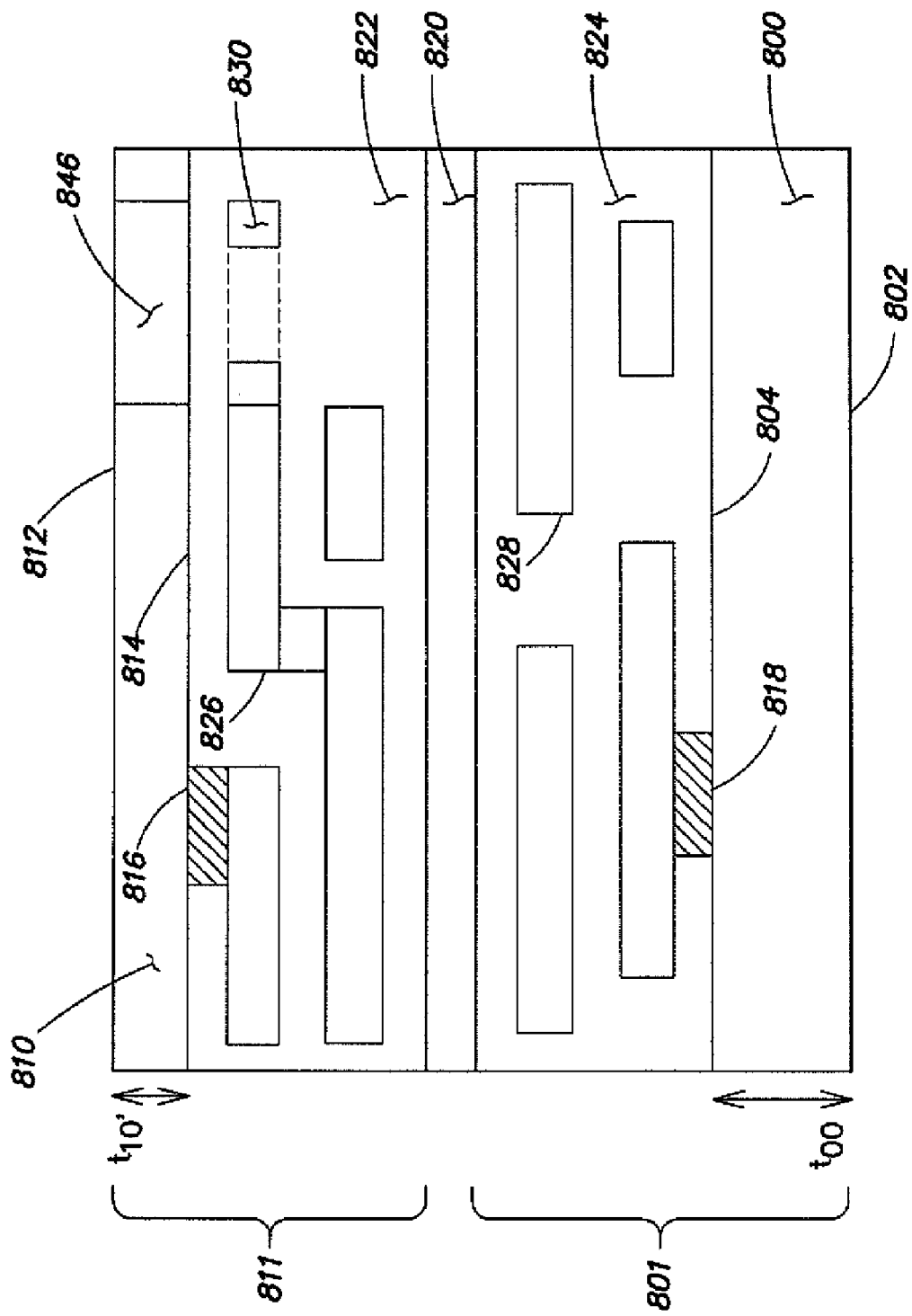
FIGS. 8A-8N are diagrammatic cross-sectional illustrations of another process of fabricating a two-chip structure with a deep pillar nail head via in accordance with an aspect of the present invention.

For simplicity the discussion will start with FIG. 8A, which corresponds to FIG. 6E. FIG. 8A illustrates the back-filling of opening 844 in the substrate 810. This is performed at least in part, as will be seen more clearly in FIG. 8D, to avoid forming a Schottky barrier junction between the deep pillar via (shown later) and the substrate 810. The back-filling may include depositing layer 846, which may be $SiO_2$ or any other suitable material. The deposition of layer 846 may be performed by chemical vapor deposition (CVD) or any other suitable deposition or selective growth process. After forming layer 846, chemical-mechanical polishing (CMP), or any other suitable planarization process, may be performed so that the upper surface of layer 846 is substantially coplanar with back surface 812 of substrate 810.

Figure 8B:
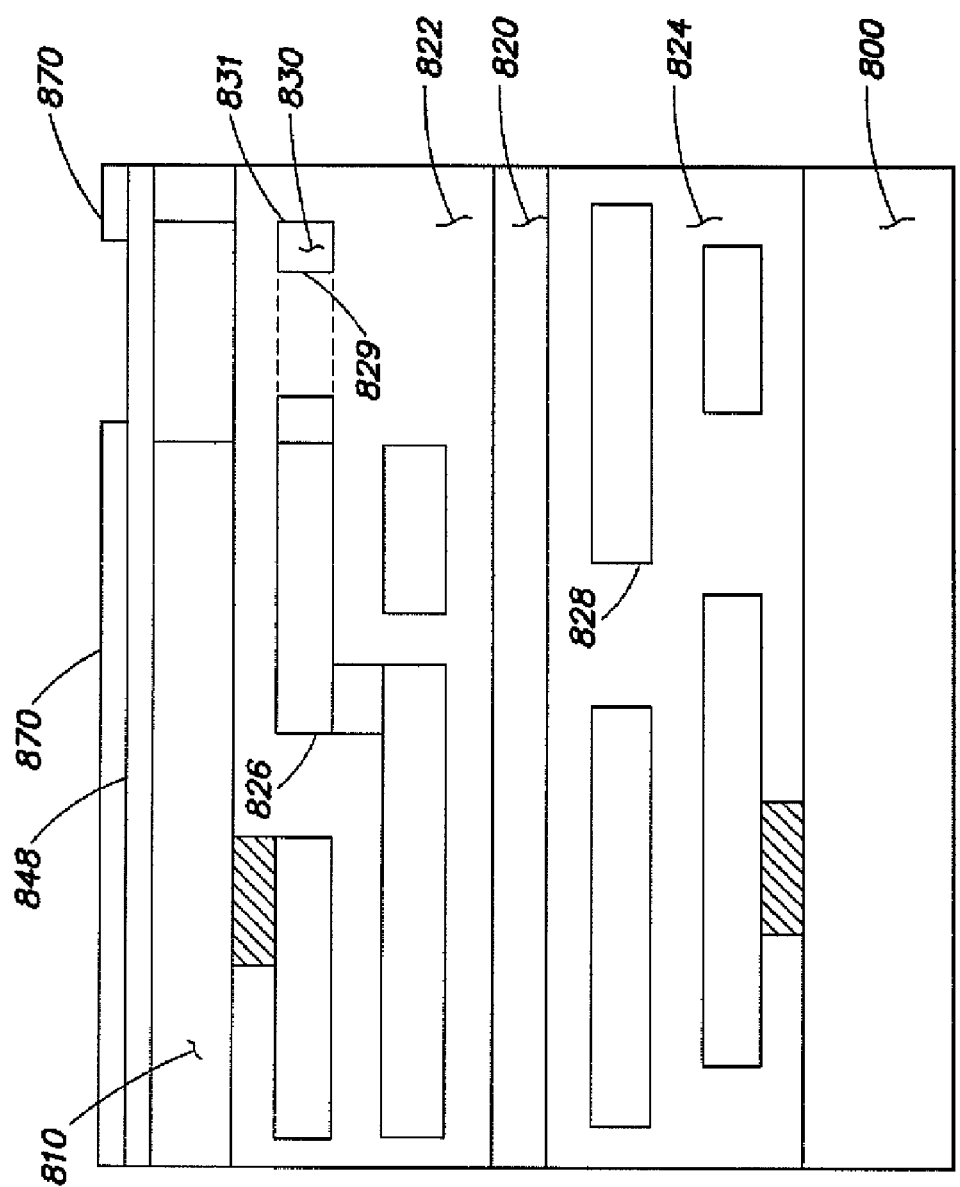

FIG. 8B illustrates the formation of metal shield layer 848 on back surface 812 of substrate 810. The metal shield layer may provide added etch resistance during subsequent etching. The metal shield layer may be formed of molybdenum, nickel, or any other suitable shield material. The chemistry of this layer should preferably be orthogonal to the etch chemistries for the other layers employed in the process, to avoid damaging these other layers when the shield layer is removed. A mask layer 870 may be formed on the metal shield layer 848. The mask layer 870, which may be photoresist, or any other suitable material, may be deposited, or formed by any suitable method. The mask layer 870 is patterned to form an etch mask for etching the metal shield layer 848.

Figure 8C:
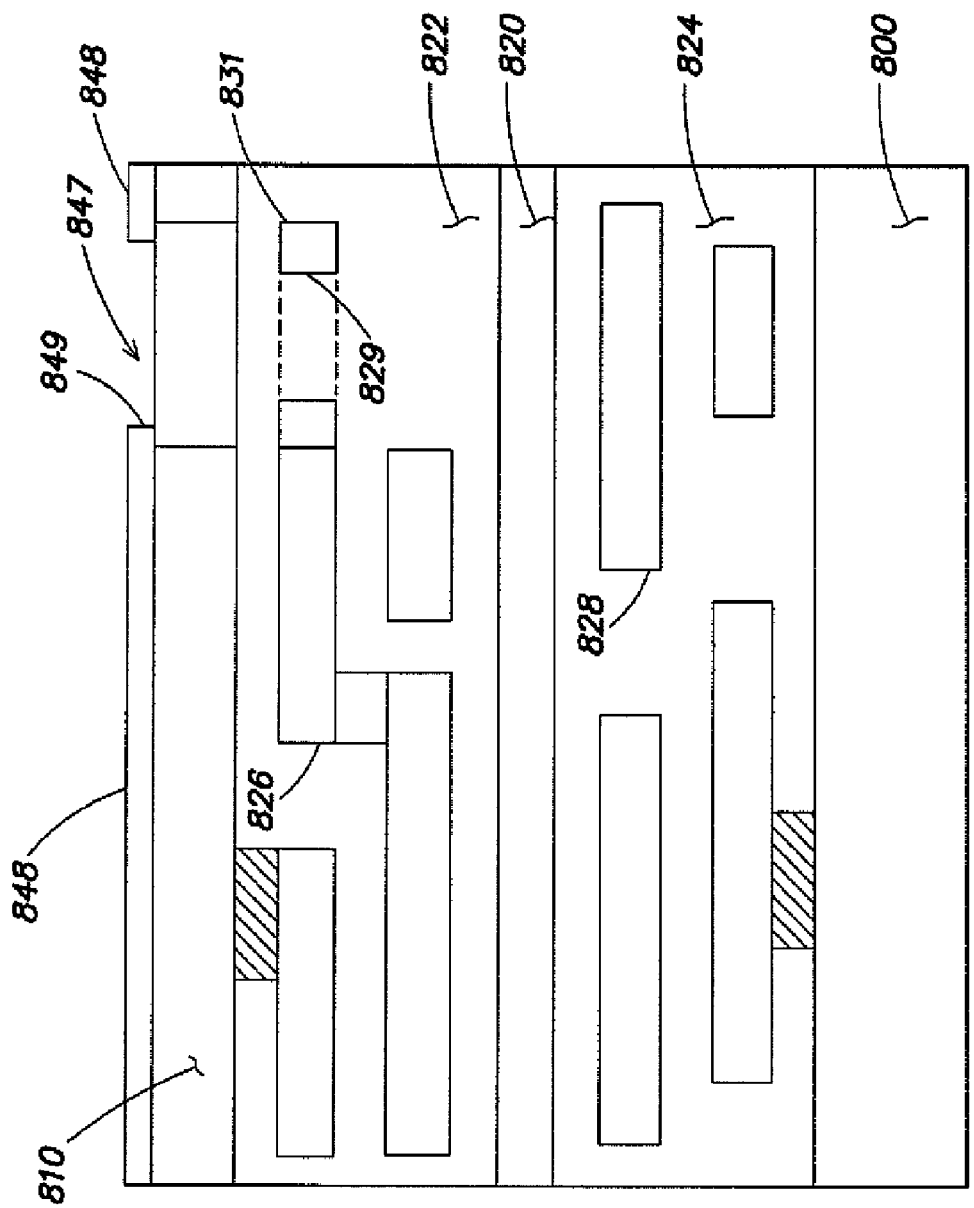

FIG. 8C shows the metal shield layer 848 after it has been patterned and the mask layer 870 has been removed. For example, if the mask layer 870 is formed of photoresist, it may be removed by ashing. The metal shield layer may be etched using any suitable etchant, including wet etch or dry etch, as the invention is not limited in this respect. After patterning, the metal shield layer forms an etch mask for subsequent processing. The patterning includes openings such as 847. The walls 849 of opening 847 in metal shield layer 848 are aligned between the inner edges 829 and the outer edges 831 of the collet 830, so that the later formation of the nail head will make good contact with the collet.

Figure 8D:
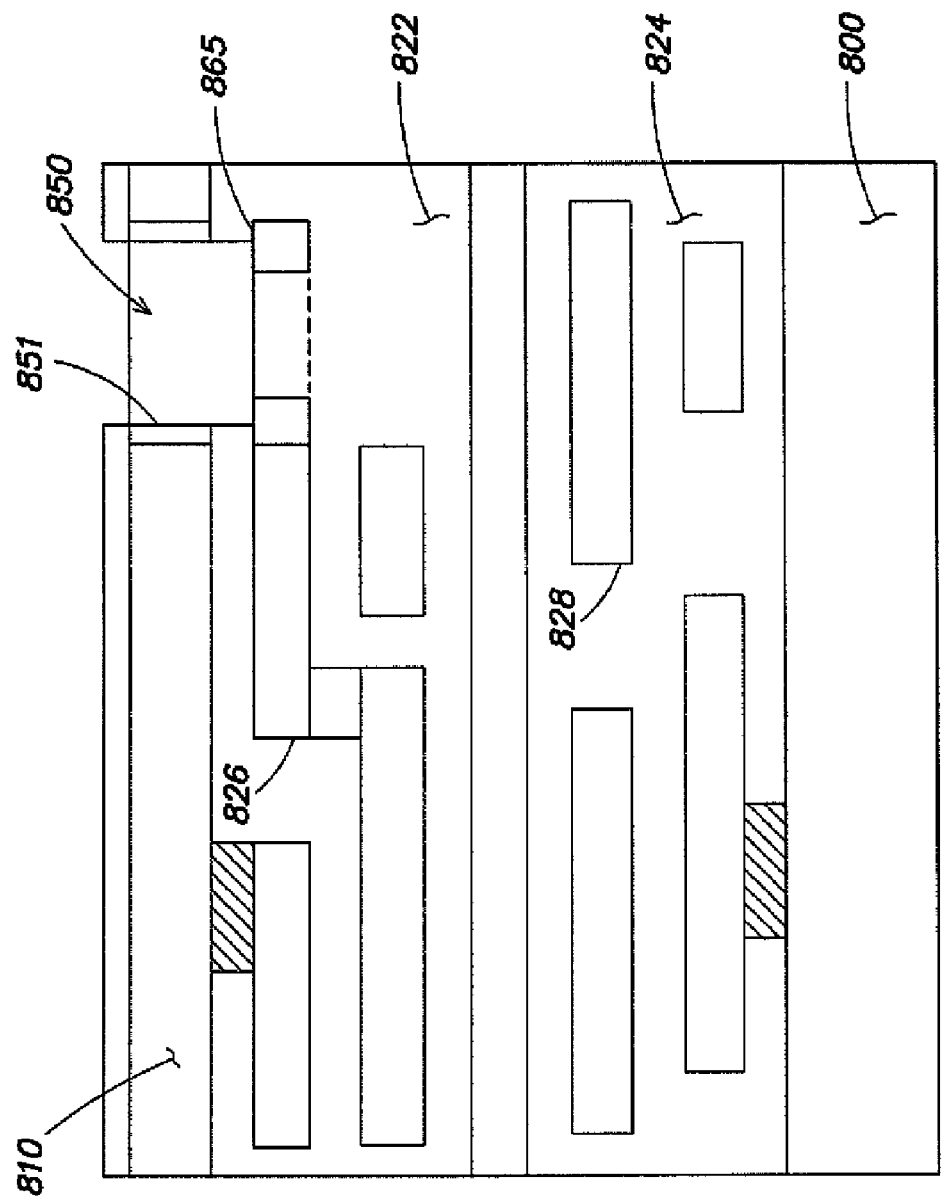

FIG. 8D illustrates the formation of a hole 850 in the back-filled layer 846 and the dielectric layer 822. Again, the walls 851 of the hole 850 are aligned between the inner and outer edges of collet 830. Alternatively, the walls 851 may be aligned with the inner or outer edges of collet 830. The bottom of the hole 850 coincides with the upper surface 865 of the collet 830. Hole 850 may be formed by a wet etch or dry etch, using any suitable etchant, as the invention is not limited in this respect. It is desirable to use a highly anisotropic etch.

Figure 8E:
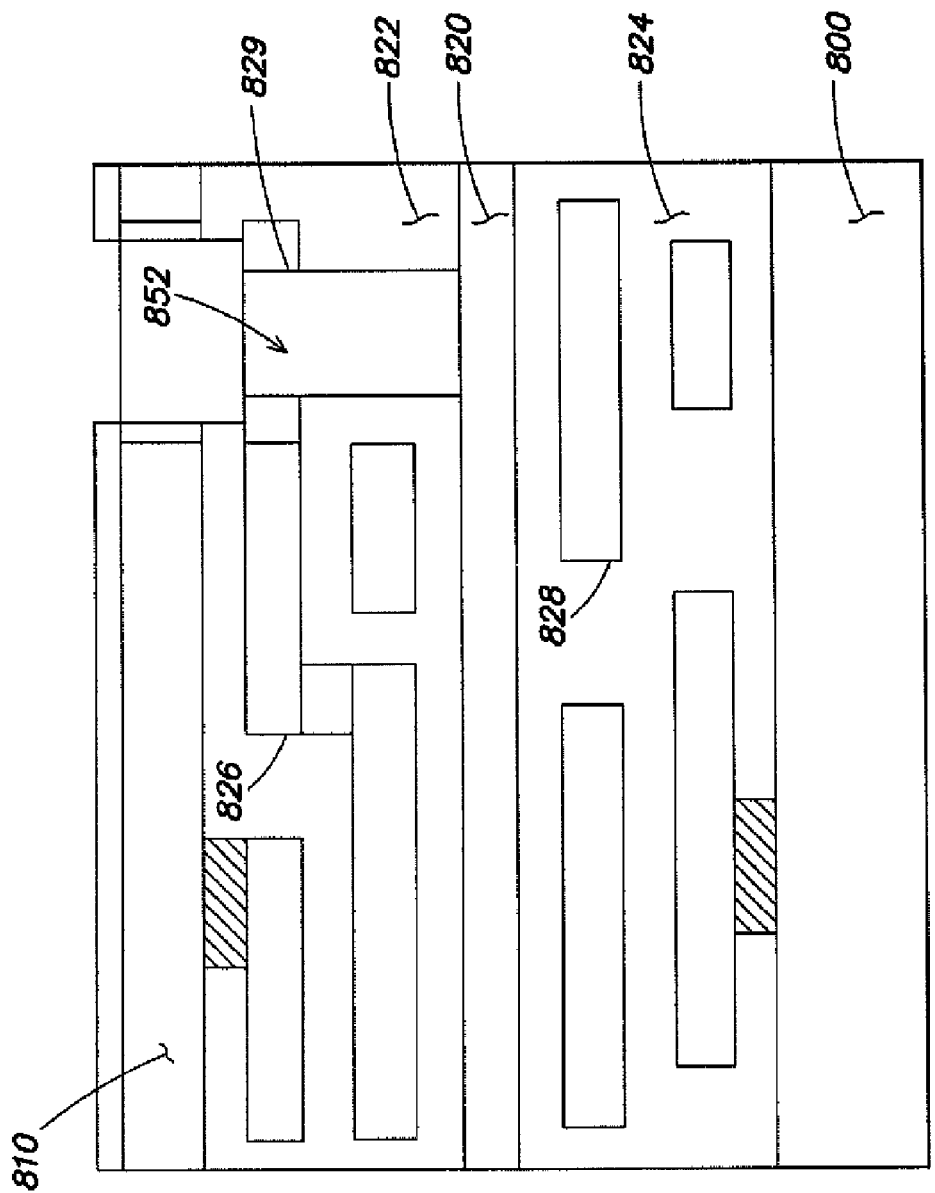

FIG. 8E illustrates an early stage of the formation of tunnel 852, which is aligned with the inside edges 829 of collet 830. At this stage the bottom of tunnel 852 extends to the bonding layer 820. Thus, the collet may act as a self-mask for the formation of tunnel 852. In this embodiment, then, the collet may serve the double function of an etch mask as well as a contact for the deep pillar nail head via. The etching of tunnel 852 may be performed by DRIE, ICP, or any other suitable highly directional etch. According to certain embodiments, the formation of tunnel 852 is performed using the Bosch process of repeated deposition and etching steps.

Figure 8F:
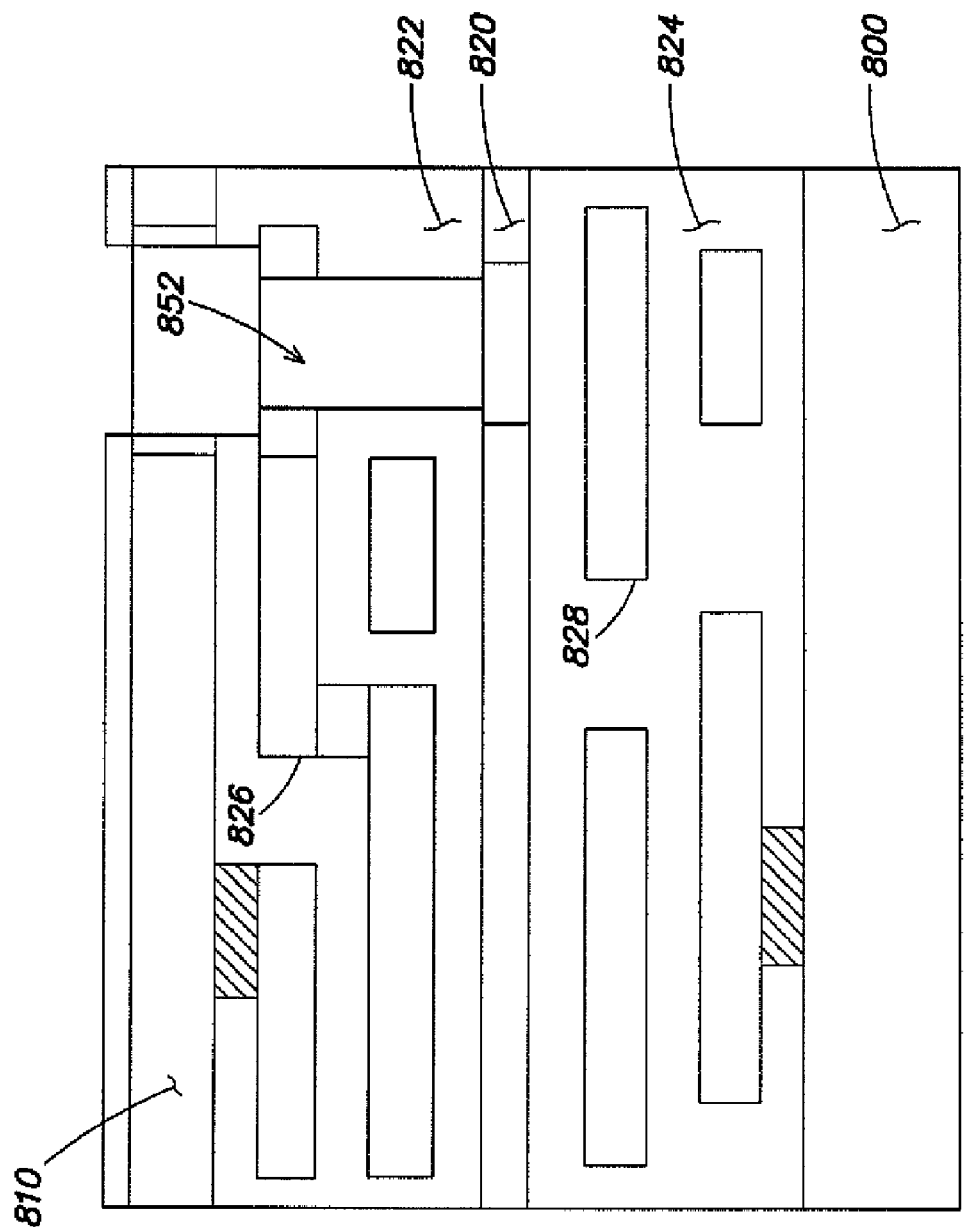
Figure 8G:
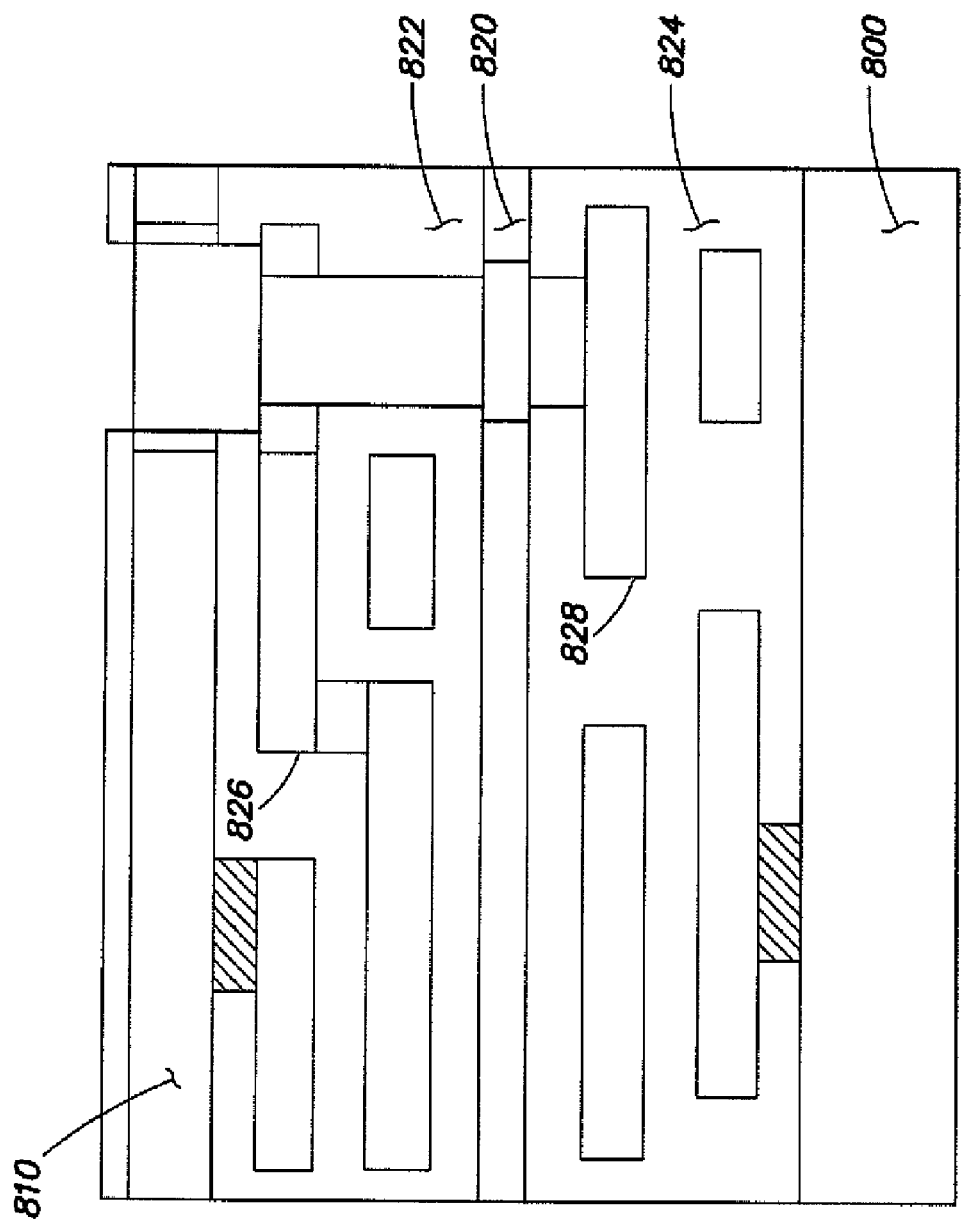

As shown in FIG. 8F, the formation of tunnel 852 continues by etching bonding layer 820 using, for example, DRIE, or ICP, with any suitable etchant. If the bonding layer 820 is a polymeric glue layer, then oxygen may serve as the etchant, possibly enhanced by Bosch reoxidation. Depending on the composition of bonding layer 820, and the type of etch used, a lateral etch may necessarily accompany the vertical etch during this step. However, the lateral etch is not required, and the invention is not limited in this respect. It is desired to minimize the amount of lateral etching.

FIG. 5G illustrates the continued formation of tunnel 852. The dielectric layer 824 is etched using DRIE, ICP, or any suitable directional etch, with an appropriate etchant. The etching may again proceed by the Bosch process. If dielectric layer 824 is $SiO_2$, then any of the fluoro-methyl etch candidates may be used, such as $CF_4$, $CF_3H$, or $CFH_3$. These may be used with or without argon. The etching proceeds to the metallization layer 828, which operates as a natural etch stop.

Figure 8H:
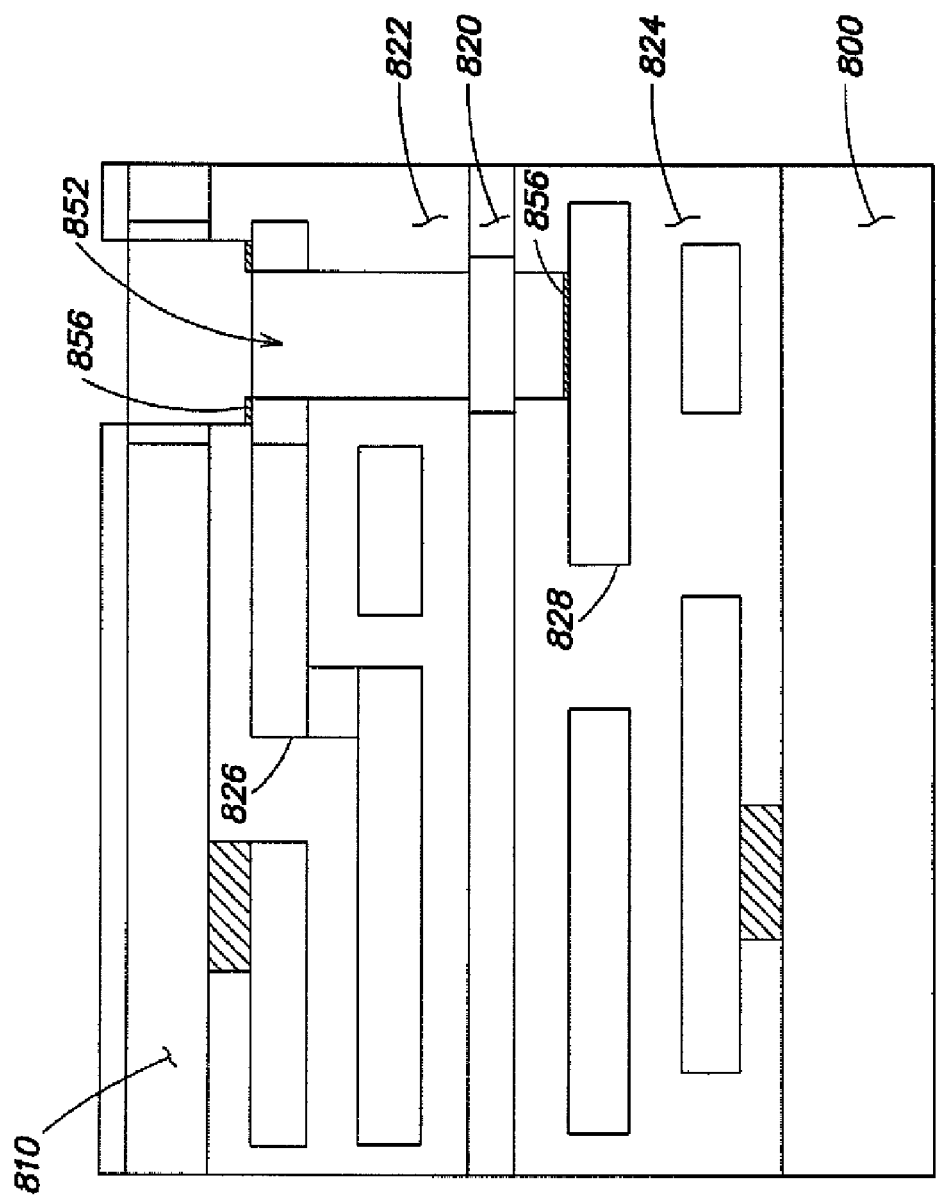
Figure 81:
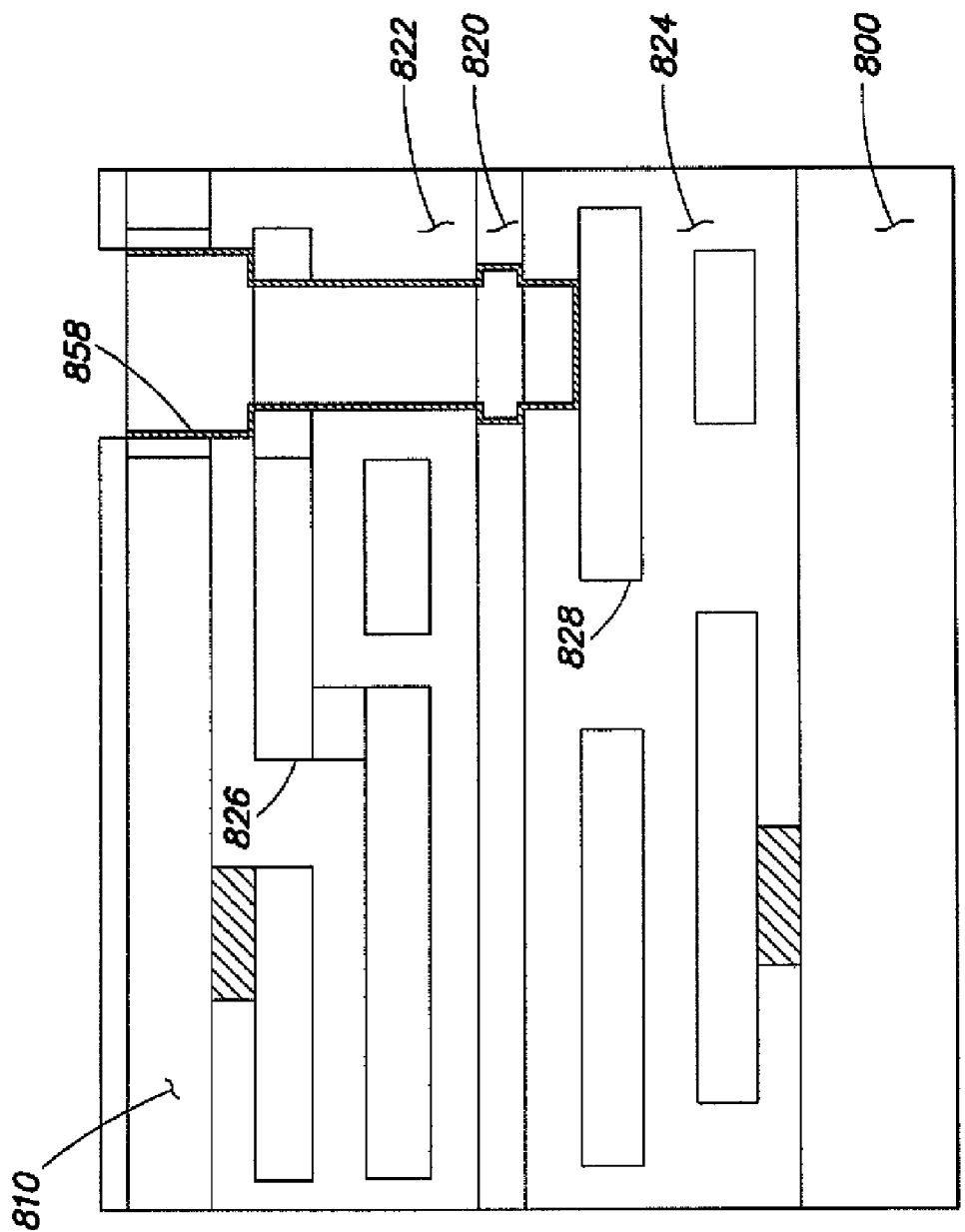

Depending on the materials etched thus far, and the etching methods used, there may be a layer 856 of etching by-product that forms on the bottom of the tunnel 852, as illustrated in FIG. 8H. Such a by-product layer often accompanies DRIE etch processes. The by-product layer 856 may increase via resistance, and degrade the quality of the contact between the deep pillar via (shown in later figures) and the metallization layer 828, thus degrading performance of the via as an intermetallic connection. The by-product layer 856 may be removed by way of non-reactive ion etching, for example, using argon. Wet etching, noble ionized plasma etching, accelerated ion etching, or any combination of these may be used in addition to, or in place of, non-reactive ion etching.

With the tunnel 852 completed, the process proceeds with the formation of the deep pillar nail head via. As shown in FIG. 8I, a barrier layer 858 is deposited on the walls and bottom of tunnel 852. The barrier layer 858 may be W, Ti, Ta, TiN, TaN or any other suitable material, and is used to prevent diffusion of the later-deposited pillar material into the surrounding dielectric layers 822 and 824, and the bonding layer 820. The barrier layer 858 may be deposited by a highly conformal CVD process, or by atomic layer deposition, and thus may be very thin.

Figure 8J:
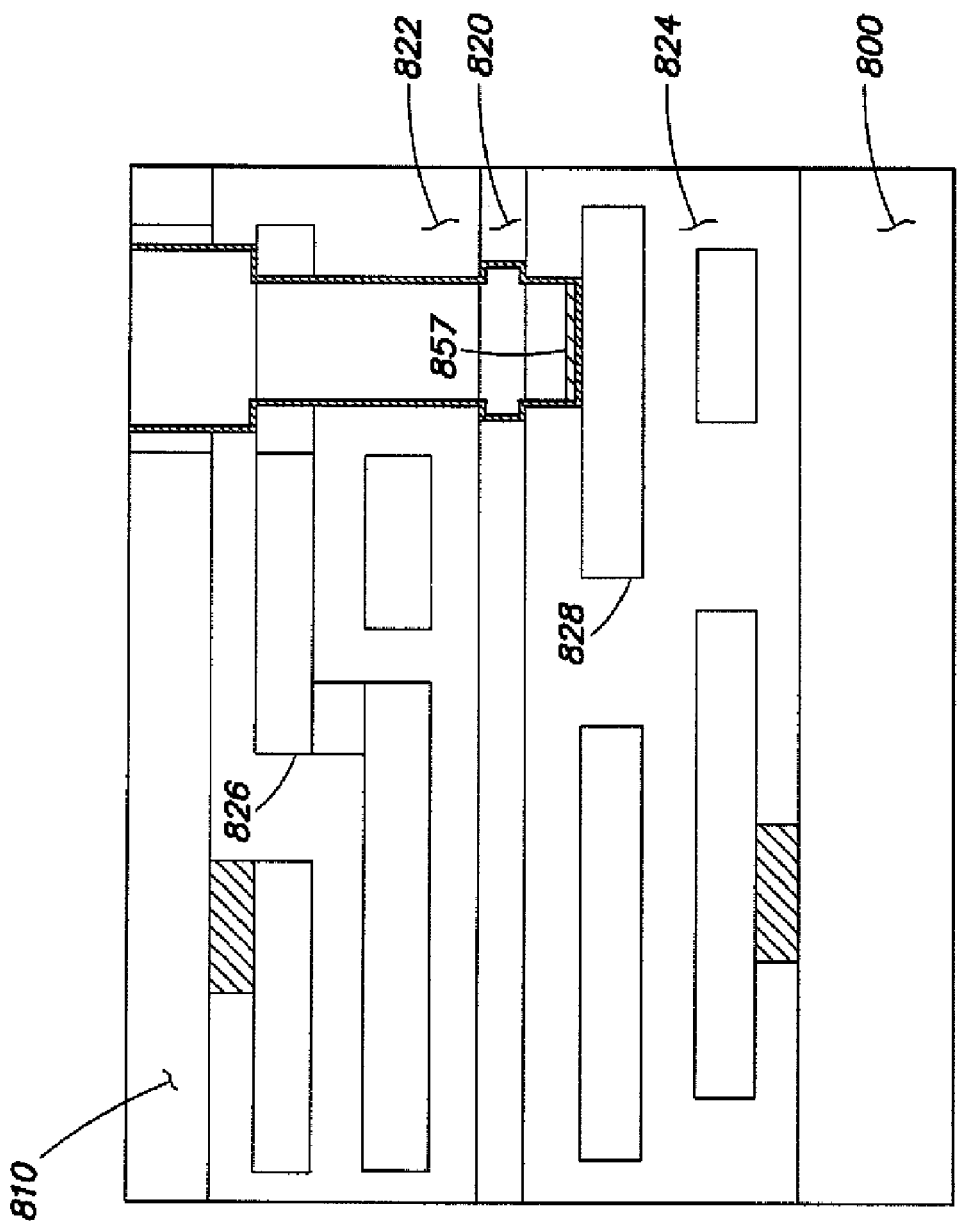
Figure 8K:
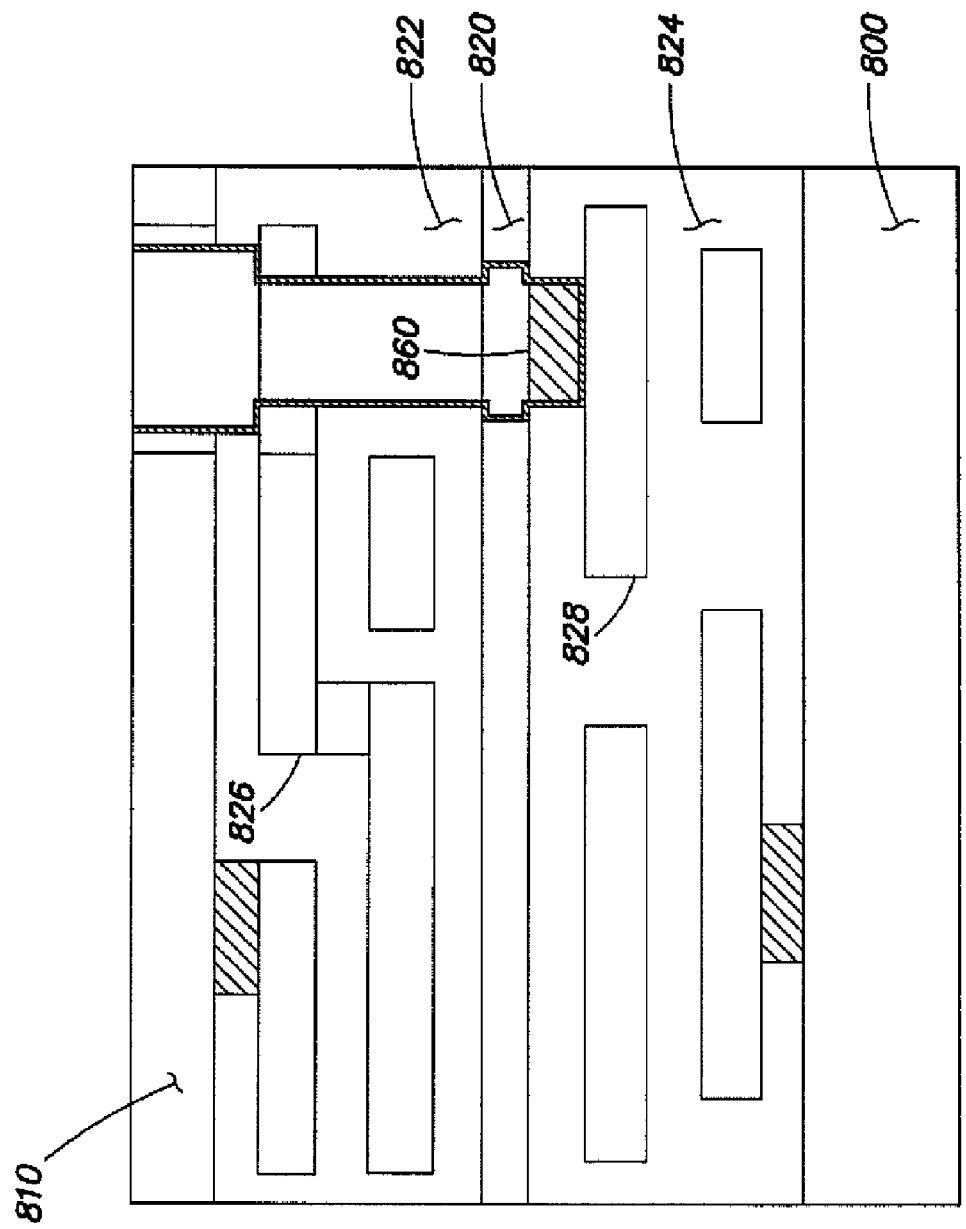

In preparation for filling the tunnel 852 with copper, the pillar material in this embodiment, a copper seed layer 857, shown in FIG. 8J, is deposited on the bottom of the tunnel 852 after the barrier layer 858 has been deposited. The seed layer may aggregate by gravity or capillary force, as the invention is not limited in this respect. It is desirable to deposit the seed layer 857 on the bottom of tunnel 852 to encourage the bottom-up filling of the tunnel with copper. The metal shield layer 848 may be removed from the back surface 812 of substrate 810.

The process proceeds in FIGS. 8K-8N with the plating of copper 860 from the bottom of tunnel 852, from the copper seed layer 857, upward. It is preferable to fill the tunnel with copper vertically, since lateral growth of copper within the tunnel may lead to the formation of voids, and thus increased via resistance and decreased performance. For this reason the seed layer is used. The copper may be plated by liquid processes or CVD, as the invention is not limited in this respect.

Figure 8L:
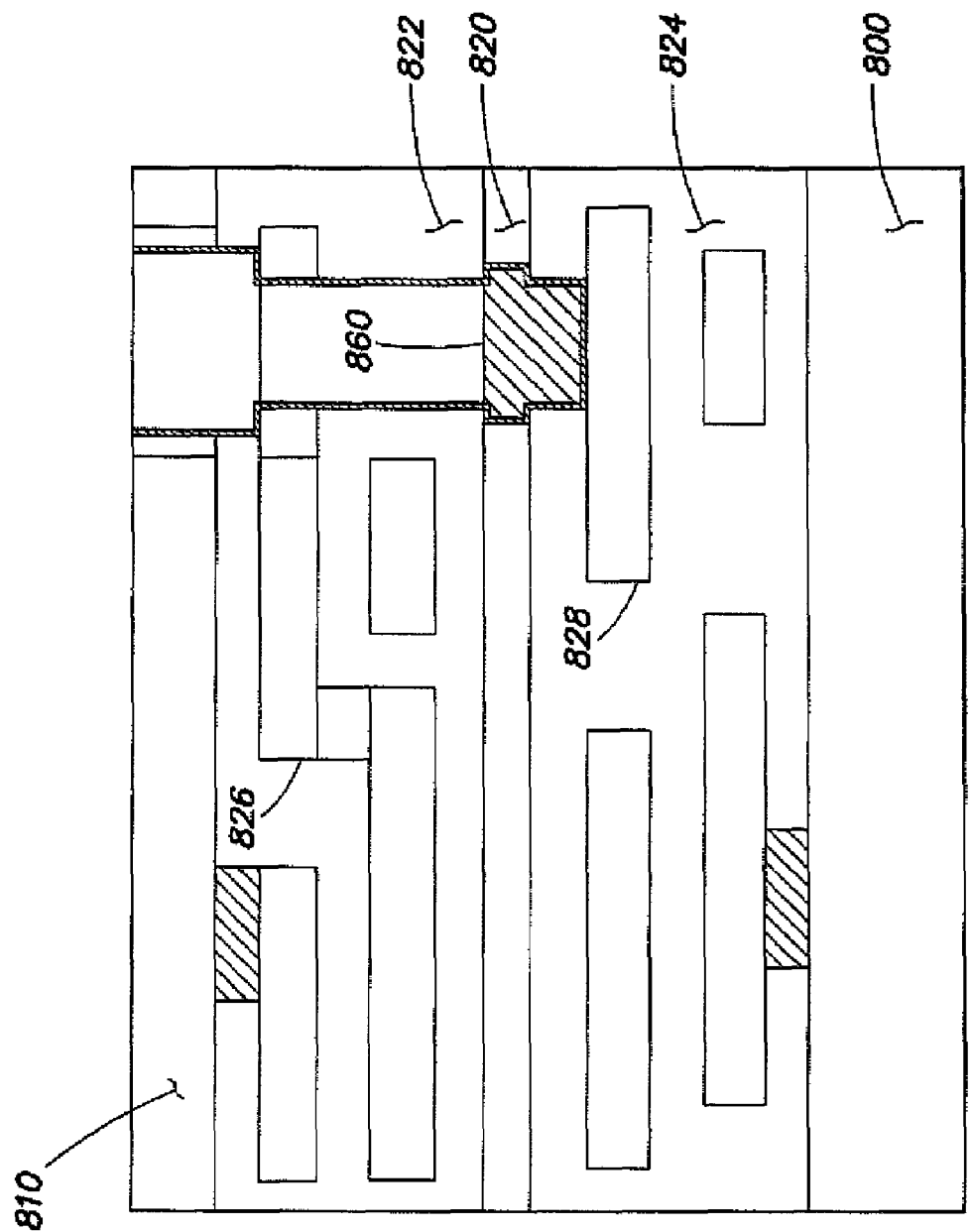

As shown in FIG. 8L, the plating of copper 860 proceeds to approximately the top of bonding layer 820.

Figure 8M:
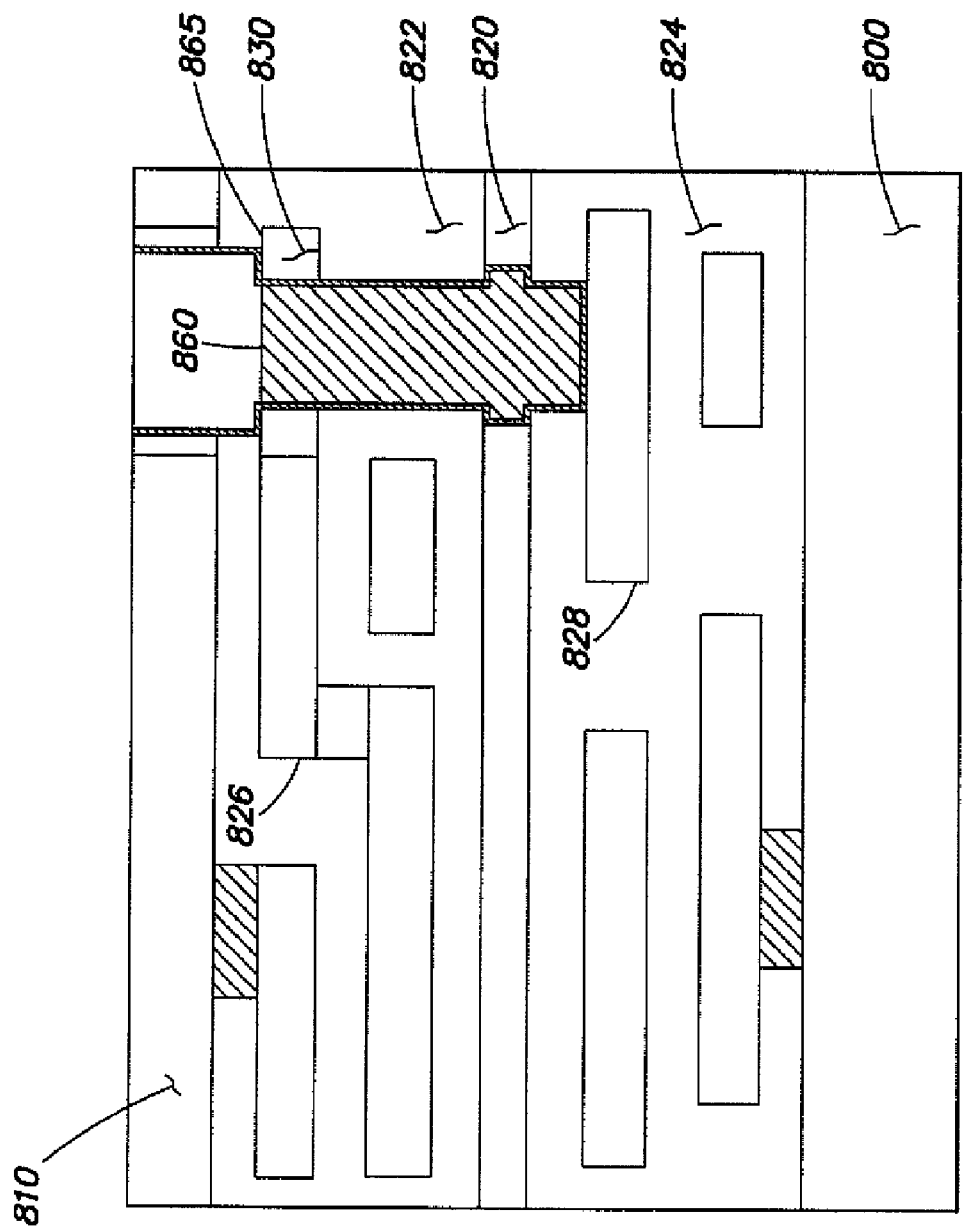

As shown in FIG. 8M, the copper 860 is approximately planar with the upper surface 865 of the collet 830. It may be desirable to clean the upper surface 865 of the collet 830 again to remove any processing by-products and facilitate the formation of a good contact between nail head and the collet.

Figure 8N:
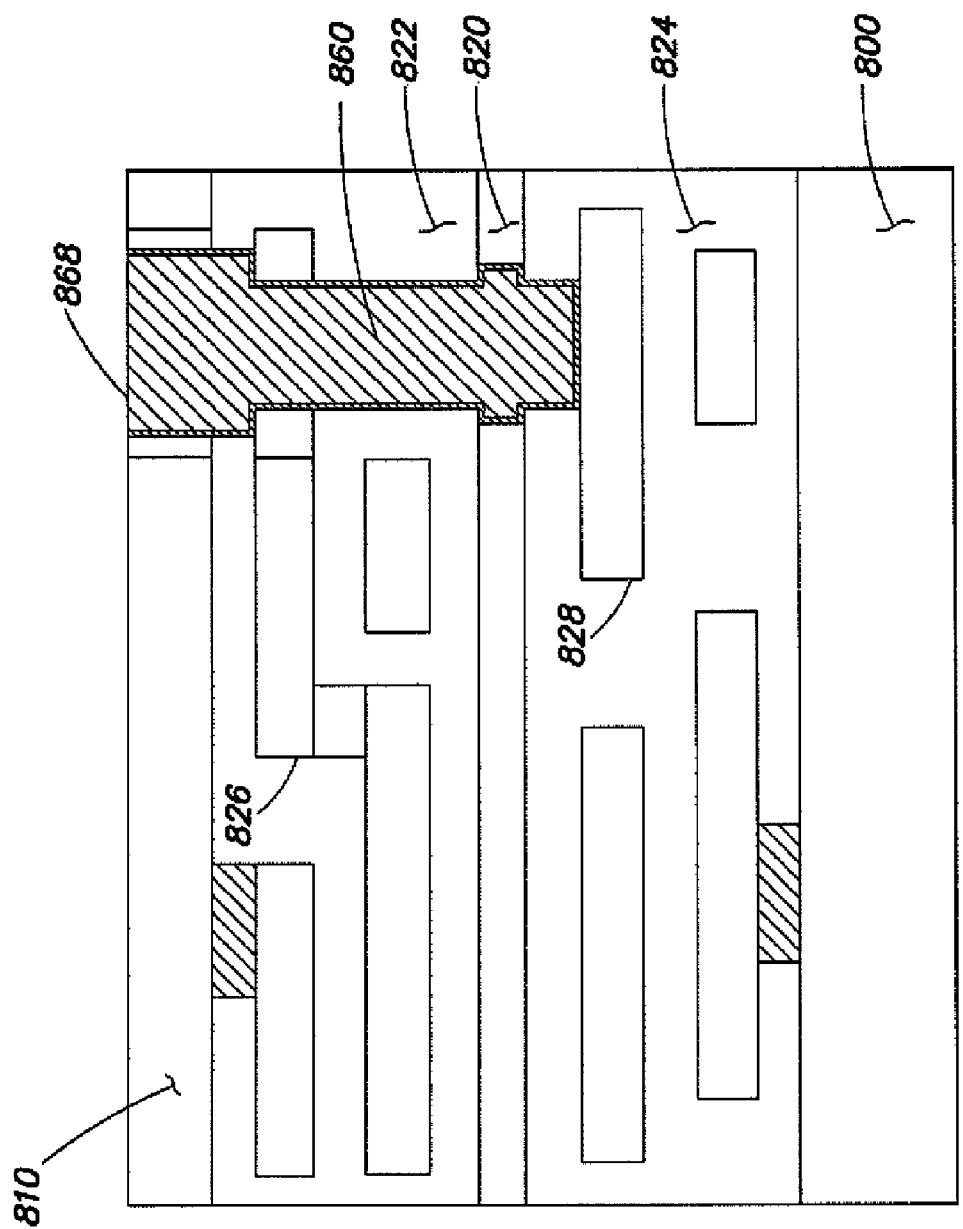

As shown in FIG. 8N, the deep pillar nail head via is completed by the formation of nail head 868. The top surface of nail head 868 is thus approximately level with back surface 812 of substrate 810, and is accessible for forming external contacts.

It should be appreciated that the illustrative processing sequences described thus far are non-limiting, and that additional or alternative processing sequences may readily occur to those of skill in the art. Depending on the exact order of steps, or the exact etchants used, certain steps may not be necessary. For example, depending on the etchants, metal shield layers and/or mask layers may not be needed. In addition, although the substrates have been described as being silicon, it is possible to use substrates of other materials. If the substrates are of a material other than silicon (such as SiC or GaAs), then the etch fluids and conditions, dielectric layers, glue layer, etc. would all need to be changed appropriately. Such changes or modifications to the above described materials and processes do not depart from the spirit of the invention and such adaptations are well within the abilities of those skilled in the art of semiconductor fabrication.

It should also be appreciated that the deep pillar nail head via may be formed in the absence of a collet, or with a collet that is part of the deep pillar nail head via. In other words, the deep pillar nail head via and the collet need not be distinct structures, and the invention is not limited in this respect.

Figure 9:
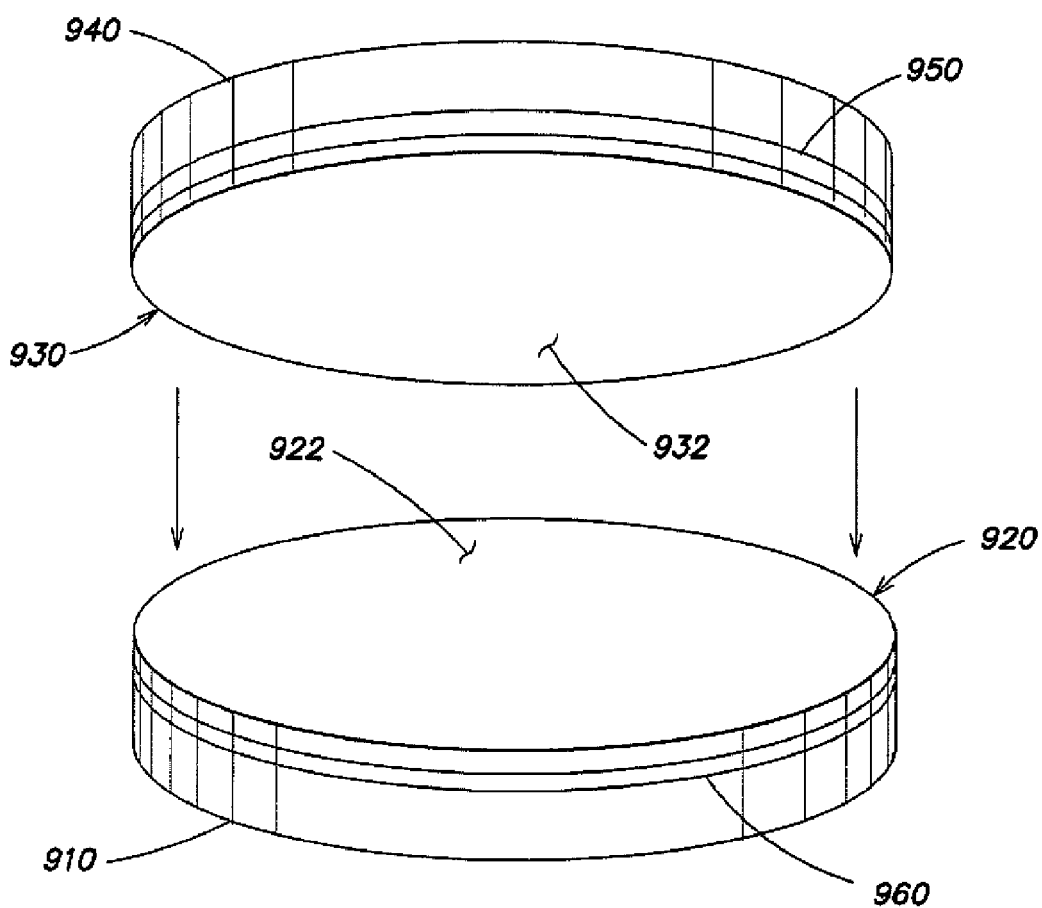
FIG. 9 is a diagrammatic illustration of an example of the alignment and bonding of two face-to-face 2 layer bonded chips producing a four layer 3D assembly using monolithic techniques.

In one embodiment, two face-to-face assemblies may be bonded together to form a four-chip stack, as illustrated in FIG. 9. In FIG. 9, two chips 910 and 920 are bonded in a face-to-face configuration with a bonding layer 960. The configuration may include a deep pillar nail head via, as described in any of the embodiments of this application. For example, the nail head may be exposed on the thinned backside surface 922 of a substrate of chip 920. A second face-to-face configuration, including chips 930 and 940, with bonding layer 950, may also be provided. This configuration may also include a deep pillar nail head via, with the nail head exposed on the thinned backside 932 of a substrate of chip 930. Thus, the two face-to-face configurations may be bonded together, such that the exposed nail heads contact each other. In this manner, the backside of each thinned substrate becomes a "face" for subsequent processing purposes.

Figure 10:
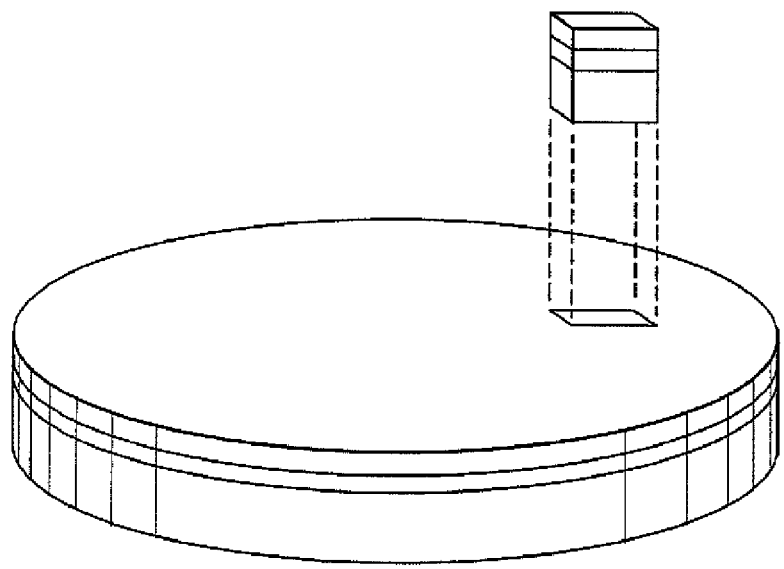
FIG. 10 is a diagrammatic illustration of an example of "dicing out" a 3D integrated circuit from a composite 3D chip stack obtained by the chip bonding technique taught herein.

The 3D circuits obtained by any of the described embodiments of the face-to-face chip bonding technique may either be retained on the composited 3D chip stack and horizontally interconnected by any of the standard fabrication means to create a wafer scale integrated (wsi) 3D circuit, or, individual chip circuits can be diced out to form individual dies that can be tested and packaged separately. FIG. 10 illustrates the possibility of "dicing out" a 3D integrated circuit from a composited 3D chip stack obtained by the chip bonding technique, for use in wsi systems that are fault tolerant or repairable. Note that much of the processing to produce this stacked die assembly will use semiconductor wafer processing steps, with the 3D assembly diced from multiple wafer substrates that are bonded and then handled as a single wafer.

The structures described thus far may find many applications, for example, in dynamic random access memories (DRAMs). Other applications will be readily apparent to those of skill in the art.

Figure 11:
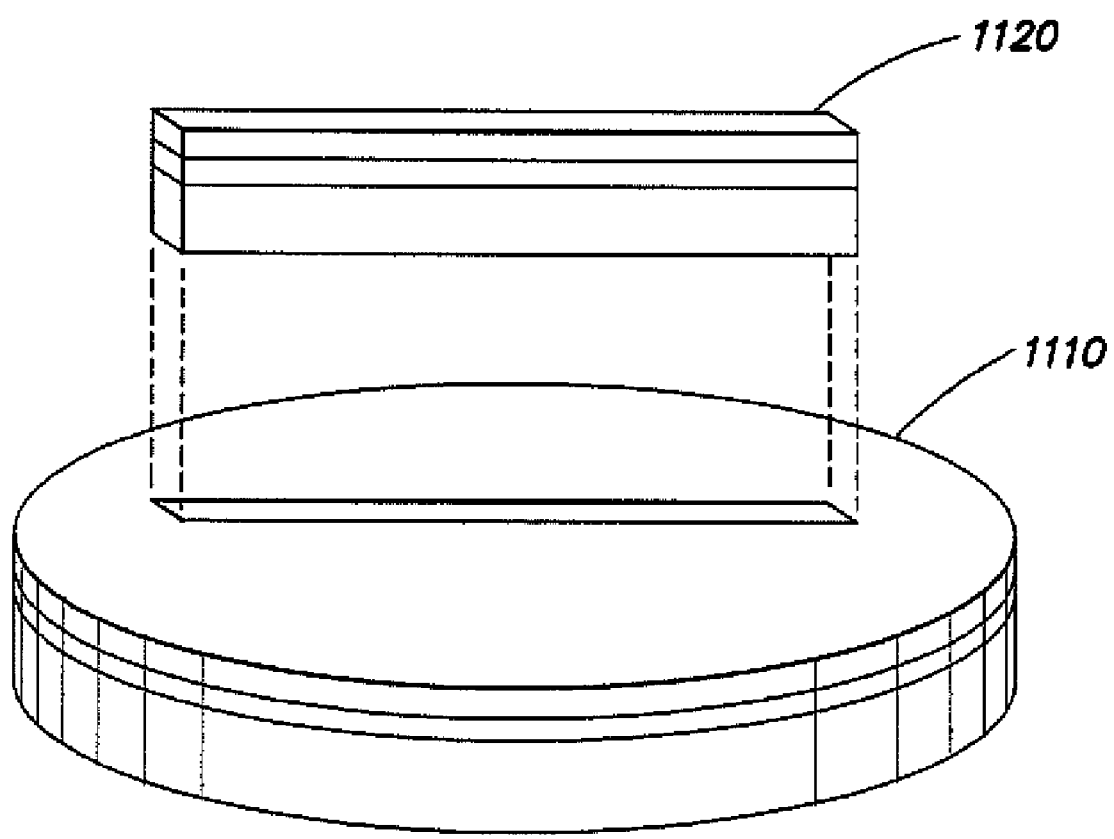
FIG. 11 is a diagrammatic illustration of a tile implementing face-to-face bonded chips as taught herein.

FIG. 11 is a diagrammatic illustration of a "tile" 1120 taken from a composite 3D chip stack 1110. The tile 1120 may comprise a plurality of deep pillar nail head integrated circuits, and may not provide perfect yield, but may be suitable in applications where perfect yield for the entire tile is not required. For example, such tiles might find use in phased array radars, where the array may comprise a large number of individual circuits, thereby negating the need for perfect yield of all the individual circuits. Although tile 1120 is shown as being removed from chip stack 1110, there is no limit to the size that tile 1120 can be, and in fact the entire chip stack 1110 may be used as the tile in some applications.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of forming a via, the method comprising:
   bonding a first chip comprising a first metal layer and a second chip comprising a second metal layer in a face-to-face configuration;
   after bonding the first chip and the second chip in the face-to-face configuration, thinning a substrate of the first chip; and
   after bonding the first chip and the second chip in the face-to-face configuration, forming the via at least partially within the first chip and contacting the second metal layer.

2. The method of claim 1, wherein thinning the substrate is performed prior to forming the via.

3. The method of claim 1, wherein the via is formed to electrically contact the first metal layer.

4. The method of claim 1, further comprising:
   forming a hole in the substrate of the first chip; and
   wherein forming the via comprises forming a pillar to pass through the hole in the substrate.

5. The method of claim 1, wherein the via comprises a pillar portion and a nail head portion.

6. The method of claim 5, wherein the nail head portion is formed such that it is accessible for use as an external contact.

7. The method of claim 1, wherein the first chip further comprises a collet having an opening, and wherein forming the via comprises forming a pillar so that at least a portion of the pillar passes through the opening of the collet.

8. The method of claim 7, wherein the via is formed to electrically contact the collet.

9. The method of claim 8, wherein the collet electrically contacts the first metal layer.

10. The method of claim 1, wherein bonding the first chip and the second chip in a face-to-face configuration comprises bonding the first chip and the second chip using a bonding layer.

11. The method of claim 10, wherein the via comprises a pillar portion and a nail head portion, and wherein the pillar portion passes through the bonding layer.

12. The method of claim 1, wherein thinning the substrate comprises thinning to a stopping layer.

13. The method of claim 12, wherein the stopping layer comprises a stud.

14. The method of claim 12, wherein the stopping layer comprises a buried oxide layer.

* * * * *